United States Patent
Naito

(10) Patent No.: US 11,069,529 B2
(45) Date of Patent: Jul. 20, 2021

(54) SEMICONDUCTOR DEVICE WITH AT LEAST ONE LOWER-SURFACE SIDE LIFETIME CONTROL REGION

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 16/455,799

(22) Filed: Jun. 28, 2019

(65) Prior Publication Data
US 2019/0326118 A1    Oct. 24, 2019

Related U.S. Application Data

(63) Continuation of application No. PCT/JP2018/026339, filed on Jul. 12, 2018.

(30) Foreign Application Priority Data

Jul. 14, 2017  (JP) .............................. JP2017-138603
Dec. 13, 2017  (JP) .............................. JP2017-238637

(51) Int. Cl.
  *H01L 21/22*   (2006.01)
  *H01L 27/06*   (2006.01)
  (Continued)

(52) U.S. Cl.
  CPC ........ *H01L 21/221* (2013.01); *H01L 27/0664* (2013.01); *H01L 29/0638* (2013.01);
  (Continued)

(58) Field of Classification Search
  CPC ............... H01L 21/221; H01L 29/8613; H01L 29/7397; H01L 29/1095; H01L 29/0834;
  (Continued)

(56) References Cited

U.S. PATENT DOCUMENTS 10,056,450 B2   8/2018  Kouno
10,062,753 B2   8/2018  Kouno
(Continued)

FOREIGN PATENT DOCUMENTS

JP    2010-147381   *  7/2010
JP    2011129619 A     6/2011
(Continued)

OTHER PUBLICATIONS

International Search Report for International Patent Application No. PCT/JP2018/026339, issued/mailed by the Japan Patent Office dated Aug. 21, 2018.
(Continued)

*Primary Examiner* — Ahmed N Sefer

(57) ABSTRACT

To provide a semiconductor device, wherein each of a transistor portion and a diode portion that are arrayed along an array direction has: a second-conductivity type base region provided above a first-conductivity type drift region inside a semiconductor substrate; a plurality of trench portions that penetrate the base region from an upper surface of the semiconductor substrate, extend at the upper surface of the semiconductor substrate and in a direction of extension perpendicular to the array direction, and have conductive portions provided therein; and a lower-surface side lifetime control region that lies on a lower-surface side in the semiconductor substrate, and from the transistor portion to the diode portion, and includes a lifetime killer. In the array direction, the transistor portion may have a portion provided with the lower-surface side lifetime control region, and another portion not provided with the lower-surface side lifetime control region.

28 Claims, 32 Drawing Sheets

(51) Int. Cl.
  *H01L 29/06* (2006.01)
  *H01L 29/08* (2006.01)
  *H01L 29/10* (2006.01)
  *H01L 29/739* (2006.01)
  *H01L 29/861* (2006.01)

(52) U.S. Cl.
  CPC ...... *H01L 29/0834* (2013.01); *H01L 29/1095* (2013.01); *H01L 29/7397* (2013.01); *H01L 29/8613* (2013.01)

(58) Field of Classification Search
  CPC ............. H01L 29/0638; H01L 27/0664; H01L 29/0603; H01L 29/32; H01L 29/739; H01L 29/407; H01L 27/0727; H01L 29/78; H01L 29/12
  See application file for complete search history.

(56) References Cited

U.S. PATENT DOCUMENTS

| | | | |
|---|---|---|---|
| 10,170,607 B2 | 1/2019 | Kouno | |
| 10,256,234 B2 | 4/2019 | Tanabe | |
| 2012/0043582 A1* | 2/2012 | Koyama | H01L 21/263 |
| | | | 257/140 |
| 2012/0132955 A1 | 5/2012 | Saito | |
| 2014/0070266 A1 | 3/2014 | Matsudai | |
| 2015/0228717 A1* | 8/2015 | Hara | H01L 29/0626 |
| | | | 257/140 |
| 2015/0364613 A1 | 12/2015 | Onozawa | |
| 2016/0111419 A1* | 4/2016 | Naito | H01L 27/0716 |
| | | | 257/140 |
| 2016/0254374 A1* | 9/2016 | Kameyama | H01L 29/1095 |
| | | | 257/140 |
| 2016/0329323 A1* | 11/2016 | Iwasaki | H01L 29/32 |
| 2016/0336435 A1* | 11/2016 | Naito | H01L 29/1095 |
| 2017/0069625 A1* | 3/2017 | Hirabayashi | H01L 29/1095 |
| 2017/0077216 A1* | 3/2017 | Kouno | H01L 29/32 |
| 2017/0084610 A1* | 3/2017 | Kouno | H01L 29/8613 |
| 2018/0138170 A1* | 5/2018 | Hosokawa | H01L 29/8613 |
| 2018/0151557 A1* | 5/2018 | Tanabe | H01L 29/78 |

FOREIGN PATENT DOCUMENTS

| | | | |
|---|---|---|---|
| JP | 2011216825 A | | 10/2011 |
| JP | 2012043891 A | | 3/2012 |
| JP | 2013-149909 | * | 8/2013 |
| JP | 2014056942 A | | 3/2014 |
| JP | 2015065464 A | | 4/2015 |
| JP | 2015153784 A | | 8/2015 |
| JP | 2015185742 A | | 10/2015 |
| JP | 2015211149 A | | 11/2015 |
| JP | 2017041601 | * | 2/2017 |
| JP | 2017041601 A | | 2/2017 |
| JP | 2017045949 A | | 3/2017 |
| JP | 2017059711 A | | 3/2017 |
| WO | 2014156849 A1 | | 10/2014 |
| WO | 2015145929 A1 | | 10/2015 |

OTHER PUBLICATIONS (ISA/237) Written Opinion of the International Search Authority for International Application No. PCT/JP2018/026339, issued/mailed by the International Bureau of WIPO dated Aug. 21, 2018.

* cited by examiner

SEMICONDUCTOR DEVICE WITH AT LEAST ONE LOWER-SURFACE SIDE LIFETIME CONTROL REGION

The contents of the following Japanese patent applications are incorporated herein by reference:
NO. 2017-138603 filed in JP on Jul. 14, 2017,
NO. 2017-238637 filed in JP on Dec. 13, 2017, and
NO. PCT/JP2018/026339 filed on Jul. 12, 2018.

BACKGROUND

1. Technical Field

The present invention relates to a semiconductor device.

2. Related Art

There are conventional, known semiconductor devices such as insulated gate bipolar transistors (IGBTs) (see Patent Literatures 1 and 2, for example).

[Patent Literature 1] Japanese Patent Application Publication No. 2017-41601

[Patent Literature 2] Japanese Patent Application Publication No. 2012-43891

Preferably, characteristics of semiconductor devices such as leakage current characteristics are improved.

General Disclosure

A first aspect of the present invention provides a semiconductor device including: a semiconductor substrate having a first-conductivity type drift region; a transistor portion provided in the semiconductor substrate; and a diode portion that is provided in the semiconductor substrate, and is arrayed next to the transistor portion along a predetermined array direction. Each of the transistor portion and the diode portion may have a second-conductivity type base region provided above the drift region inside the semiconductor substrate. Each of the transistor portion and the diode portion may have a plurality of trench portions that penetrate the base region from an upper surface of the semiconductor substrate, extend at the upper surface of the semiconductor substrate and in a direction of extension perpendicular to the array direction, and have conductive portions provided therein. Each of the transistor portion and the diode portion may have an at least one lower-surface side lifetime control region that lies on a lower-surface side in the semiconductor substrate, and from the transistor portion to the diode portion, and includes a lifetime killer. In the array direction, the transistor portion may have a portion provided with the lower-surface side lifetime control region, and another portion not provided with the lower-surface side lifetime control region.

In the array direction, the diode portion may have a portion provided with the lower-surface side lifetime control region, and another portion not provided with the lower-surface side lifetime control region. The diode portion may have a first-conductivity type cathode region exposed at the lower surface of the semiconductor substrate, and at least one electrically-floating second-conductivity type floating region provided on the lower-surface side in the semiconductor substrate. The floating region may be provided above the cathode region, and covers part of the cathode region.

The floating region may be provided on the lower-surface side in the semiconductor substrate relative to the lower-surface side lifetime control region. In a top view of the semiconductor substrate, at least part of the floating region may overlap the lower-surface side lifetime control region.

The at least one floating region may include a plurality of floating regions arrayed in the array direction. In a top view of the semiconductor substrate, at least one floating region in the plurality of floating regions may not overlap the lower-surface side lifetime control region in the array direction.

The lower-surface side lifetime control region may extend over an entire length of the diode portion in the array direction. In the array direction, a length of the lower-surface side lifetime control region in the transistor portion may be longer than a length of the lower-surface side lifetime control region in the diode portion.

The semiconductor device may further include an upper-surface side lifetime control region that lies from the transistor portion to the diode portion, and on an upper-surface side in the semiconductor substrate, and includes a lifetime killer. In the transistor portion, the lower-surface side lifetime control region may be provided on the side of the diode portion in the array direction relative to the upper-surface side lifetime control region.

The semiconductor device according may further have a collector region provided at the lower surface of the semiconductor substrate. The collector region may be provided on an extension line of an imaginary line that connects, in the array direction, an end portion of the upper-surface side lifetime control region in the transistor portion with an end portion of the lower-surface side lifetime control region in the transistor portion.

In the diode portion, the lower-surface side lifetime control region may be provided on the side of the transistor portion in the array direction relative to the upper-surface side lifetime control region. A lifetime killer concentration of the lower-surface side lifetime control region may be higher than a lifetime killer concentration of the upper-surface side lifetime control region.

In the array direction, the length of the upper-surface side lifetime control region in the transistor portion may be 1% to 15% inclusive of a length of the transistor portion. A distance in a direction parallel to the lower surface of the semiconductor substrate from an end portion of the upper-surface side lifetime control region in the transistor portion to an end portion of the lower-surface side lifetime control region in the transistor portion may be 25% to 50% inclusive of the length, in the array direction, of the upper-surface side lifetime control region in the transistor portion.

In the direction of extension, the lower-surface side lifetime control region may be provided to reach a region which is on an outer side relative to the upper-surface side lifetime control region. The length of the upper-surface side lifetime control region in the array direction may be larger than a thickness of the semiconductor substrate.

The at least one lower-surface side lifetime control region may include a plurality of lower-surface side lifetime control regions arranged next to each other in a depth direction of the semiconductor substrate. In the transistor portion, distances from the diode portion to the lower-surface side lifetime control regions in the array direction may decrease as distances from the upper surface of the semiconductor substrate to the lower-surface side lifetime control regions increase. In the transistor portion, the lower-surface side lifetime control regions may be arranged such that a line linking an end portion of an uppermost lower-surface side lifetime control region, end portions of lower-surface side lifetime control regions between the uppermost lower-surface side lifetime control region and a lowermost lower-surface side lifetime control region, and an end portion of the lowermost lower-surface side lifetime control region is convex.

In the diode portion, distances, in the array direction, from the diode portion to the lower-surface side lifetime control regions provided on the lower-surface side of the semiconductor substrate may be shorter than a distance, in the array direction, from the diode portion to the upper-surface side lifetime control region provided on the upper-surface side of the semiconductor substrate. Lifetime killer concentrations of the lower-surface side lifetime control regions may increase as distances from the upper surface of the semiconductor substrate to the lower-surface side lifetime control regions increase. In the array direction, a length of the lower-surface side lifetime control region in the diode portion may be 1.5% to 3% inclusive of a length of the diode portion.

The semiconductor device may further include a first-conductivity type buffer region that lies below the drift region, and from the transistor portion to the diode portion. The lower-surface side lifetime control region may be provided in the buffer region.

The semiconductor device may further include a first-conductivity type buffer region that lies below the drift region, and from the transistor portion to the diode portion. A thickness of the buffer region may be larger at a portion below the lower-surface side lifetime control region than at portions not below the lower-surface side lifetime control region.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, one side of a direction parallel to the depth direction of a semiconductor substrate is referred to as the "upper" side, and the other side is referred to as the "lower" side. One of two principal surfaces of a substrate, a layer or another member is referred to as an upper surface, and the other surface is referred to as a lower surface. The directions related to the "upper" side and "lower" side are not limited by the direction of gravity or a direction of attachment to a substrate or the like at the time of implementation of a semiconductor device.

In the present specification, technical matters are explained using orthogonal coordinate axes, which are the X axis, Y axis and Z axis, in some cases. In the present specification, a plane parallel to the upper surface of a semiconductor substrate is referred to as an X-Y plane, and the Z axis lies along the depth direction of the semiconductor substrate. In the present specification, the phrases like "in a top view" and "in the top view of" are used when elements are seen in a direction perpendicular to the upper surface of a semiconductor substrate, and figures representing how the elements appear when they are seen in such a manner are referred to as top views.

In each embodiment illustrated, a first conductivity type is the N type and a second conductivity type is the P type, but the first conductivity type may be the P type and the second conductivity type may be the N type. In this case, the conductivity type of a substrate, a layer, a region or the like in each embodiment becomes the opposite polarity.

In the present specification, doping concentrations mean the concentrations of impurities that have turned into donors or acceptors. In the present specification, in some cases, a doping concentration means the difference between donor and acceptor concentrations. In addition, if the doping concentration distribution of a doped region has a peak, the value of the peak may be used as the doping concentration of the doped region. If the doping concentration of a doped region is approximately uniform or in other cases, the average doping concentration of the doped region may be used as the doping concentration.

Figure 1:
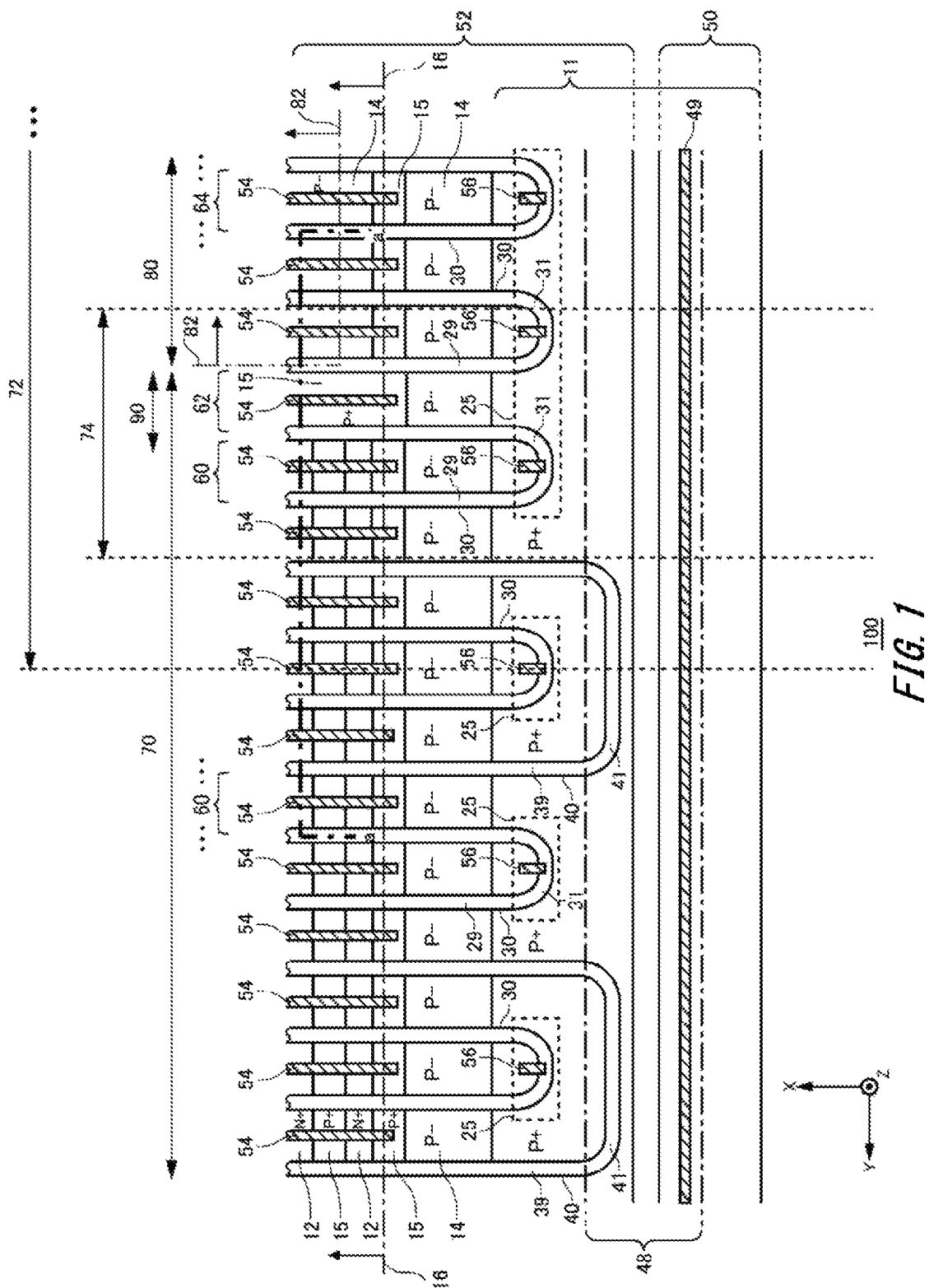
FIG. 1 is a figure illustrating part of the upper surface of a semiconductor device 100 according to an embodiment of the present invention.

FIG. 1 is a figure illustrating part of an exemplary upper surface of a semiconductor device 100 according to an embodiment of the present invention. The semiconductor device 100 of the present example is a semiconductor chip including transistor portions 70, and diode portions 80. Each transistor portion 70 includes a transistor such as an IGBT. Each diode portion 80 includes a diode such as a FWD (Free Wheeling Diode) provided next to transistor portions 70 on the upper surface of the semiconductor substrate. A region that is part of a transistor portion 70, and is positioned at the boundary between the transistor portion 70 and a diode portion 80 is a boundary portion 90. FIG. 1 illustrates a chip upper surface around a chip end portion, and other regions are omitted from FIG. 1.

In addition, although an active region of the semiconductor substrate in the semiconductor device 100 is illustrated in FIG. 1, the semiconductor device 100 may have an edge termination structure portion surrounding the active region. The active region means a region where current flows when the semiconductor device 100 is controlled to be turned on. The edge termination structure portion relaxes electric field concentration on the upper-surface side in the semiconductor substrate. The edge termination structure portion has a structure of a guard ring, a field plate, a RESURF, or a combination of them, for example.

The semiconductor device 100 of the present example includes gate trench portions 40, dummy trench portions 30, a well region 11, emitter regions 12, base regions 14, and contact regions 15 that are provided inside the semiconductor substrate, and exposed at the upper surface of the semiconductor substrate. In addition, the semiconductor device 100 of the present example includes an emitter electrode 52 and a gate metal layer 50 provided above the upper surface of the semiconductor substrate. The emitter electrode 52 and gate metal layer 50 are separated from each other.

Although an interlayer dielectric film is provided between (i) the emitter electrode 52 and gate metal layer 50, and (ii) the upper surface of the semiconductor substrate, it is omitted from FIG. 1. The interlayer dielectric film of the present example has contact holes 56, a contact hole 49, and contact holes 54 that are provided to penetrate the interlayer dielectric film.

In addition, the emitter electrode 52 passes the contact holes 56, and are connected with dummy conductive portions in the dummy trench portions 30. Connecting portions 25 formed of a conductive material such as polysilicon doped with impurities may be provided between the emitter electrode 52 and the dummy conductive portions. An insulating film such as an oxide film is provided between the connecting portions 25 and the upper surface of the semiconductor substrate.

The gate metal layer 50 passes the contact hole 49, and contacts a gate runner 48. The gate runner 48 is formed of polysilicon doped with impurities or the like. The gate runner 48 is connected with gate conductive portions in the gate trench portions 40 at the upper surface of the semiconductor substrate. The gate runner 48 is not connected with the dummy conductive portions in the dummy trench portions 30. The gate runner 48 of the present example lies from below the contact hole 49 to end portions of the gate trench portions 40. An insulating film such as an oxide film is provided between the gate runner 48 and the upper surface of the semiconductor substrate. The gate conductive portions are exposed at the upper surface of the semiconductor substrate at the end portions of the gate trench portions 40. The gate trench portions 40 contact the gate runner 48 at the exposed portions of the gate conductive portions.

The emitter electrode 52 and gate metal layer 50 are formed of materials including metals. For example, at least a partial region of each electrode is formed of aluminum or an aluminum-silicon alloy. Each electrode may have a barrier metal formed of titanium, a titanium compound or the like in a layer underlying the region formed of aluminum or the like. In addition, each electrode may have plugs formed of tungsten or the like in contact holes.

One or more gate trench portions 40 and one or more dummy trench portions 30 are arrayed at predetermined intervals along a predetermined array direction (the Y-axis direction in the present example). Each gate trench portions 40 of the present example may have: two extending portions 39 extending along the direction of extension (the X-axis direction in the present example) that is parallel to the upper surface of the semiconductor substrate, and is perpendicular to the array direction; and a connecting portion 41 connecting the two extending portions 39. At least part of the connecting portion 41 is preferably curved. By connecting end portions of the two extending portions 39 of the gate trench portion 40, electric field concentration at the end portions of the extending portions 39 can be relaxed. The gate runner 48 may be connected with a gate conductive portion at the connecting portion 41 of the gate trench portion 40.

The dummy trench portions 30 of the present example may be U-shaped at the upper surface of the semiconductor substrate, similar to the gate trench portions 40. That is, each dummy trench portion 30 of the present example may have two extending portions 29 extending along the direction of extension, and a connecting portion 31 connecting the two extending portions 29.

The emitter electrode 52 is provided above the gate trench portions 40, dummy trench portions 30, well region 11, emitter regions 12, base regions 14, and contact regions 15. The well region 11 is of the second conductivity type. The well region 11 is provided in a predetermined range starting from an end portion of the active region on the side where the gate metal layer 50 is provided. The diffusion depth of the well region 11 may be greater than the depths of the gate trench portions 40 and dummy trench portions 30. Partial regions of the gate trench portions 40 and dummy trench portions 30 on the gate metal layer 50 side are provided in the well region 11. Bottoms at ends, in the direction of extension, of the gate trench portions 40 and dummy trench portions 30 may be covered by the well region 11.

The transistor portion 70 includes the contact holes 54 provided above the contact regions 15 and emitter regions 12. The diode portion 80 includes the contact holes 54 provided above the base regions 14. No contact holes 54 are arranged above well regions 11 and base regions 14 arranged at both ends in the X-axis direction.

In the direction parallel to the upper surface of the semiconductor substrate, a mesa portion is provided in contact with each trench portion in the Y-axis direction. A mesa portion may be a portion of the semiconductor substrate that is sandwiched by two adjacent trench portions, and lies from the upper surface of the semiconductor substrate to the depth of the deepest bottom portion of each trench portion. An extending portion of each trench portion may be treated as one trench portion. That is, a region sandwiched by two extending portions may be treated as a mesa portion.

The transistor portion 70 excluding the boundary portion 90 includes a transistor mesa portion 60 provided in contact with each trench portion. The boundary portion 90 includes a boundary mesa portion 62 provided in contact with each trench portion. In addition, the diode portion 80 includes a diode mesa portion 64 provided in a region sandwiched by adjacent dummy trench portions 30. Both end portions, in the X-axis direction, of the transistor mesa portions 60, boundary mesa portion 62, and diode mesa portion 64 include base regions 14, for example. Note that, in FIG. 1, only base regions 14 provided at end portions on one side in the X-axis direction are illustrated.

The upper surface of a transistor mesa portion 60 includes emitter regions 12 provided in contact with gate trench portions 40. Emitter regions 12 of the present example are of the first conductivity type. In addition, the upper surface of a transistor mesa portion 60 includes second-conductivity type contact regions 15 provided to have a doping concentration higher than that of base regions 14. A transistor mesa portion 60 may include emitter regions 12 and contact regions 15 that are provided alternately in the direction of extension of gate trench portions 40. A transistor mesa portion 60 includes emitter regions 12 and contact regions 15 that are provided also below a contact hole 54.

The upper surface of a transistor mesa portion 60 may include emitter regions 12 that are provided in contact with a dummy trench portion 30 or apart from a dummy trench portion 30. Emitter regions 12 in the example illustrated in FIG. 1 are provided in contact with dummy trench portions 30.

The upper surface of the boundary mesa portion 62 includes a second-conductivity type contact region 15 provided to have a doping concentration higher than that of base regions 14. The contact region 15 may extend over an entire region sandwiched by base regions 14 provided at both end portions, in the X-axis direction, of the boundary mesa portion 62. The boundary mesa portion 62 includes the contact region 15 provided also below a contact hole 54.

The upper surface of the diode mesa portion 64 includes contact regions 15 provided at both end portions in the X-axis direction. In addition, a base region 14 is provided in a region sandwiched by the contact regions 15. The base region 14 may extend over an entire region sandwiched by the contact regions 15. The diode mesa portion 64 includes the base region 14 and contact regions 15 that are provided also below a contact hole 54.

The semiconductor device 100 of the present example has a dummy trench portion 30 provided in the diode portion 80.

In the present example, linear extending portions 29 of each dummy trench portion 30 are connected by a connecting portion 31. A diode mesa portion 64 is provided in a region sandwiched by dummy trench portions 30.

The diode mesa portion 64 may include or may not include an emitter region 12. In the present example, an emitter region 12 is not provided. The diode mesa portion 64 includes the contact region 15 or base region 14 provided to lie from one of the dummy trench portions 30 sandwiching the diode mesa portion 64 to the other dummy trench portion 30. That is, at the upper surface of the semiconductor substrate, the width of the diode mesa portion 64 in the Y-axis direction is equal to the width in the Y-axis direction of the contact region 15 or base region 14 provided in the diode mesa portion 64.

The diode portion 80 has a first-conductivity type cathode region 82 on the lower-surface side in the semiconductor substrate. In FIG. 1, the region where the cathode region 82 is provided in the top view of the semiconductor substrate is indicated with alternate long and short dash lines. The diode portion 80 may be a region of the upper surface of the semiconductor substrate, below which region the cathode region 82 lies. A region of the upper surface of the semiconductor substrate below which the cathode region 82 lies may be apart from contact regions 15 in the +X-axis direction. A region exposed at the lower surface of the semiconductor substrate and not provided with the cathode region 82 may include a second-conductivity type collector region. The transistor portion 70 may be a region provided with trench portions or mesa portions in a region of the upper surface of the semiconductor substrate below which the collector region lies.

The semiconductor device 100 of the present example includes an upper-surface side lifetime control region 72 including a lifetime killer, the upper-surface side lifetime control region 72 being provided locally in the depth direction of the semiconductor substrate. In FIG. 1, a region provided with the upper-surface side lifetime control region 72 in the top view of the semiconductor substrate is illustrated as a portion indicated by broken lines. The upper-surface side lifetime control region 72 reaches regions not illustrated in FIG. 1, including a region on the Y-axis negative side, and regions on the X-axis positive side and negative side in FIG. 1. Note that, in the present specification, the direction perpendicular to the semiconductor substrate in the top view of the semiconductor substrate is referred to as the depth direction (Z-axis direction).

The semiconductor device 100 of the present example includes a lower-surface side lifetime control region 74 including a lifetime killer, the lower-surface side lifetime control region 74 being provided below the upper-surface side lifetime control region 72, and locally in the depth direction of the semiconductor substrate. In FIG. 1, a region provided with the lower-surface side lifetime control region 74 in the top view of the semiconductor substrate is illustrated as a portion indicated by broken lines. The lower-surface side lifetime control region 74 reaches regions not illustrated in FIG. 1, including regions on the X-axis positive side and negative side in FIG. 1. In the top view, the range in the Y-axis direction over which the upper-surface side lifetime control region 72 is provided may be larger than the region over which the lower-surface side lifetime control region 74 is provided.

Note that, in the top view, trench portions in the region where the upper-surface side lifetime control region 72 is provided may all be dummy trench portions 30. The upper surface is irradiated with particle beams to form the upper-surface side lifetime control region 72 in some cases. If gate insulating films of gate trench portions 40 are irradiated with particle beams, the gate insulating films are damaged in some cases. If trench portions in the upper-surface side lifetime control region 72 are dummy trench portions 30, occurrence of damages to the gate insulating films can be suppressed. Thus, variation of the gate threshold or breakdown of gate insulating films can be prevented in a transistor.

Figure 2:
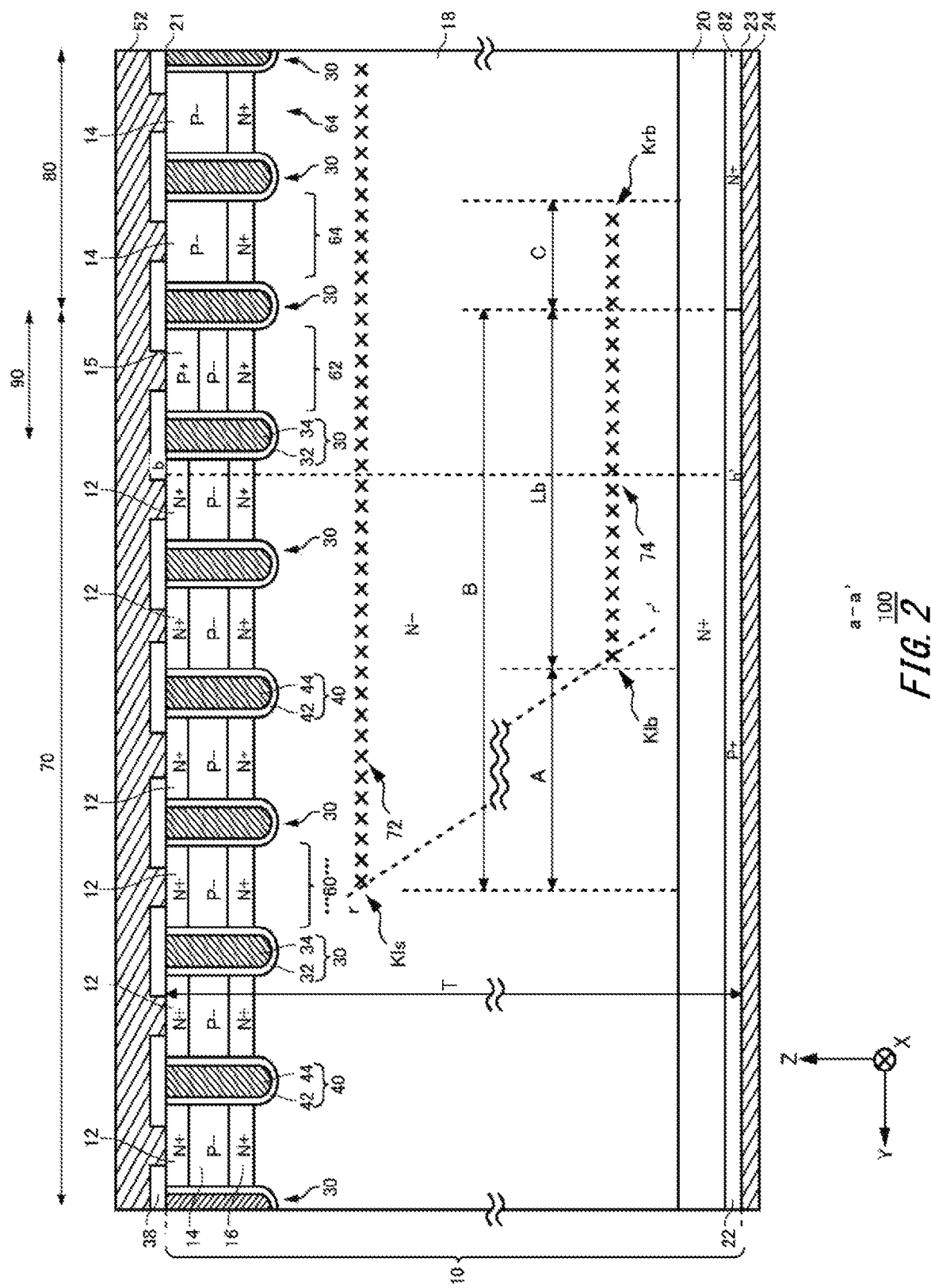
FIG. 2 is a figure illustrating an exemplary cross-section taken along a-a' in FIG. 1.

FIG. 2 is a figure illustrating an exemplary cross-section taken along a-a' in FIG. 1. The a-a' cross-section is a Y-Z plane passing through emitter regions 12, contact regions 15, and base regions 14 in the transistor portion 70 and diode portion 80. In the a-a' cross-section, the semiconductor device 100 of the present example has a semiconductor substrate 10, interlayer dielectric films 38, the emitter electrode 52, and a collector electrode 24. The emitter electrode 52 is provided at the upper surface 21 of the semiconductor substrate 10, and the upper surfaces of the interlayer dielectric film 38.

The collector electrode 24 is provided at a lower surface 23 of the semiconductor substrate 10. The emitter electrode 52 and collector electrode 24 are formed of conductive materials such as metals.

The semiconductor substrate 10 may be a silicon substrate, a silicon carbide substrate, a nitride semiconductor substrate such as a gallium nitride semiconductor substrate, or the like. The semiconductor substrate 10 of the present example is a silicon substrate.

The semiconductor substrate 10 of the present example includes a first-conductivity type drift region 18. The drift region 18 of the present example is of N− type. The drift region 18 may be a region in the semiconductor substrate 10 where other doped regions are not formed, which portion is left free of them. That is, the doping concentration of the drift region 18 may be equal to the doping concentration of the semiconductor substrate 10.

In addition, a first-conductivity type buffer region 20 may be provided below the drift region 18. The doping concentration of the buffer region 20 is higher than the doping concentration of the drift region 18. The buffer region 20 may function as a field stop layer that prevents a depletion layer spreading from the lower-surface side in the base region 14 from reaching a second-conductivity type collector region 22 and the cathode region 82.

The diode portion 80 has the cathode region 82 below the buffer region 20. The cathode region 82 may be provided at the same depth as the collector region 22 of the transistor portion 70. The diode portion 80 may function as a free wheeling diode (FWD) that causes a free wheeling current to flow in the opposite direction if a transistor portion 70 of another semiconductor device 100 is turned off in a power converting circuit such as an inverter.

The transistor portion 70 includes the second-conductivity type collector region 22 provided below the buffer region 20. The collector region 22 may extend to a region on the lower surface 23 side of the boundary mesa portion 62. Since the collector region 22 extends to the lower surface 23 side of the boundary mesa portion 62 in the semiconductor device 100 of the present example, it is possible to make sure that there are sufficient distances between emitter regions 12 of the transistor portion 70 and the cathode region 82 of the diode portion 80. Thus, the semiconductor device 100 of the present example can prevent electrons injected from the gate structure portion including the emitter regions 12 of the transistor portion 70 into the drift region 18 from flowing out to the cathode region 82 of the diode portion 80.

Compared to the case where the cathode region 82 is provided to reach immediately below the boundary mesa portion 62, the distance between the contact region 15 of the boundary mesa portion 62 and the cathode region 82 of the diode portion 80 can also be made long in the present example. Thus, the semiconductor device 100 of the present example can suppress hole injection from the contact region 15 with a doping concentration higher than that of base regions 14 into the cathode region 82 when the diode portion 80 becomes conductive.

Transistor mesa portions 60 and the boundary mesa portion 62 may include first-conductivity type accumulation regions 16 that are provided above the drift region 18. The accumulation regions 16 are regions where the same dopant as that in the drift region 18 is accumulated at a concentration higher than the concentration in the drift region 18. The doping concentration of the accumulation regions 16 is higher than the doping concentration of the drift region 18. The accumulation regions 16 are provided in contact with gate trench portions 40. By providing the accumulation regions 16, the carrier injection enhancement effect (IE effect) can be increased, and the ON-voltage can be lowered.

In the present example, second-conductivity type base regions 14 are provided above the accumulation regions 16 in the transistor mesa portions 60 and boundary mesa portion 62. The base regions 14 are provided in contact with the gate trench portions 40. Furthermore, in the present example, emitter regions 12 are provided between the base regions 14 in the transistor mesa portions 60 and the upper surface 21. The emitter regions 12 are provided in contact with the gate trench portions 40. The doping concentration of the emitter regions 12 is higher than the doping concentration of the drift region 18. An exemplary dopant in the emitter regions 12 is arsenic (As).

In the present example, the second-conductivity type contact region 15 is provided above the accumulation region 16 in the boundary mesa portion 62. The contact region 15 is provided in contact with dummy trench portions 30. The boundary mesa portion 62 may not include an emitter region 12.

In the present example, accumulation regions 16 are provided above the drift region 18 in the diode mesa portions 64. In addition, in the present example, base regions 14 are provided above the accumulation regions 16 in the diode mesa portions 64. The diode mesa portions 64 may not include an emitter region 12.

The upper surface 21 includes one or more gate trench portions 40, and one or more dummy trench portions 30. Each trench portion lies from the upper surface 21 to the drift region 18. In a region including at least any one of an emitter region 12, a contact region 15, and an accumulation region 16, each trench portion penetrates the region(s), and reaches the drift region 18. A trench portion penetrating a doped region is not limited to one that is formed after the doped region is formed. A trench portion penetrating a doped region may be one that sandwiches, with another trench portion, the doped region which is formed after formation of the trench portions.

Each gate trench portion 40 has a gate trench provided at the upper surface 21, and a gate insulating film 42 and a gate conductive portion 44. The gate insulating film 42 covers the inner wall of the gate trench. The gate insulating film 42 may be formed by oxidizing or nitriding a semiconductor at the inner wall of the gate trench. The gate conductive portion 44 is provided on the inner side relative to the gate insulating film 42 inside the gate trench. The gate insulating film 42 insulates the gate conductive portion 44 from the semiconductor substrate 10. The gate conductive portion 44 is formed of a conductive material such as polysilicon. The gate trench portion 40 is covered by an interlayer dielectric film 38 at the upper surface 21.

The gate conductive portion 44 includes regions facing base regions 14 that are adjacent to the gate conductive portion 44 on the sides of transistor mesa portions 60 with the gate insulating film 42 being sandwiched therebetween. If a predetermined voltage is applied to the gate conductive portion 44, channels are formed as electron inversion layers at the surface layers of interfaces of the base regions 14 contacting the gate trench.

Dummy trench portions 30 may have a structure identical to that of gate trench portions 40 in FIG. 2. Each dummy trench portion 30 has a dummy trench provided on the upper surface 21 side, and a dummy insulating film 32 and a dummy conductive portion 34. The dummy insulating film 32 covers the inner wall of the dummy trench. The dummy conductive portion 34 is provided inside the dummy trench, and on the inner side relative to the dummy insulating film 32. The dummy insulating film 32 insulates the dummy conductive portion 34 from the semiconductor substrate 10. The dummy trench portion 30 is covered by an interlayer dielectric film 38 at the upper surface 21.

The semiconductor device 100 of the present example has the lower-surface side lifetime control region 74 that is provided on the lower surface 23 side in the semiconductor substrate 10, and lies from the transistor portion 70 to the diode portion 80, as illustrated in FIG. 2. In FIG. 2, the peak position, in the Z-axis direction, of the lifetime killer concentration distribution in the lower-surface side lifetime control region 74 is indicated with the symbol "x". In the present example, the number of the lower-surface side lifetime control region 74 provided in the Z-axis direction is one. In the present example, the lower-surface side lifetime control region 74 is provided, in the Y-axis direction, at a portion of the transistor portion 70, but not at other portions of the transistor portion 70. In addition, in the present example, the lower-surface side lifetime control region 74 is provided, in the Y-axis direction, at a portion of the diode portion 80, but not at other portions of the diode portion 80.

T is defined as the thickness of the semiconductor substrate 10. In the present example, the lower-surface side lifetime control region 74 is provided at a position deeper than half of the thickness T as measured from the upper surface 21. If the lower-surface side lifetime control region 74 is provided at a position shallower than half of the thickness T as measured from the upper surface 21, leakage current of the transistor portion 70 tends to increase. Thus, in the present example, the lower-surface side lifetime control region 74 is provided at a position deeper than half of the thickness T as measured from the upper surface 21.

The semiconductor device 100 of the present example has the upper-surface side lifetime control region 72 that is provided on the upper surface 21 side in the semiconductor substrate 10, and lies from the transistor portion 70 to the diode portion 80. In FIG. 2, the peak position, in the Z-axis direction, of the lifetime killer concentration distribution in the upper-surface side lifetime control region 72 is indicated with the symbol "x". In the present example, the upper-surface side lifetime control region 72 extends over the entire length of the diode portion 80 in the Y-axis direction. In the present example, the upper-surface side lifetime control region 72 is provided to reach a transistor portion 70 that is adjacent to the diode portion 80 on the Y-axis negative side, and is not illustrated in FIG. 2. In the transistor portion 70 in the present example, the lower-surface side lifetime control region 74 is provided on the Y-axis negative side relative to the upper-surface side lifetime control region 72. That is, in the transistor portion 70, an end portion Klb of the lower-surface side lifetime control region 74 is positioned on the Y-axis negative side relative to an end portion Kls of the upper-surface side lifetime control region 72.

In the present example, the upper-surface side lifetime control region 72 and lower-surface side lifetime control region 74 are provided locally in the depth direction of the semiconductor substrate 10. That is, the upper-surface side lifetime control region 72 and lower-surface side lifetime control region 74 have defect densities higher than other regions of the semiconductor substrate 10. An exemplary lifetime killer is helium injected into a predetermined depth position. By injecting helium, crystal defects can be formed inside the semiconductor substrate 10.

The lower-surface side lifetime control region 74 has the function of improving leakage current characteristics resulting from the upper-surface side lifetime control region 72. By providing the lower-surface side lifetime control region 74, it becomes easier for holes generated in the drift region 18 which are minority carriers to be cancelled out by electrons which are majority carriers with short lifetime. Thus, the semiconductor device 100 of the present example can improve the leakage current characteristics of the transistor portion 70. In addition, since the semiconductor device 100 of the present example has the lower-surface side lifetime control region 74, it can achieve a favorable trade-off between ON-voltage and turn-off loss of the transistor portion 70.

The distance A is the distance between the end portion Kls and the end portion Klb in the Y-axis direction. The distance B is the distance in the Y-axis direction between the end portion Kls and the boundary between the transistor portion 70 and the diode portion 80. The distance A may be smaller than the distance B. The distance A may be 25% to 50% inclusive of the distance B. In addition, the distance A may be 50 µm to 100 µm inclusive.

In the transistor portion 70 in the present example, the lower-surface side lifetime control region 74 is provided on the Y-axis negative side relative to the upper-surface side lifetime control region 72. Thus, the semiconductor device 100 of the present example can suppress hole injection from emitter regions 12 of the transistor portion 70 to the cathode region 82 of the diode portion 80 at the time of operation of the diode portion 80. Thus, the semiconductor device 100 of the present example can improve the reverse recovery characteristics of the diode portion 80.

The length Lb is the length of the lower-surface side lifetime control region 74 in the transistor portion 70 in the Y-axis direction. The length C is the length of the lower-surface side lifetime control region 74 in the diode portion 80 in the Y-axis direction. The length Lb may be longer than the length C. Since the length Lb is longer than the length C, the semiconductor device 100 of the present example can suppress hole injection from emitter regions 12 of the transistor portion 70 to the cathode region 82 of the diode portion 80 at the time of operation of the diode portion 80. Thus, the semiconductor device 100 of the present example can improve the reverse recovery characteristics of the diode portion 80.

The collector region 22 may be provided on an extension line of an imaginary line that connects the end portion Kls with the end portion Klb as indicated by a line r-r' in FIG. 2. That is, the straight line linking the end portion Kls and the end portion Klb may intersect the collector region 22. With an arrangement in which the straight line linking the end portion Kls and the end portion Klb intersects the collector region 22, it becomes easier for holes that move from emitter regions 12 in the transistor to the cathode region 82 of the diode portion 80 to be cancelled out by electrons due to the presence of the lower-surface side lifetime control region 74. Thus, the semiconductor device 100 of the present example can suppress hole injection from emitter regions 12 of the transistor portion 70 to the cathode region 82 of the diode portion 80 at the time of operation of the diode portion 80.

In the diode portion 80 in the present example, the lower-surface side lifetime control region 74 is provided on the Y-axis positive side relative to the upper-surface side lifetime control region 72. That is, in the present example, the upper-surface side lifetime control region 72 in the diode portion 80 is provided on the Y-axis negative side relative to the end portion Krb of the lower-surface side lifetime control region 74.

Figure 3:
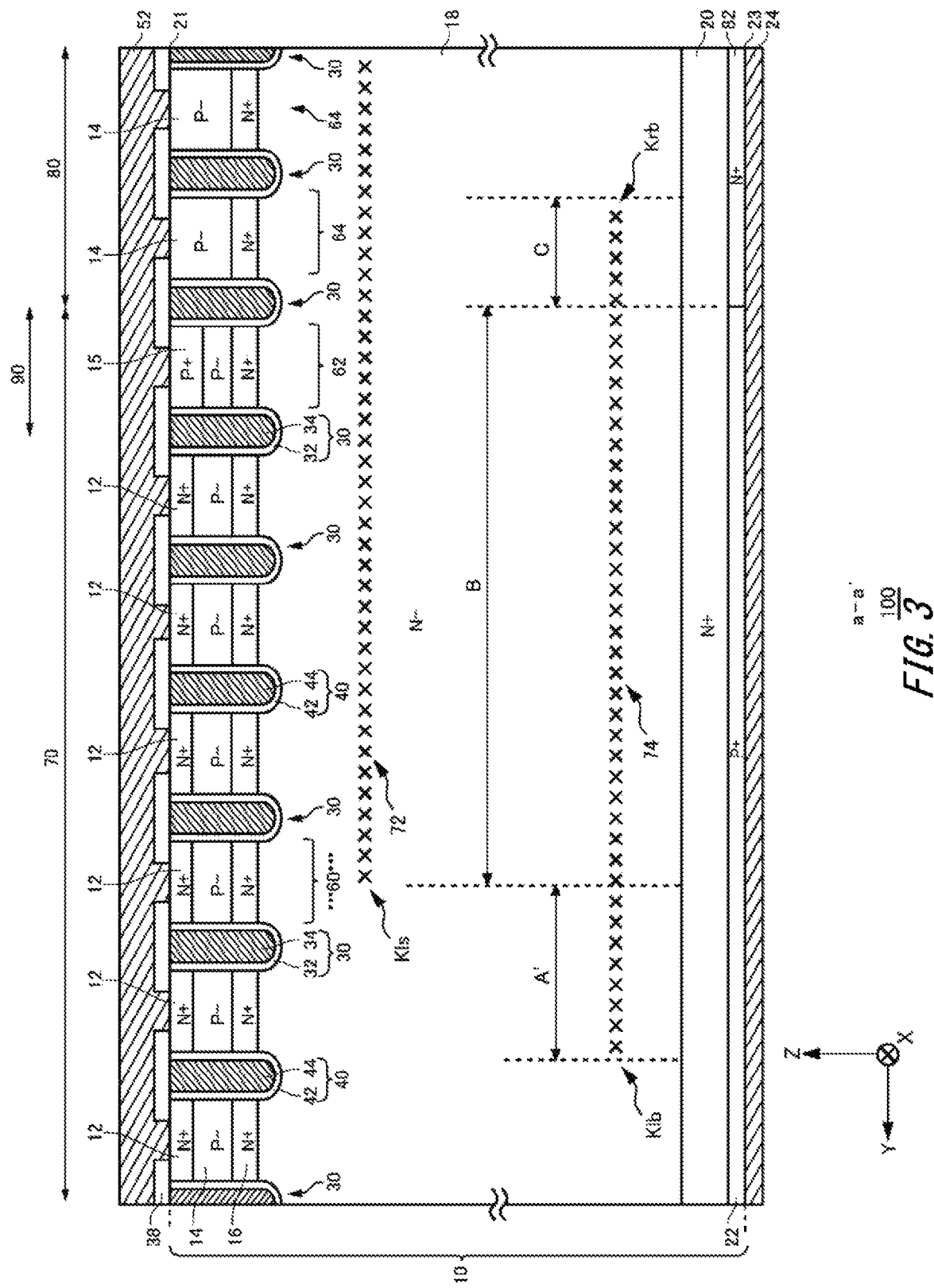
FIG. 3 is a figure illustrating another exemplary cross-section taken along a-a' in FIG. 1.

FIG. 3 is a figure illustrating another exemplary cross-section taken along a-a' in FIG. 1. The semiconductor device 100 in FIG. 3 is different from the semiconductor device 100 in FIG. 2 in that the lower-surface side lifetime control region 74 of the transistor portion 70 extends to reach the Y-axis positive side relative to the upper-surface side lifetime control region 72. FIG. 3 illustrates one example in which the end portion Klb is arranged on the Y-axis positive side relative to the end portion Kls at a distance A'.

In the semiconductor device 100 of the present example, the lower-surface side lifetime control region 74 of the transistor portion 70 is provided on the Y-axis positive side relative to the upper-surface side lifetime control region 72. Thus, it becomes easier for holes that move from emitter regions 12 of the transistor portion 70 to the cathode region 82 of the diode portion 80 to be cancelled out by electrons due to the presence of the lower-surface side lifetime control region 74. Thus, the semiconductor device 100 of the present example can suppress hole injection from emitter regions 12 of the transistor portion 70 to the cathode region 82 of the diode portion 80 at the time of operation of the diode portion 80. In addition, since the lower-surface side lifetime control region 74 is present, the semiconductor device 100 of the present example can improve the leakage current characteristics of the transistor portion 70. In addition, since the lower-surface side lifetime control region 74 is present, the semiconductor device 100 of the present example can achieve a favorable trade-off between ON-voltage and turn-off loss of the transistor portion 70.

Figure 4:
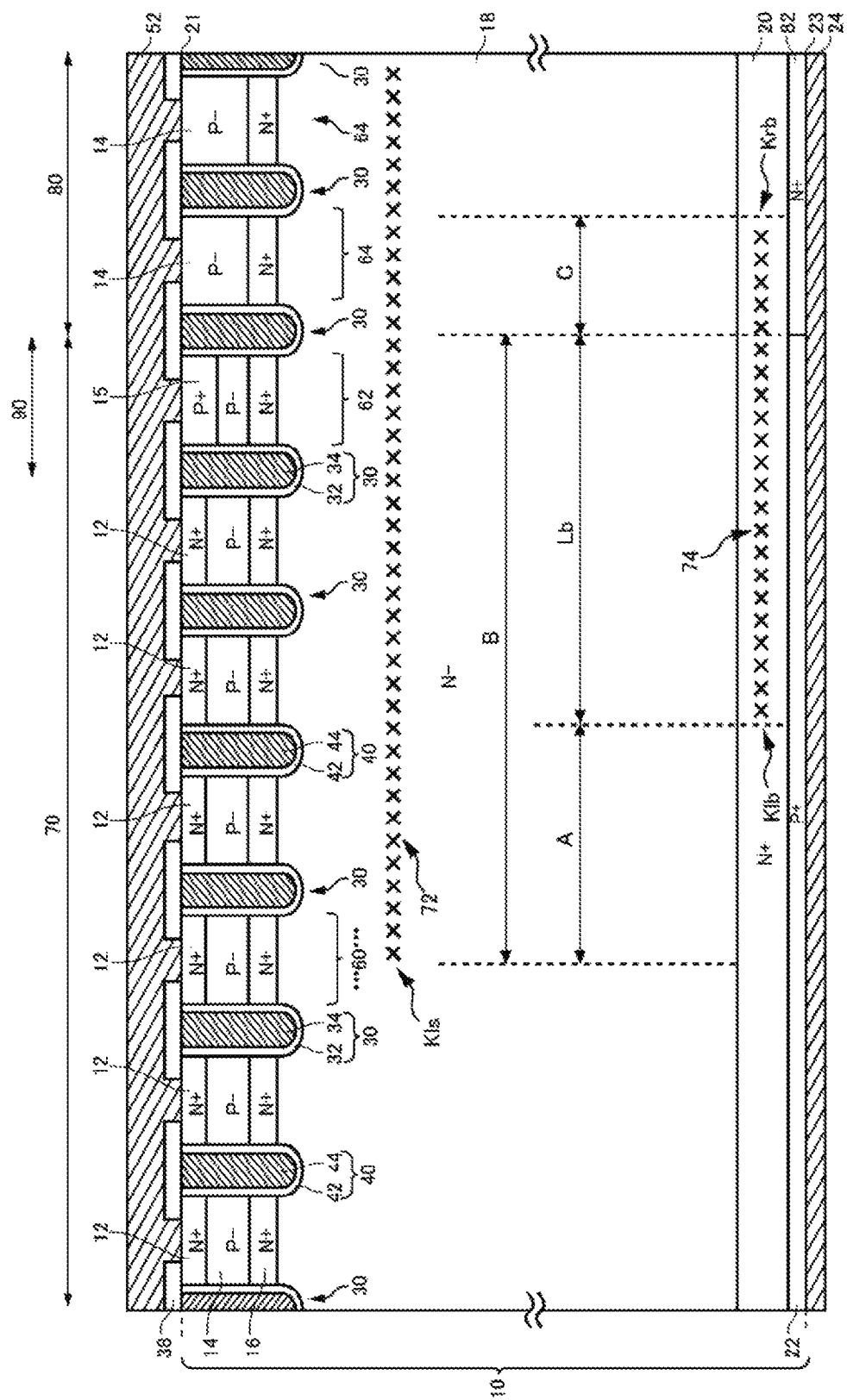
FIG. 4 is a figure illustrating another exemplary cross-section taken along a-a' in FIG. 1.

FIG. 4 is a figure illustrating another exemplary cross-section taken along a-a' in FIG. 1. The semiconductor device 100 in FIG. 4 is different from the semiconductor device 100 in FIG. 2 in that the lower-surface side lifetime control region 74 is provided in the buffer region 20.

In the semiconductor device 100 of the present example, the lower-surface side lifetime control region 74 is provided on the Y-axis negative side relative to the upper-surface side lifetime control region 72. Thus, the semiconductor device 100 of the present example can suppress hole injection from emitter regions 12 of the transistor portion 70 to the cathode region 82 of the diode portion 80 at the time of operation of the diode portion 80. Thus, the semiconductor device 100 of the present example can improve the reverse recovery characteristics of the diode portion 80. In addition, since the semiconductor device 100 of the present example has the lower-surface side lifetime control region 74, it can improve the leakage current characteristics of the transistor portion 70. In addition, since the semiconductor device 100 of the present example has the lower-surface side lifetime control region 74, it can achieve a favorable trade-off between ON-voltage and turn-off loss of the transistor portion 70.

Figure 5:
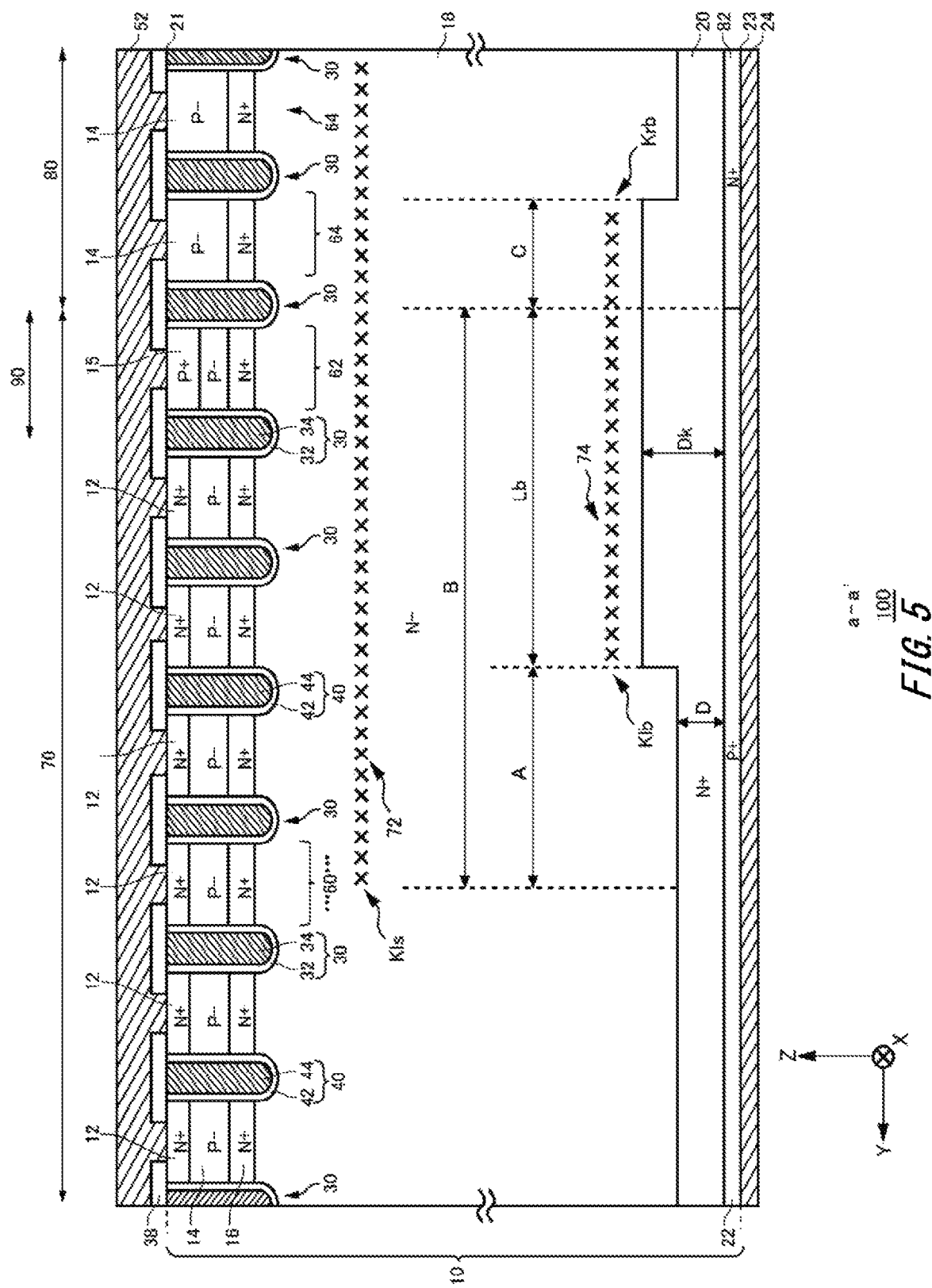
FIG. 5 is a figure illustrating another exemplary cross-section taken along a-a' in FIG. 1.

FIG. 5 is a figure illustrating another exemplary cross-section taken along a-a' in FIG. 1. In the present example, the thickness Dk is the thickness, in the Z-axis direction, of the portion of the buffer region 20 above which the lower-surface side lifetime control region 74 is provided. In addition, the thickness D is the thickness, in the Z-axis direction, of the portion of the buffer region 20 above which the lower-surface side lifetime control region 74 is not provided. The semiconductor device 100 of the present example is different from the semiconductor device 100 in FIG. 2 in that the thickness Dk is larger than the thickness D.

The semiconductor device 100 of the present example has the lower-surface side lifetime control region 74 provided on the Y-axis negative side relative to the upper-surface side lifetime control region 72. Thus, the semiconductor device 100 of the present example can suppress hole injection from emitter regions 12 of the transistor portion 70 to the cathode region 82 of the diode portion 80 at the time of operation of the diode portion 80. Thus, the semiconductor device 100 of the present example can improve the reverse recovery characteristics of the diode portion 80. In addition, since the semiconductor device 100 of the present example has the lower-surface side lifetime control region 74, it can improve the leakage current characteristics of the transistor portion 70. In addition, since the semiconductor device 100 of the present example has the lower-surface side lifetime control region 74, it can achieve a favorable trade-off between ON-voltage and turn-off loss of the transistor portion 70.

Figure 6:
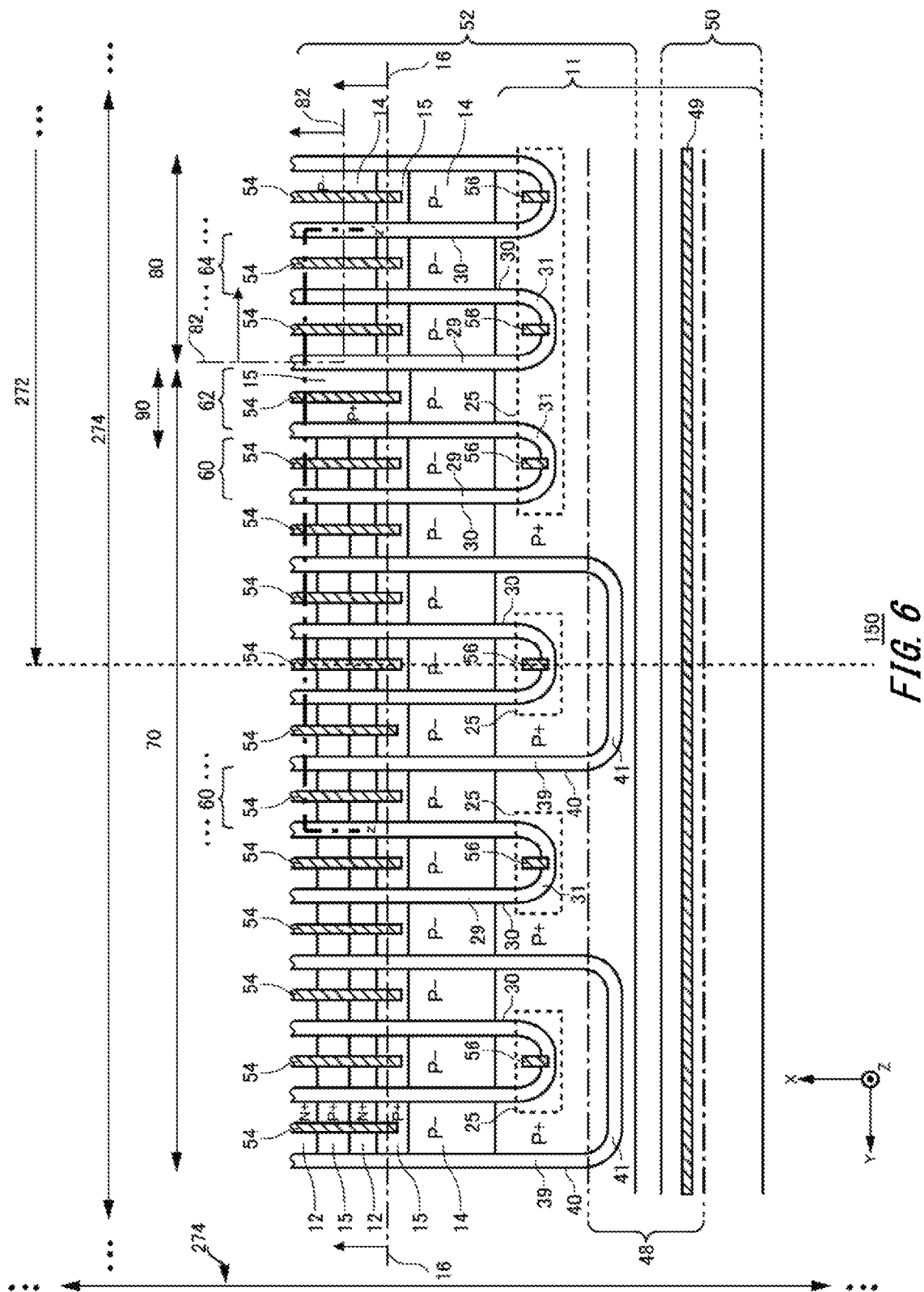
FIG. 6 is a figure illustrating part of the upper surface of a semiconductor device 150 of a comparative example.

FIG. 6 is a figure illustrating part of the upper surface of a semiconductor device 150 of a comparative example. The semiconductor device 150 in FIG. 6 has a lower-surface side lifetime control region 274 extending over the entire length of the transistor portion 70 and diode portion 80 in the Y-axis direction. An upper-surface side lifetime control region 272 is provided at the same position as that in FIG. 1, in the top view of the semiconductor substrate 10. The semiconductor device 150 of the comparative example has the lower-surface side lifetime control region 274 is provided to reach regions on the Y-axis positive side and negative side not illustrated in FIG. 6.

Figure 7:
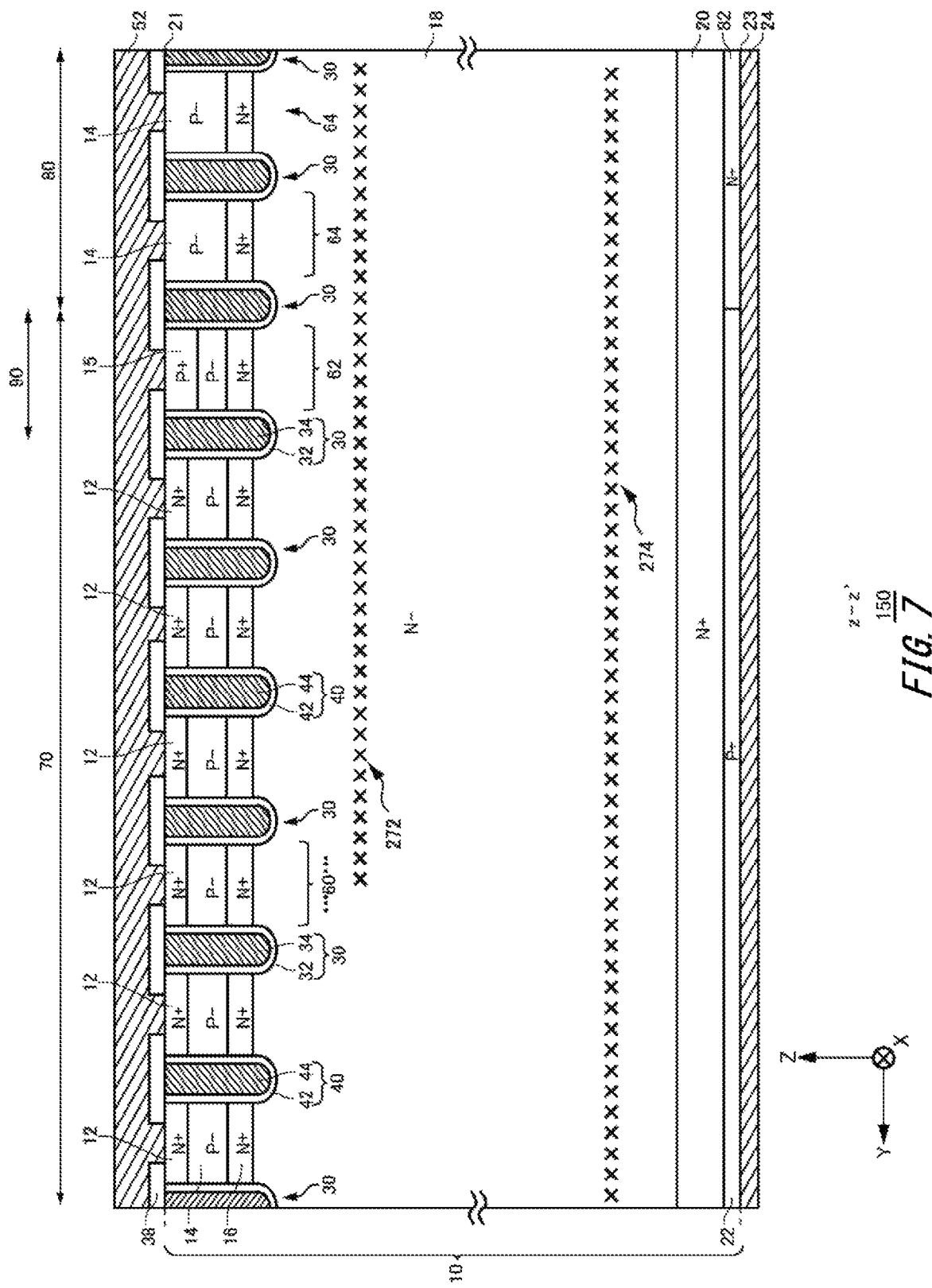
FIG. 7 is a figure illustrating an exemplary cross-section taken along z-z' in FIG. 6.

FIG. 7 is a figure illustrating an exemplary cross-section taken along z-z' in FIG. 6. As illustrated in FIG. 7, the semiconductor device 150 of the comparative example has the lower-surface side lifetime control region 274 provided below an upper-surface side lifetime control region 272, and over the entire length of the transistor portion 70 and diode portion 80 in the Y-axis direction. Thus, it is difficult for the semiconductor device 150 of the comparative example to improve leakage current characteristics resulting from a lifetime killer. In addition, the semiconductor device 150 of the comparative example tends to incur deterioration in a trade-off between ON-voltage and turn-off loss of the transistor portion 70.

Figure 8:
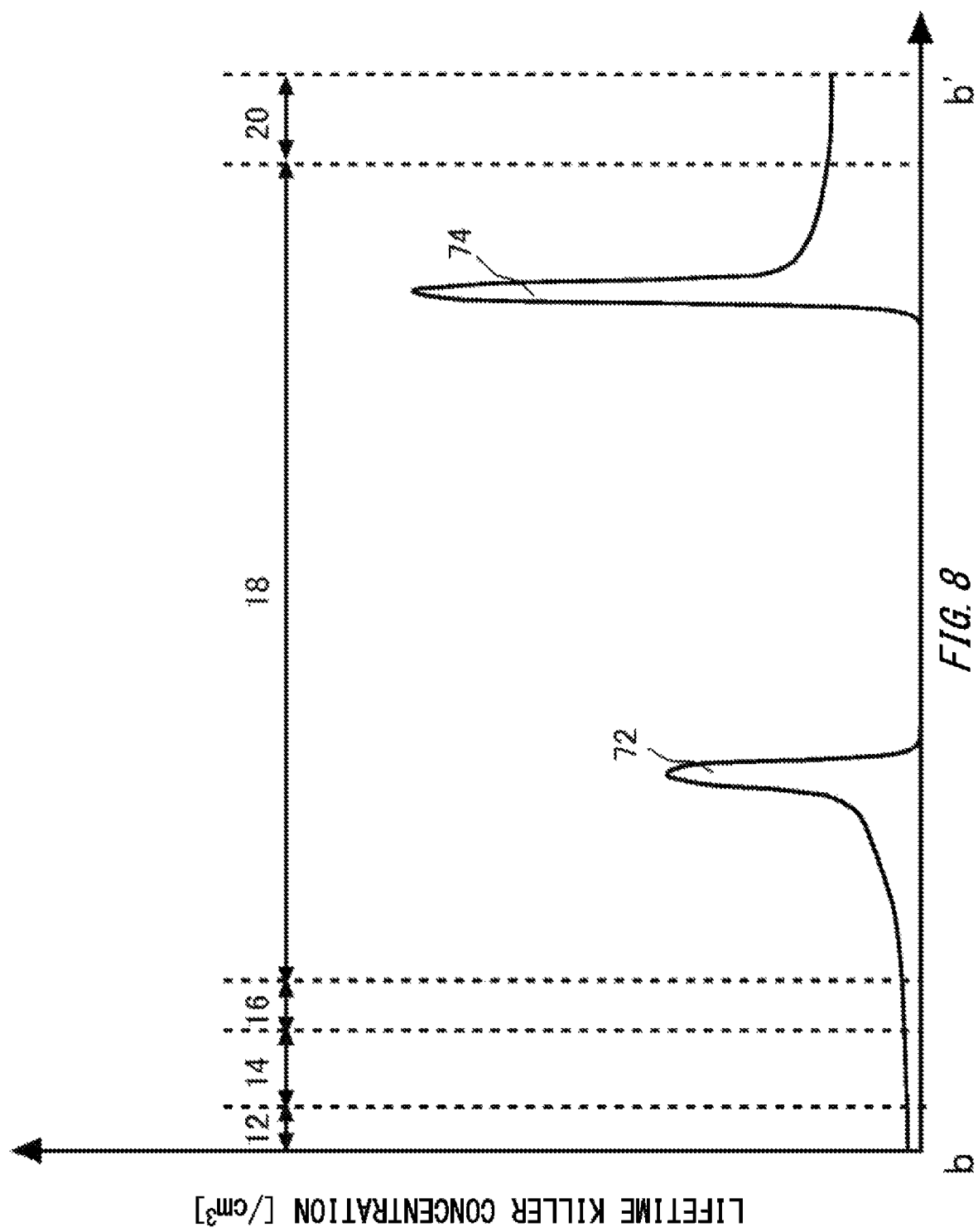
FIG. 8 is a figure illustrating an exemplary lifetime killer concentration distribution in an upper-surface side lifetime control region 72 and a lower-surface side lifetime control region 74 in a cross-section taken along b-b' in FIG. 2.

FIG. 8 is a figure illustrating an exemplary lifetime killer concentration distribution in the upper-surface side lifetime control region 72 and the lower-surface side lifetime control region 74 along a line b-b' in FIG. 2. The present example illustrates an exemplary lifetime killer concentration distribution in the case where the upper-surface side lifetime control region 72 is formed by injecting helium ions from the upper surface 21, and the lower-surface side lifetime control region 74 is formed by injecting helium ions from the lower surface 23.

The peak lifetime killer concentration position (the depth in the Z-axis direction from the upper surface 21) of the upper-surface side lifetime control region 72 is equal to the position, in the Z-axis direction, of the symbol "x" indicating the upper-surface side lifetime control region 72 in FIG. 2. If helium ions are injected from the upper surface 21, the lifetime killer may be distributed on the upper surface 21 side relative to the peak position at a concentration lower than the peak concentration.

The peak lifetime killer concentration position (the depth in the Z-axis direction from the lower surface 23) of the lower-surface side lifetime control region 74 is equal to the position, in the Z-axis direction, of the symbol "x" indicating the lower-surface side lifetime control region 74 in FIG. 2. If helium ions are injected from the lower surface 23, the lifetime killer may be distributed on the lower surface 23 side relative to the peak position at a concentration lower than the peak concentration.

The peak lifetime killer concentration of the lower-surface side lifetime control region 74 may be higher than or lower than the peak lifetime killer concentration of the upper-surface side lifetime control region 72. In the present example, the peak lifetime killer concentration of the lower-surface side lifetime control region 74 is higher than the peak lifetime killer concentration of the upper-surface side lifetime control region 72. The lifetime killer concentration of the lower-surface side lifetime control region 74 may be 200% to 500% higher than the lifetime killer concentration of the upper-surface side lifetime control region 72.

Note that the vertical axis of the lifetime killer concentration distribution may correspond to the helium concentration, or may correspond to the density of crystal defects formed by injection of helium ions. Crystal defects may be interstitial helium, vacancies, divacancies, or the like. Due to these crystal defects, carrier recombination centers are formed. Recombination of carriers is enhanced via the energy state (trap state) of the formed recombination centers. The lifetime killer concentration corresponds to a trap state density.

In the present example, the lifetime killer concentration of the lower-surface side lifetime control region 74 is higher than the lifetime killer concentration of the upper-surface side lifetime control region 72. Thus, the semiconductor device 100 of the present example can extend the carrier lifetime of the upper-surface side lifetime control region 72. Thus, the semiconductor device 100 of the present example can improve the leakage current characteristics resulting from a lifetime killer. In addition, the semiconductor device 100 of the present example can achieve a favorable trade-off between ON-voltage and turn-off loss of the transistor portion 70.

Figure 9:
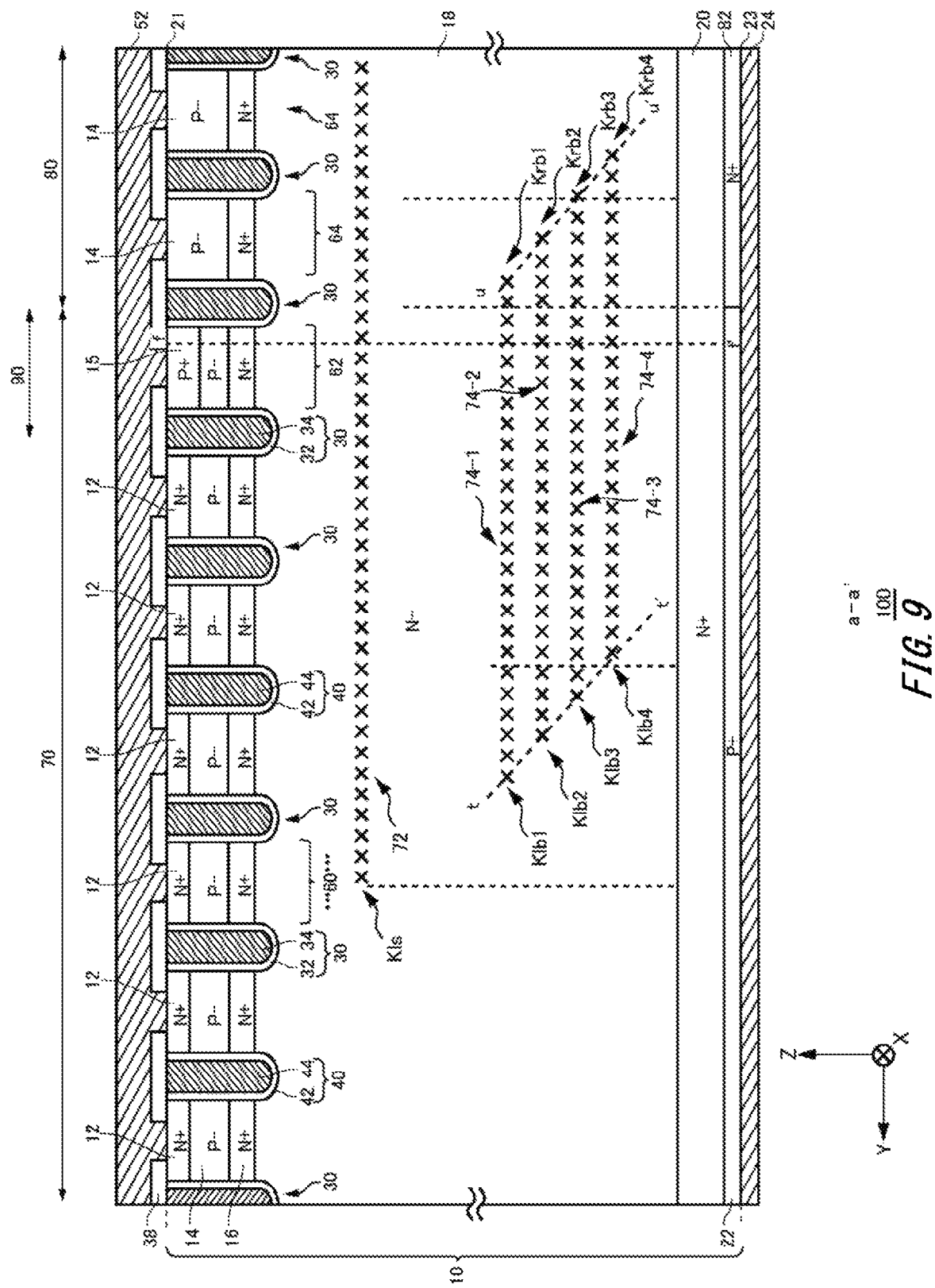
FIG. 9 is a figure illustrating another exemplary cross-section taken along a-a' in FIG. 1.

FIG. 9 is a figure illustrating another exemplary cross-section taken along a-a' in FIG. 1. The semiconductor device 100 in FIG. 9 is different from the semiconductor device 100 in FIG. 2 in that a plurality of lower-surface side lifetime control regions 74 are provided in the Z-axis direction. In the example illustrated in FIG. 9, the semiconductor device 100 has four lower-surface side lifetime control regions 74 provided in the Z-axis direction. In FIG. 9, the peak positions, in the Z-axis direction, of the lifetime killer concentration distribution in the lower-surface side lifetime control region 74-1 to the lower-surface side lifetime control region 74-4 are indicated with the symbol "x".

In the present example, the lower-surface side lifetime control region 74-4 provided closest to the lower surface 23 is provided on the Y-axis negative side relative to the lower-surface side lifetime control region 74-1 provided closest to the upper surface 21. That is, as indicated by a broken line t-t' in FIG. 9, end portions of the lower-surface side lifetime control regions 74 may be arranged to shift to the Y-axis negative side in FIG. 9 sequentially in the order of the end portion Klb1 of the lower-surface side lifetime control region 74-1 to the end portion Klb4 of the lower-surface side lifetime control region 74-4. The end portion Klb1 to the end portion Klb4 may be arranged linearly along the broken line t-t' in a Y-Z plane.

In the present example, the lower-surface side lifetime control region 74-4 is provided on the Y-axis negative side relative to the upper-surface side lifetime control region 72. Thus, the semiconductor device 100 of the present example can suppress hole injection from emitter regions 12 of the transistor portion 70 to the cathode region 82 of the diode portion 80 at the time of operation of the diode portion 80. Thus, the semiconductor device 100 of the present example can improve the reverse recovery characteristics of the diode portion 80. Note that the lengths of the four lower-surface side lifetime control regions 74 in the Y-axis direction may be different from each other.

In the diode portion 80, the lower-surface side lifetime control region 74-4 provided closest to the lower surface 23 may be provided on the Y-axis negative side relative to the lower-surface side lifetime control region 74-1 provided closest to the upper surface 21. That is, as indicated by a broken line u-u' in FIG. 9, end portions of the lower-surface side lifetime control regions 74 may be positioned to shift to the Y-axis negative side in FIG. 9 sequentially in the order of the end portion Krb1 of the lower-surface side lifetime control region 74-1 to the end portion Krb4 of the lower-surface side lifetime control region 74-4. The end portion Krb1 to the end portion Krb4 may be arranged linearly along the broken line u-u' in a Y-Z plane.

In the semiconductor device 100 of the present example, end portions of the lower-surface side lifetime control regions 74 on the Y-axis positive side are positioned to shift to the Y-axis negative side sequentially in the order of the end portion Klb1 to the end portion Klb4. Thereby, the semiconductor device 100 of the present example can suppress hole injection from emitter regions 12 of the transistor portion 70 to the cathode region 82 of the diode portion 80 at the time of operation of the diode portion 80.

Figure 10:
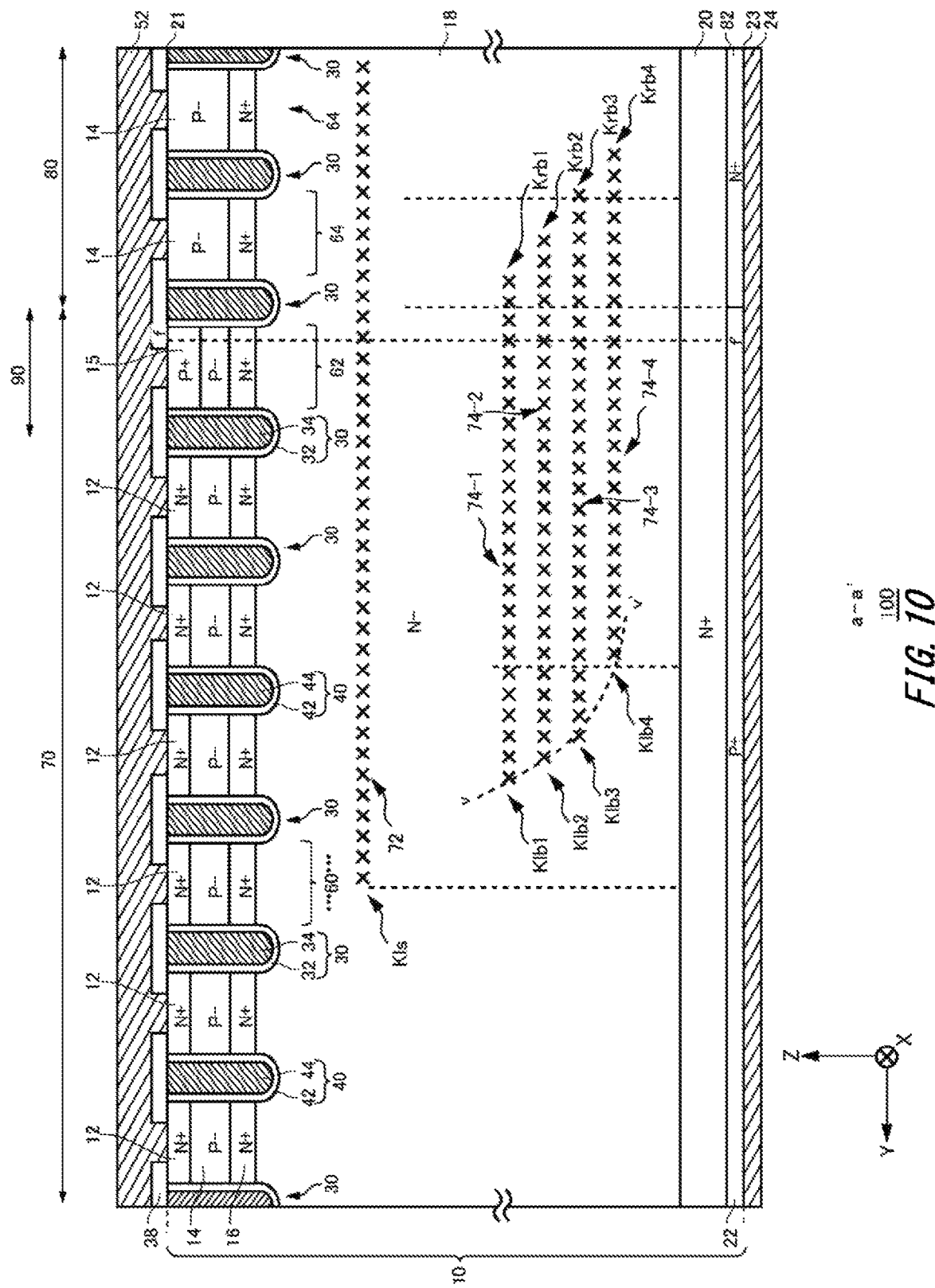
FIG. 10 is a figure illustrating another exemplary cross-section taken along a-a' in FIG. 1.

FIG. 10 is a figure illustrating another exemplary cross-section taken along a-a' in FIG. 1. The semiconductor device 100 in FIG. 10 is different from the semiconductor device 100 in FIG. 9 in that the end portion Klb1 to the end portion Klb4 are arranged to form a shape convex toward the Y-axis positive side in a Y-Z plane as indicated by a broken line v-v'. As compared with the semiconductor device 100 in FIG. 9, in the semiconductor device 100 in FIG. 10, the end portion Klb2 and end portion Klb3 are positioned on the Y-axis positive side. Thereby, the semiconductor device 100 of the present example can more suppress hole injection from emitter regions 12 of the transistor portion 70 to the cathode region 82 of the diode portion 80 at the time of operation of the diode portion 80 than the semiconductor device 100 in FIG. 9 can. Note that, although in FIG. 10, the end portion Krb1 to the end portion Krb4 are arranged linearly in the Y-Z plane, they may be arranged to form a shape convex toward the Y-axis negative side, or may be arranged to form a shape convex toward the Y-axis positive side.

Figure 11:
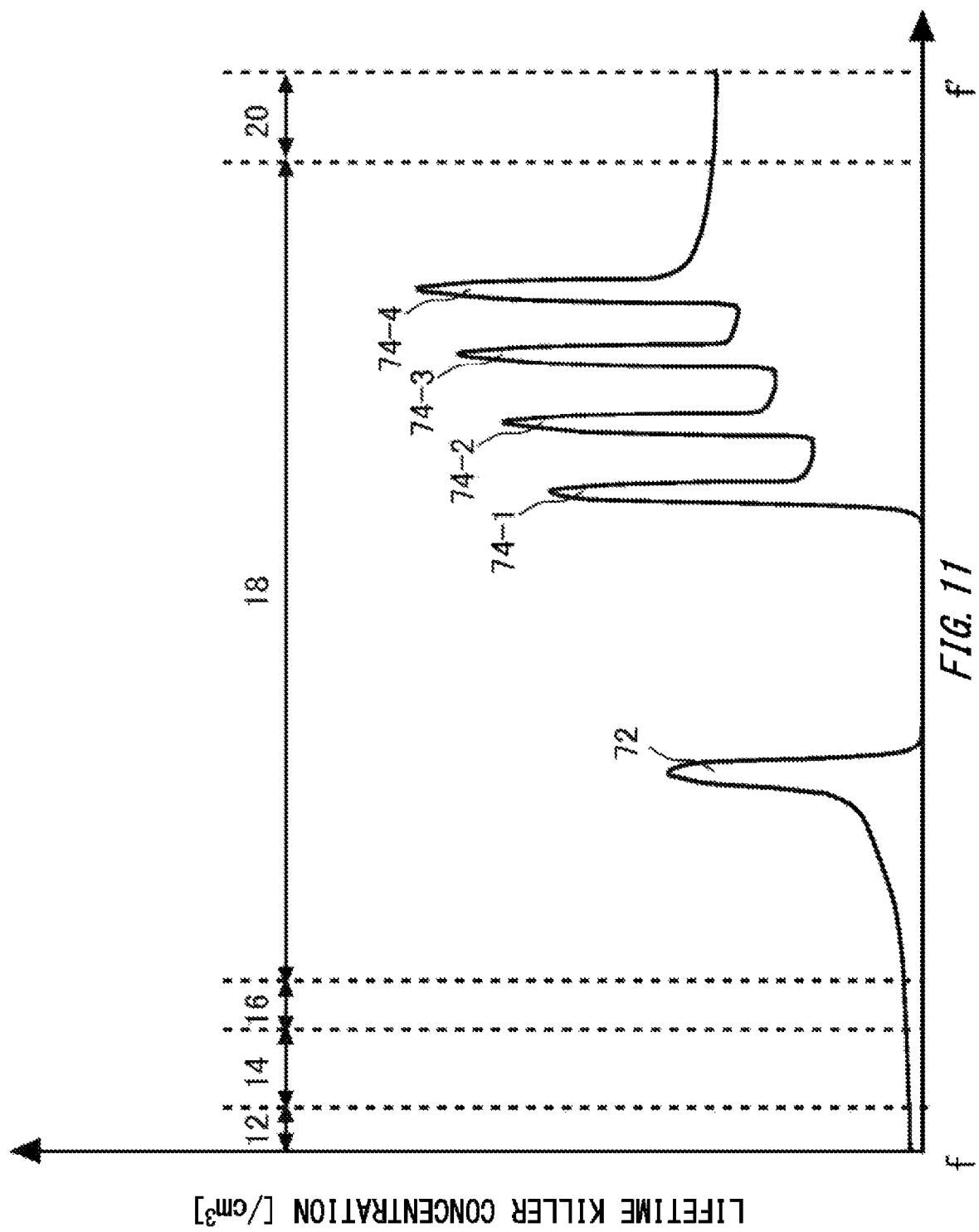
FIG. 11 is a figure illustrating an exemplary lifetime killer concentration distribution in the upper-surface side lifetime control region 72, and a lower-surface side lifetime control region 74-1 to a lower-surface side lifetime control region 74-4 in a cross-section taken along f-f in FIG. 9.

FIG. 11 is a figure illustrating the lifetime killer concentration distribution in the upper-surface side lifetime control region 72 and the lower-surface side lifetime control region 74-1 to the lower-surface side lifetime control region 74-4 along a line f-f' in FIG. 9. The present example illustrates an exemplary lifetime killer concentration distribution in the case where helium ions are injected from the lower surface 23 to form each of the lower-surface side lifetime control region 74-1 to the lower-surface side lifetime control region 74-4.

The peak lifetime killer concentration positions (the depths in the Z-axis direction from the lower surface 23) of the lower-surface side lifetime control regions 74 are equal to the positions, in the Z-axis direction, of the symbol "x" indicating the lower-surface side lifetime control regions 74 in FIG. 9. If helium ions are injected from the lower surface 23, the lifetime killer may be distributed on the lower surface 23 side relative to the peak positions at concentration lower than the peak concentrations.

As illustrated in FIG. 11, the lifetime killer concentration of the lower-surface side lifetime control region 74-4 provided closest to the lower surface 23 may be higher than the lifetime killer concentration of the lower-surface side lifetime control region 74-1 provided closest to the upper surface 21. The lifetime killer concentration of the lower-surface side lifetime control region 74-4 may be 200% to 500% higher than the lifetime killer concentration of the lower-surface side lifetime control region 74-1.

As the distance from the upper surface 21 increases, the lifetime killer concentration of the lower-surface side lifetime control region 74 may increase. That is, the lower-surface side lifetime control region 74-2 may have a higher lifetime killer concentration than that of the lower-surface side lifetime control region 74-1, and so on. In the four lower-surface side lifetime control regions 74, a trough indicating a local minimum of the lifetime killer concentration may be formed between the peak concentrations of each pair of lower-surface side lifetime control regions 74 that are adjacent to each other in the Z-axis direction. The local minimum lifetime killer concentration at a trough closer to the lower surface 23 may be higher than the local minimum lifetime killer concentration at a trough closer to the upper surface 21. Furthermore, the lifetime killer concentration of the region from the position of the peak concentration of the lower-surface side lifetime control region 74-4 to the position of the lower surface 23 may be higher than the local minimum lifetime killer concentration of any one of the troughs formed between pairs of lower-surface side lifetime control regions 74 adjacent to each other in the Z-axis direction.

In the semiconductor device 100 of the present example, the lifetime killer concentration of the lower-surface side lifetime control region 74-4 provided closest to the lower surface 23 is higher than the lifetime killer concentration of the lower-surface side lifetime control region 74-1 provided closest to the upper surface 21. Thus, the semiconductor device 100 of the present example can extend the carrier lifetime of the upper-surface side lifetime control region 72 as compared to the case where the lifetime killer concentration of the lower-surface side lifetime control region 74-4 provided closest to the lower surface 23 is lower than the lifetime killer concentration of the lower-surface side lifetime control region 74-1 provided closest to the upper surface 21. Thus, the semiconductor device 100 of the present example can improve the leakage current characteristics resulting from a lifetime killer. In addition, the semiconductor device 100 of the present example can achieve a favorable trade-off between ON-voltage and turn-off loss of the transistor portion 70.

Note that the lower-surface side lifetime control region 74 as a whole may exhibit a lifetime killer concentration that increases from the upper surface 21 side to the lower surface 23 side. That is, the lifetime killer concentration may exhibit an opposite relationship locally (e.g., the lifetime killer concentration of the lower-surface side lifetime control region 74-2 is higher than the lifetime killer concentration of the lower-surface side lifetime control region 74-3).

Figure 12:
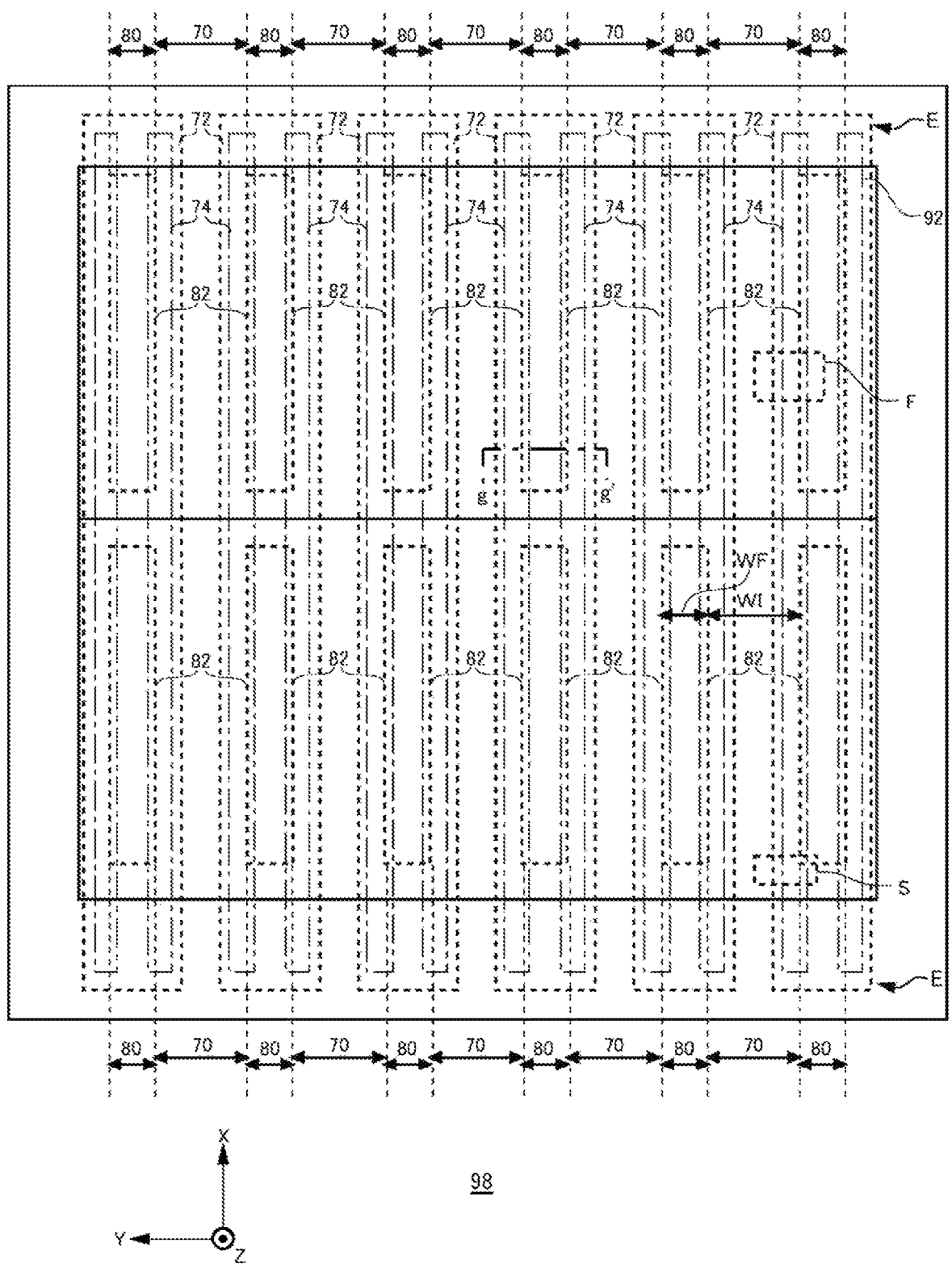
FIG. 12 is a figure illustrating an exemplary semiconductor chip 98 according to an embodiment of the present invention.

FIG. 12 is a figure illustrating an exemplary semiconductor chip 98 according to an embodiment of the present invention. As illustrated in FIG. 12, the semiconductor chip 98 of the present example may have transistor portions 70 and diode portions 80 that are arrayed alternately at constant intervals in an X-Y plane. FIG. 12 illustrates one example in which two rows and five rows of transistor portions 70 are provided in the X-axis direction and Y-axis direction, respectively, and two rows and six rows of diode portions 80 are provided in the X-axis direction and Y-axis direction, respectively. Note that FIG. 1 is an enlarged view of a region S in FIG. 12.

In the present example, upper-surface side lifetime control regions 72 are provided in regions of portions indicated by broken lines in FIG. 12. The upper-surface side lifetime control regions 72 may cover entire cathode regions 82 in the diode portions 80 in an X-Y plane as illustrated in FIG. 12. In addition, in the present example, lower-surface side lifetime control regions 74 are provided in regions of portions indicated by alternate long and short dash lines in FIG. 12. The lower-surface side lifetime control regions 74 may each be provided across a transistor portion 70 and a diode portion 80. In addition, the cathode regions 82 of the diode portions 80 are provided in the depth direction of the semiconductor chip 98 in the top view in FIG. 12, which is a of the semiconductor chip 98.

The width WI is the width of a transistor portion 70 in the Y-axis direction. In addition, the width WF is the width of a diode portion 80 in the Y-axis direction. The width WI may be larger than the width WF. The width WI may be 200% to 500% inclusive of the width WF. The width WI is 1500 μm, for example. In addition, the width WF is 500 μm, for example.

Lower-surface side lifetime control regions 74 may be provided to reach a region E which is on the outer side relative to the upper-surface side lifetime control regions 72 in the X-axis direction, as illustrated in FIG. 12. That is, the lower-surface side lifetime control regions 74 may lie beyond both ends of the upper-surface side lifetime control regions 72 in the X axis direction, and reach both ends of the semiconductor chip 98 in the X axis direction.

Figure 13:
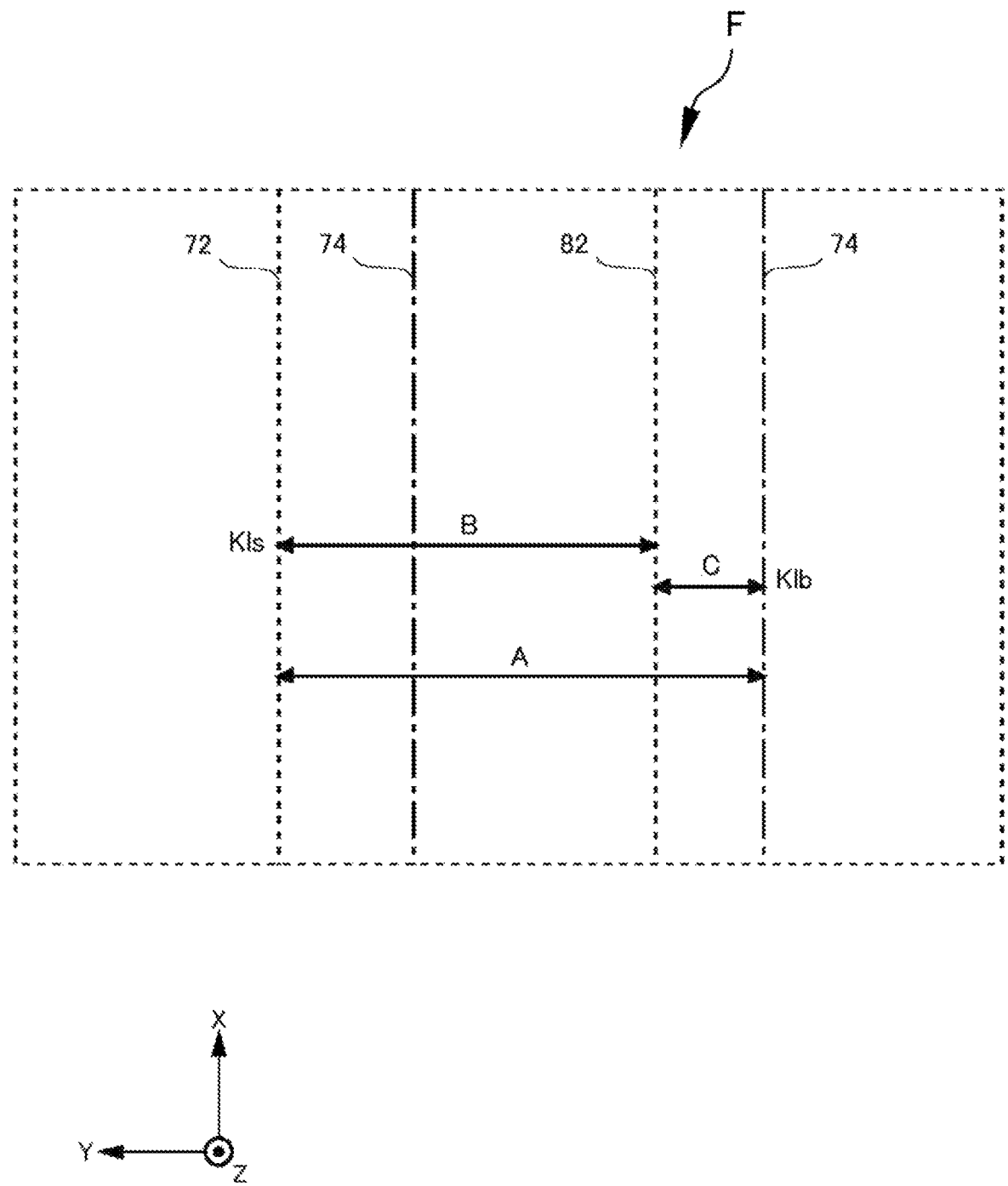
FIG. 13 is an enlarged view of a region F in FIG. 12.

FIG. 13 is an enlarged view of a region F in FIG. 12. The distance B is the distance between an end portion Kls, and the boundary between a transistor portion 70 and a diode portion 80 in the Y-axis direction. In addition, the distance C is the distance between the boundary between the transistor portion 70 and the diode portion 80, and an end portion Klb in the Y-axis direction. The distance B may be 1% to 15% inclusive of the width WI of the transistor portion 70. In addition, the distance C may be 1.5% to 3% inclusive of the width WF of the diode portion 80. Note that the distance A is the distance between the end portion Kls and the end portion Klb in the Y-axis direction.

Figure 14:
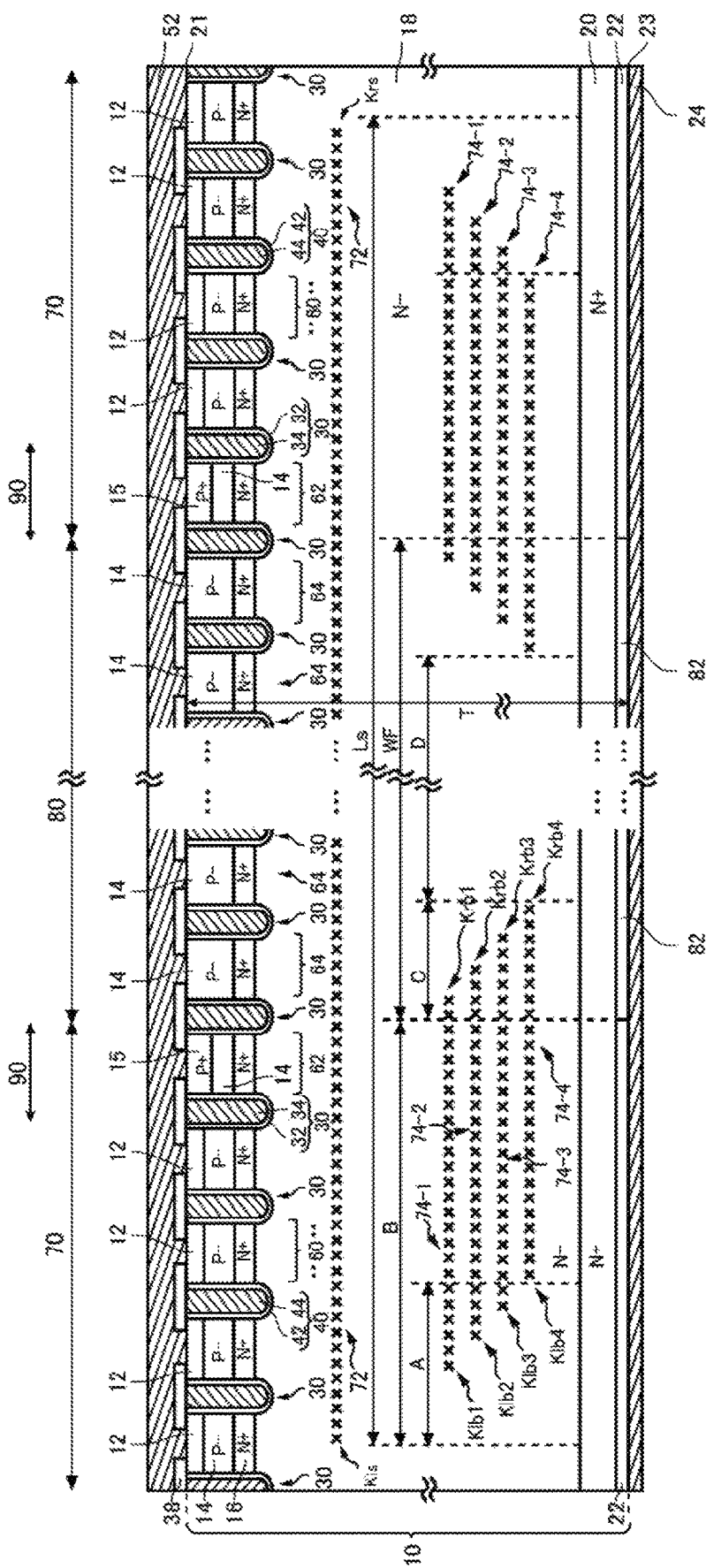
FIG. 14 is a figure illustrating an exemplary cross-section taken along g-g' in FIG. 12.

FIG. 14 is a figure illustrating an exemplary cross-section taken along g-g' in FIG. 12. The semiconductor device 100 of the present example has an upper-surface side lifetime control region 72 provided to lie, in the Y-axis direction, from a first transistor portion 70 through a diode portion 80 to a second transistor portion 70 that is adjacent to the diode portion 80 on the side opposite to the first transistor portion 70. In addition, the semiconductor device 100 of the present example has lower-surface side lifetime control regions 74-1 to lower-surface side lifetime control regions 74-4 that are provided to lie, in the Y-axis direction, from each of the transistor portions 70 adjacent to the diode portion 80 on both sides to the diode portion 80.

The distance D is the distance in the Y-axis direction between the end portion Krb4 of the lower-surface side lifetime control region 74-4 on the Y-axis positive side, and the end portion Klb4 of the lower-surface side lifetime control region 74-4 on the Y-axis negative side. The proportion of the distance D to the width WF of the diode portion 80 may be 95% to 99% inclusive.

In the present example, the upper-surface side lifetime control region 72 lies from the transistor portion 70 on the Y-axis positive side through the diode portion 80 to the transistor portion 70 on the Y-axis negative side. The length Ls is the length between the end portion Kls and the end portion Krs. The length Ls may be larger than the thickness T of the semiconductor substrate 10. By making the length Ls larger than the thickness T, it becomes easier for holes generated in the drift region 18 to recombine with electrons. Thus, the semiconductor device 100 of the present example can suppress switching loss of the transistor portions 70.

Figure 15:
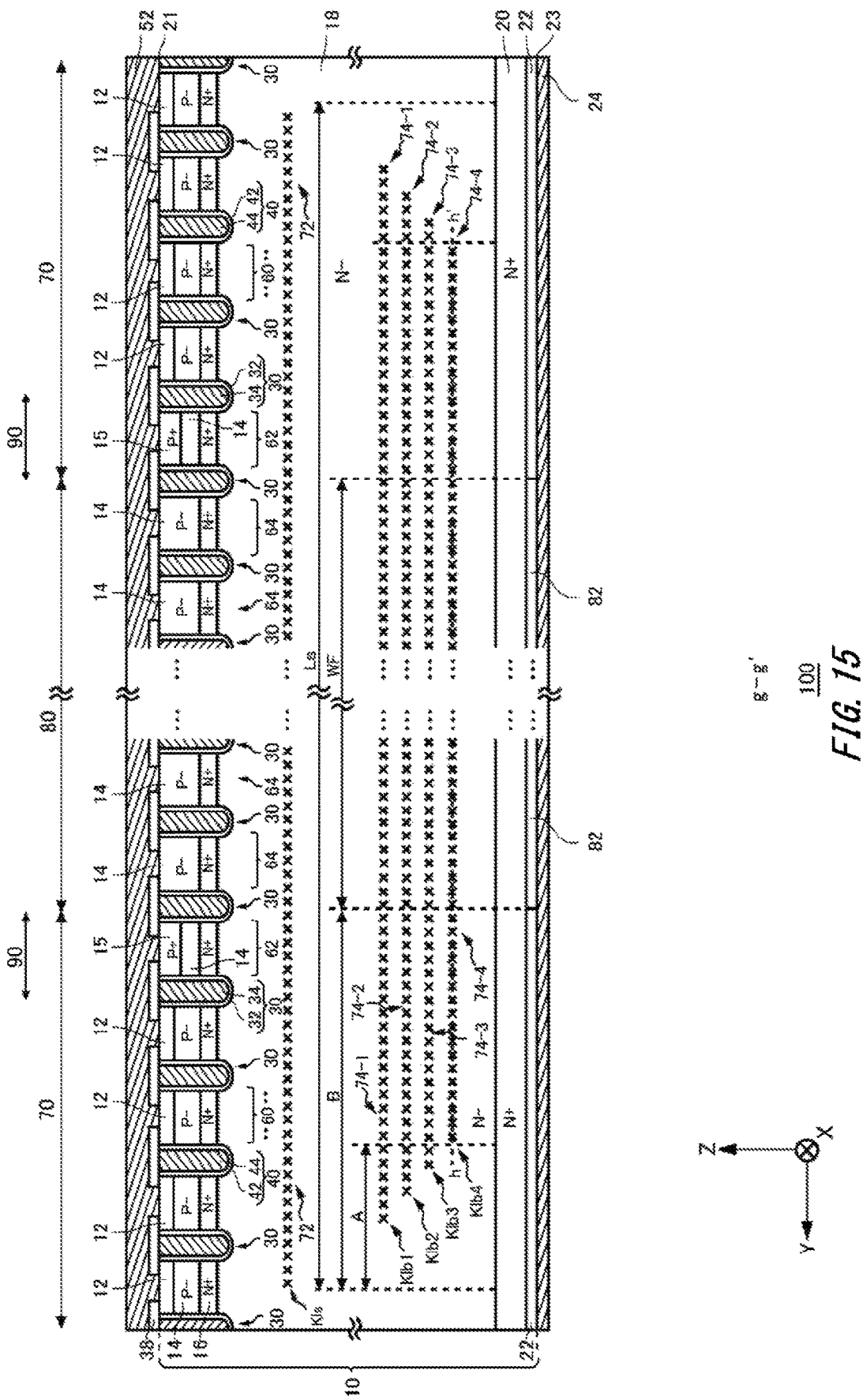
FIG. 15 is a figure illustrating another exemplary cross-section taken along g-g' in FIG. 12.

FIG. 15 is a figure illustrating another exemplary cross-section taken along g-g' in FIG. 12. The semiconductor device 100 of the present example is different from the semiconductor device 100 in FIG. 14 in that the lower-surface side lifetime control region 74-1 to the lower-surface side lifetime control region 74-4 extend over the entire length of the diode portion 80 in the Y-axis direction. In the diode portion 80, the characteristics of the FWD are unlikely to be influenced by the lower-surface side lifetime control region 74. Thus, the lower-surface side lifetime control region 74-1 to the lower-surface side lifetime control region 74-4 may extend over the entire length of the diode portion 80 in the Y-axis direction.

Figure 16:
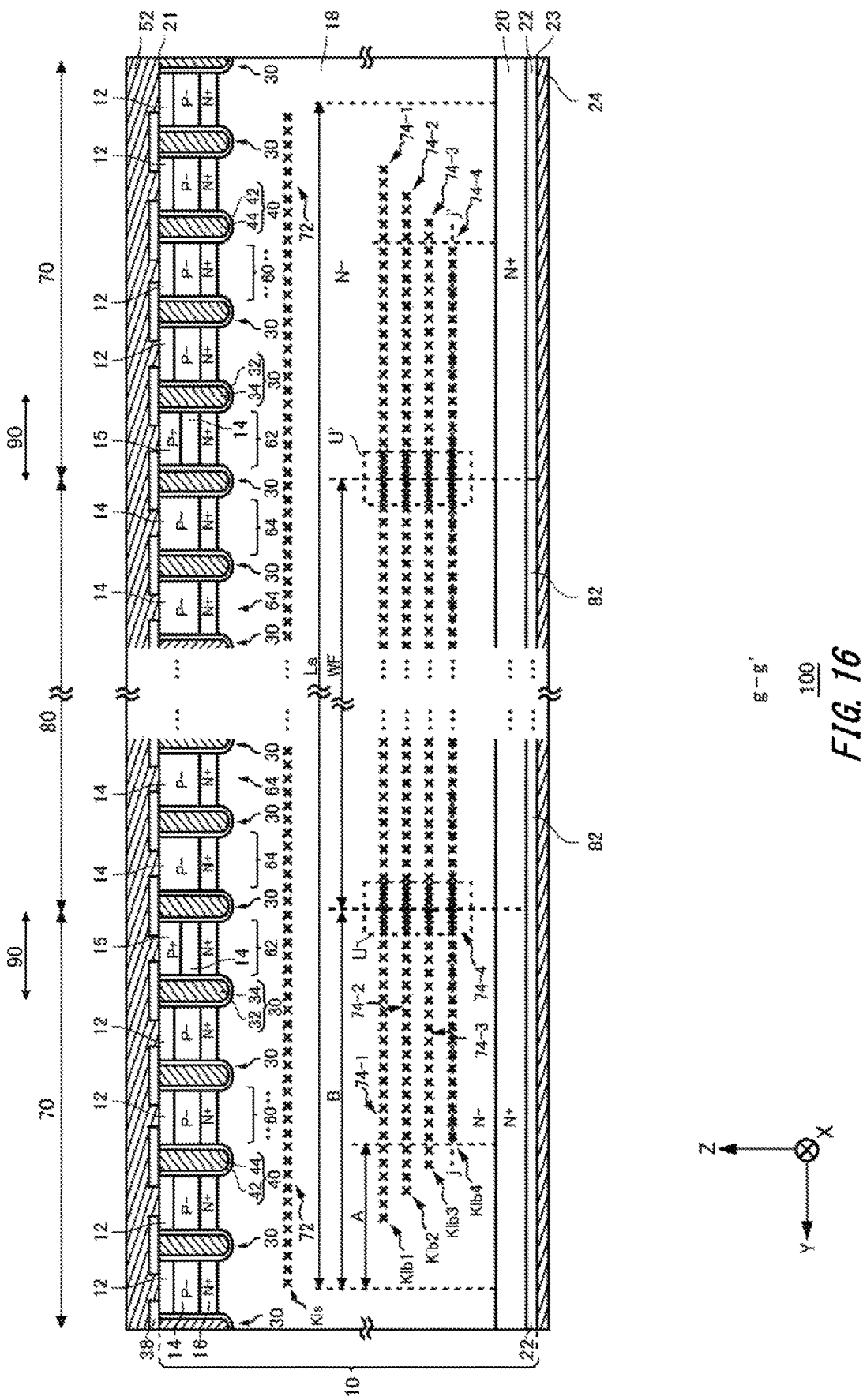
FIG. 16 is a figure illustrating another exemplary cross-section taken along g-g' in FIG. 12.

FIG. 16 is a figure illustrating another exemplary cross-section taken along g-g' in FIG. 12. The semiconductor device 100 in FIG. 16 is different from the semiconductor device 100 in FIG. 15 in that the lifetime killer concentrations at the boundary between each transistor portion 70 and the diode portion 80 in the lower-surface side lifetime control region 74-1 to the lower-surface side lifetime control region 74-4 are higher than the lifetime killer concentrations in regions other than the boundary in the lower-surface side lifetime control region 74-1 to the lower-surface side lifetime control region 74-4.

FIG. 16 illustrates the boundary between each transistor portion 70 and the diode portion 80 as a region U or a region U'. In the present example, the lifetime killer concentrations in the region U and region U' in the lower-surface side lifetime control region 74-1 to the lower-surface side lifetime control region 74-4 are higher than those in regions other than the region U and region U'. Thus, the semiconductor device 100 of the present example can more suppress hole injection from emitter regions 12 of the transistor portions 70 to the cathode region 82 of the diode portion 80 at the time of operation of the diode portion 80 than the semiconductor device 100 in FIG. 15 can. Thus, the semiconductor device 100 of the present example can further improve the reverse recovery characteristics of the diode portion 80. Note that in regions, in the Y-axis direction, other than the region U and region U', there may be partial regions in the diode portion 80 where the lower-surface side lifetime control region 74-1 to the lower-surface side lifetime control region 74-4 are not provided.

Figure 17:
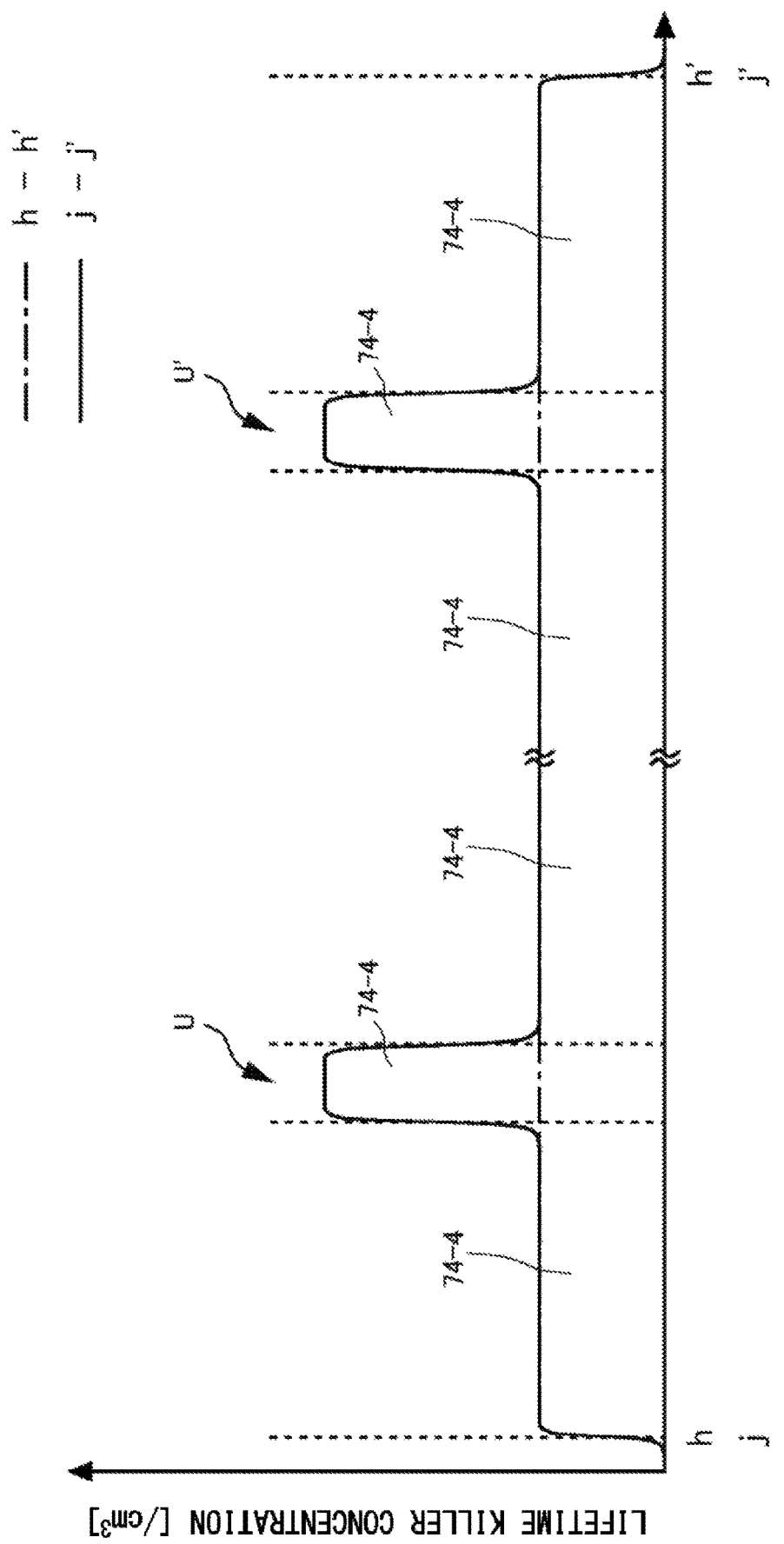
FIG. 17 is a figure illustrating an exemplary lifetime killer concentration distribution, in the Y-axis direction, in lower-surface side lifetime control regions 74-4 in a cross-section taken along h-h' in FIG. 15, and a cross-section taken along j-j' in FIG. 16.

FIG. 17 is a figure illustrating an exemplary lifetime killer concentration distribution, in the Y-axis direction, in the lower-surface side lifetime control regions 74-4 along a line h-h' in FIG. 15, and a line j-j' in FIG. 16. In the present example, the lifetime killer concentration of the lower-surface side lifetime control region 74-4 in the j-j' cross-section is locally high in the region U and region U'. In the region U and region U', the lifetime killer concentration of the lower-surface side lifetime control region 74-4 in the j-j' cross-section may be 200% to 500% higher than the lifetime killer concentration of the lower-surface side lifetime control region 74-4 in the h-h' cross-section.

In the semiconductor device 100 of the present example, the lifetime killer concentration of the lower-surface side lifetime control region 74 is locally high in the region U and region U'. Thus, as compared with the example in FIG. 15, the semiconductor device 100 of the present example can further suppress hole injection from emitter regions 12 of the transistor portion 70 to the diode portion 80 at the time of operation of the diode portion 80. Thus, as compared with the example in FIG. 15, the semiconductor device 100 of the present example can further improve the reverse recovery characteristics of the diode portion 80.

Note that the lifetime killer concentration of the lower-surface side lifetime control region 74-1 may be different between the region U and region U'. In addition, the lifetime killer concentration of any one of the lower-surface side lifetime control region 74-1 to the lower-surface side lifetime control region 74-4 may be locally high in the region U and region U'.

Figure 18:
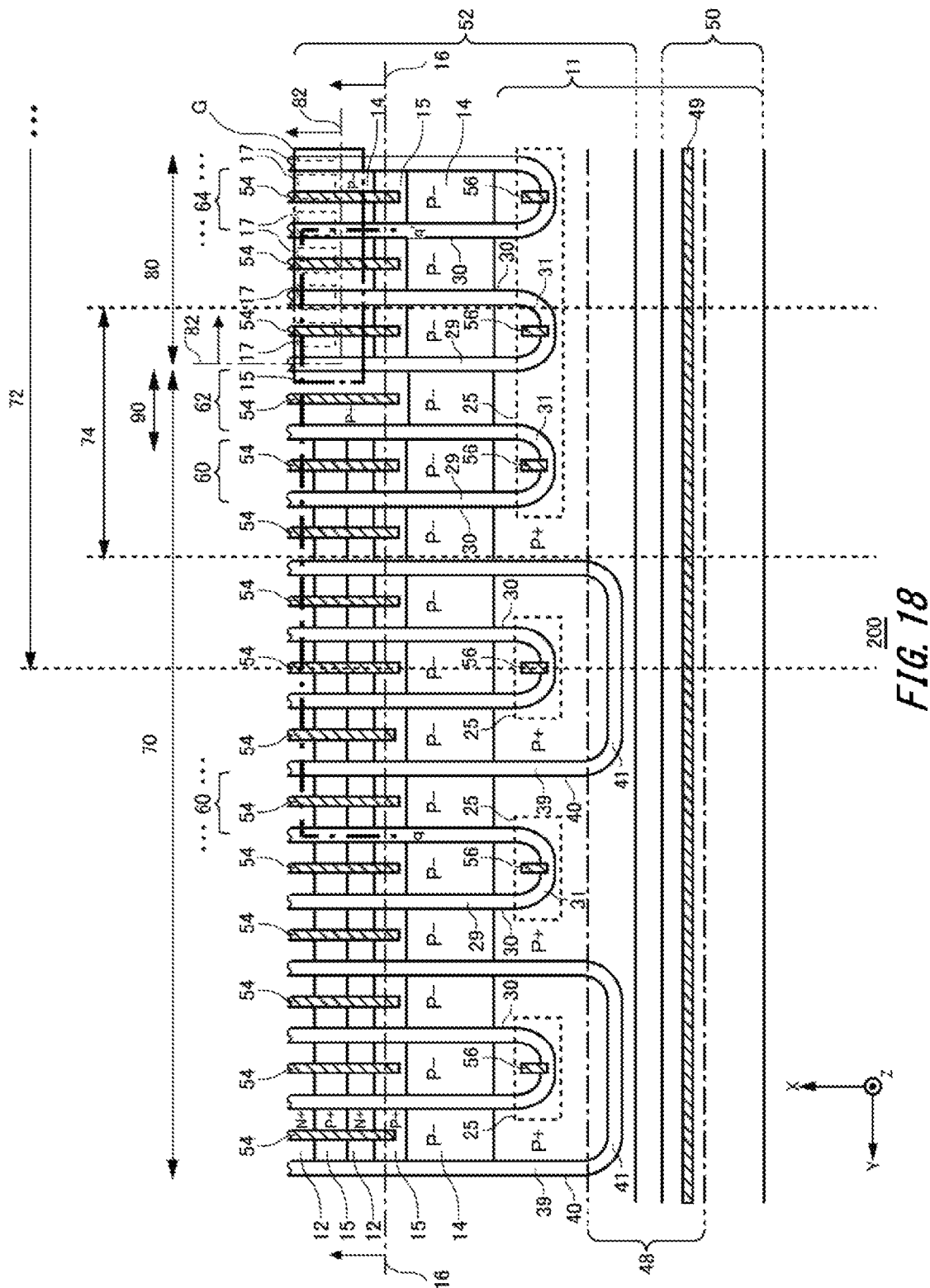
FIG. 18 is a figure illustrating part of the upper surface of another semiconductor device 200 according to the present embodiment.

FIG. 18 is a figure illustrating part of an exemplary upper surface of another semiconductor device 200 according to the present embodiment. The semiconductor device 200 illustrated in FIG. 18 is different from the semiconductor device 100 illustrated in FIG. 1 in that second-conductivity type floating regions 17 are provided below the upper surface of 21 the diode portion 80. The floating regions 17 are of P+ type, for example.

As illustrated in FIG. 18, the floating regions 17 may be provided at a predetermined distance on the X-axis positive side from the end of the cathode region 82 on the X-axis negative side, in the top view of the semiconductor substrate 10. The floating regions 17 may be provided at a predetermined distance on the Y-axis negative side from the end of the cathode region 82 on the Y-axis positive side, in the top view of the semiconductor substrate 10.

Multiple rows of floating regions 17 may be provided in the Y-axis direction, in the top view of the semiconductor substrate 10. Although one row of the floating regions 17 in the X-axis direction is illustrated in FIG. 18, multiple rows of the floating regions 17 may lie in the X-axis direction from a region adjacent to the end of the cathode region 82 on the X-axis negative side to a region adjacent to the end of the cathode region 82 on the X-axis positive side. The floating regions 17 may be provided on the inner side in the cathode region 82 in the top view.

Figure 19:
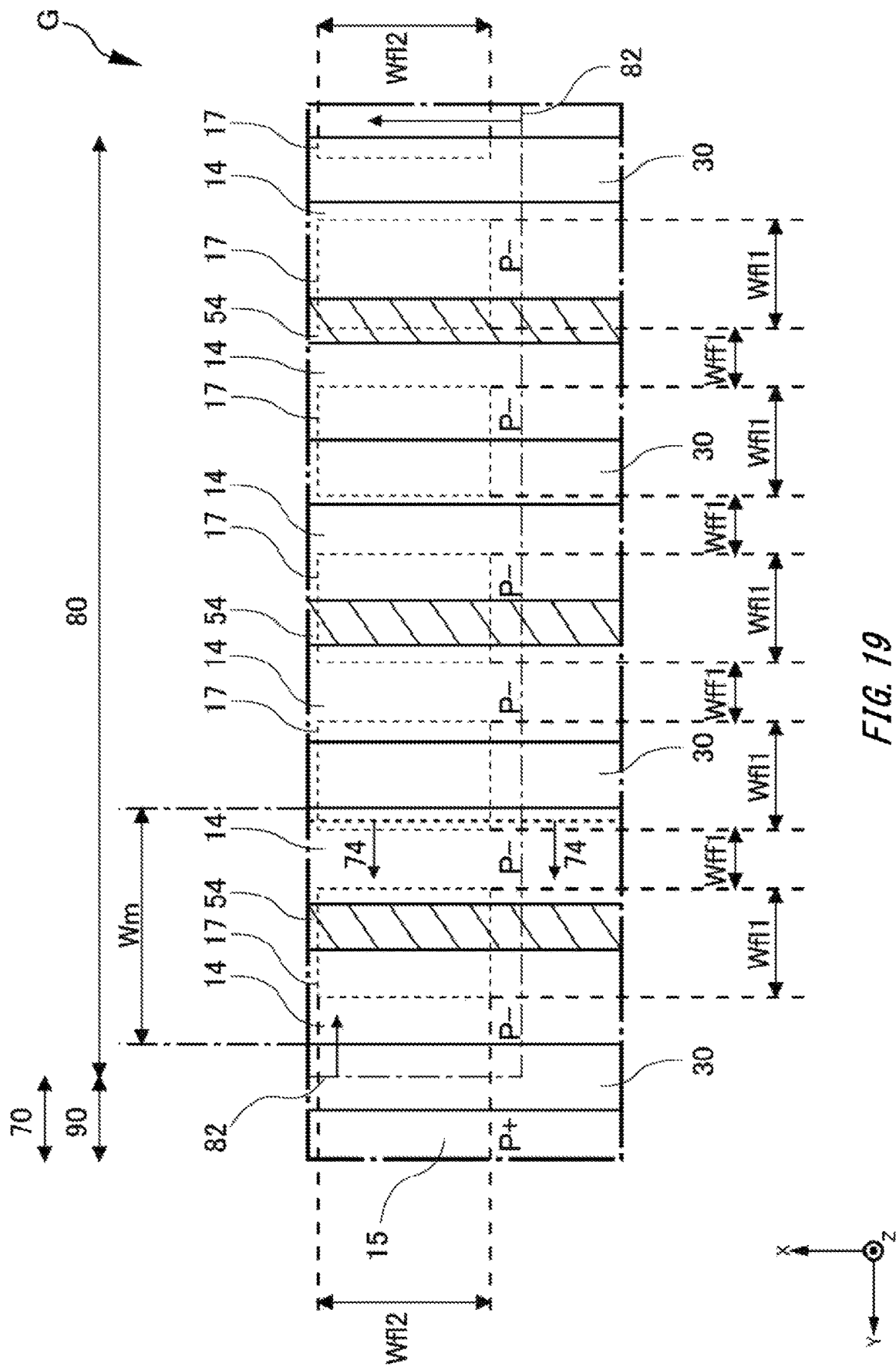
FIG. 19 is an enlarged view of a region G in FIG. 18.

FIG. 19 is an enlarged view of a region G in FIG. 18. As illustrated in FIG. 19, the width Wfl1 is the width of a floating region 17 in the Y-axis direction, and the width Wfl2 is the width of a floating region 17 in the X-axis direction. The width Wfl1 is the interval between one floating region 17 and another floating region 17 adjacent to the one floating region in the Y-axis direction. In addition, the width Wm is the mesa width of a diode mesa portion 64. Note that, also on the X-axis positive side relative to the floating regions 17 illustrated in FIG. 19, a plurality of other floating regions 17 may be provided at predetermined intervals adjacent to the illustrated floating regions 17.

The width Wfl1 may be smaller than the width Wm. The width Wfl2 may be smaller than the width Wm. The width Wff1 may be smaller than the width Wfl1. The width Wff1 may be smaller than the width Wfl2.

Figure 20:
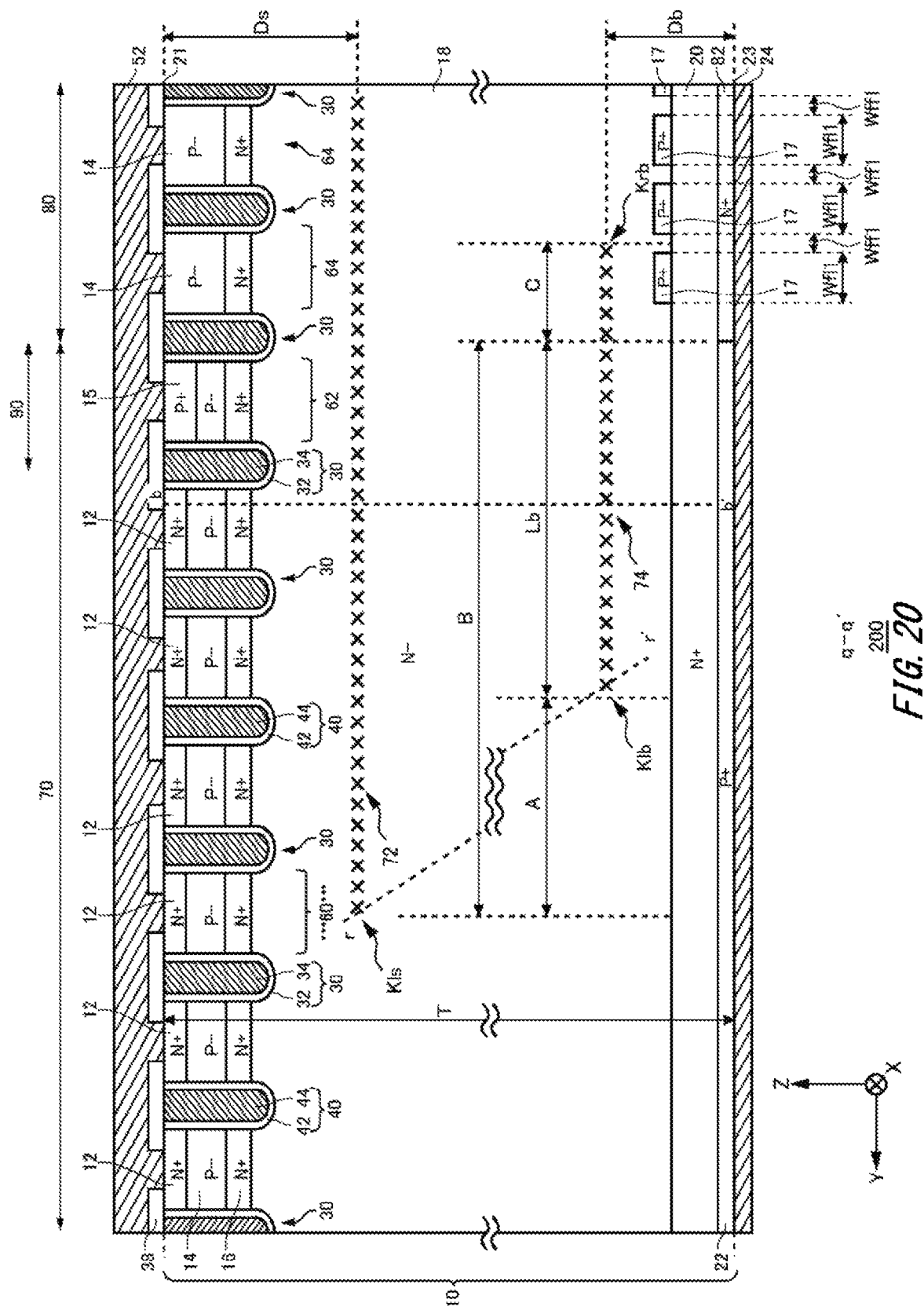
FIG. 20 is a figure illustrating an exemplary cross-section taken along q-q' in FIG. 18.

FIG. 20 is a figure illustrating an exemplary cross-section taken along q-q' in FIG. 18. As illustrated in FIG. 20, the semiconductor device 200 of the present example has floating regions 17 provided on the lower surface 23 side in the diode portion 80. The floating regions 17 may be provided above the buffer region 20. In addition, the floating regions 17 may be provided in contact with the buffer region 20.

The floating regions 17 are electrically floating regions. Being electrically floating means that they are not electrically connected to any one of the collector electrode 24 and the emitter electrode 52.

Multiple rows of floating regions 17 may be provided in the Y-axis direction. In addition, multiple rows of floating regions 17 may be provided on the X-axis positive side relative to the floating regions 17 illustrated in FIG. 20. In the Z-axis direction, the floating regions 17 may be provided on the lower surface 23 side relative to the lower-surface side lifetime control region 74. At least some of the floating regions 17 may overlap the lower-surface side lifetime control region 74 provided at part of the diode portion 80 in the top view. Although FIG. 20 illustrates one example in which the floating region 17 provided at an end of a row of floating regions 17 on the Y-axis positive side overlaps the lower-surface side lifetime control region 74 in the top view, at least part of the floating region 17 may overlap the lower-surface side lifetime control region 74 in the top view.

In the top view, at least one floating region 17 may not overlap the lower-surface side lifetime control region 74 in the Y-axis direction. FIG. 20 illustrates one example in which floating regions 17 excluding the floating region 17 provided at the end of the row of floating regions 17 on the Y-axis positive side do not overlap the lower-surface side lifetime control region 74 in the Y-axis direction.

The distance Ds is the distance from the upper surface 21 to the upper-surface side lifetime control region 72 in the Z-axis direction. The distance Db is the distance from the lower surface 23 to the lower-surface side lifetime control region 74 in the Z-axis direction. Both the distance Ds and distance Db may be smaller than half of the thickness T of the semiconductor substrate 10. The distance Db may be smaller than the distance Ds. The distance Ds may be 10 μm to 30 μm inclusive. The distance Ds is 17 μm, for example. The distance Db may be 5 μm to 20 μm inclusive. The distance Db is 10 μm, for example.

Figure 21:
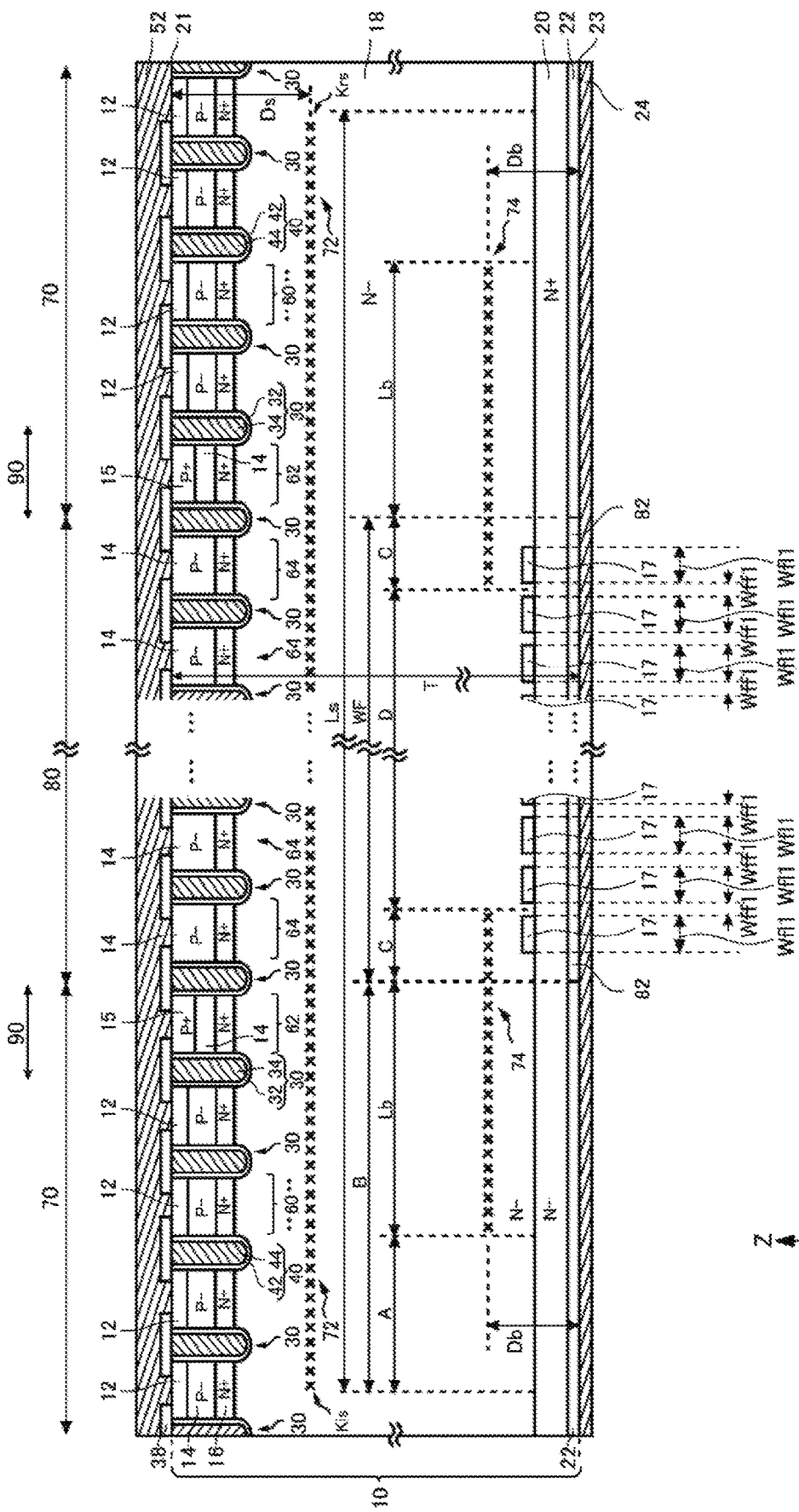
FIG. 21 is a figure illustrating the q-q' cross-sectional view illustrated in FIG. 20, along with a transistor portion 70 adjacent to a diode portion 80 on the Y-axis negative side.

FIG. 21 is a figure illustrating the q-q' cross-sectional view illustrated in FIG. 20, along with a transistor portion 70 adjacent to the diode portion 80 on the Y-axis negative side. The semiconductor device 200 of the present example includes multiple rows of floating regions 17 provided in the diode portion 80 at the intervals Wff1 in the Y-axis direction. The floating region 17 provided at the end of the row of floating regions 17 on the Y-axis positive side may be provided adjacent to the boundary between the diode portion 80 and the transistor portion 70 adjacent to the diode portion 80 on the Y-axis positive side. The floating region 17 provided at an end of the row of floating regions 17 on the Y-axis negative side may be provided adjacent to the boundary between the diode portion 80 and the transistor portion 70 adjacent to the diode portion 80 on the Y-axis negative side.

Since the semiconductor device 200 of the present example has floating regions 17 provided in the diode portion 80, it can suppress electron injection from the cathode region 82. Thus, the semiconductor device 200 of the present example can suppress voltage overshoot of the diode portion 80.

The total sum of the widths Wfl1 of individual floating regions 17 included in the range from the floating region 17 provided at the end of the row of floating regions 17 on the Y-axis positive side to the floating region 17 provided at the end of the row of floating regions 17 on the Y-axis negative side may be smaller than the width WF of the diode portion 80 in the Y-axis direction. That is, the floating regions 17 may cover part of the cathode region 82 above the cathode region 82. In other words, a portion of the cathode region 82 in the Y-axis direction may not be covered by the floating regions 17. Since, in the semiconductor device 200 in the present example, a portion of the cathode region 82 in the Y-axis direction is not covered by the floating regions 17, the diode portion 80 can perform diode operation.

The total sum of the widths Wfl1 of individual floating regions 17 included in the range from the floating region 17 provided at the end of the row of floating regions 17 on the Y-axis positive side to the floating region 17 provided at the end of the row of floating regions 17 on the Y-axis negative side may be 65% to 95% inclusive of the width WF of the diode portion 80 in the Y-axis direction. More preferably, the total sum may be 75% to 85% inclusive of the width WF. Since, in the semiconductor device 200 of the present example, the total sum is 65% to 95% inclusive of the width WF, the diode portion 80 can perform diode operation while voltage overshoot of the diode portion 80 is suppressed.

The distance D is the distance from an end portion, on the Y-axis negative side, of a lower-surface side lifetime control region 74 on the Y-axis positive side to an end portion, on the Y-axis positive side, of a lower-surface side lifetime control region 74 on the Y-axis negative side. That is, the distance D is the width in the Y-axis direction of a region of the diode portion 80 where the lower-surface side lifetime control regions 74 are not provided. The distance D may be larger than the total sum of the widths Wfl1 of individual floating regions 17 included in the range from the floating region 17 provided at the end of the row of floating regions 17 on the Y-axis positive side to the floating region 17 provided at the end of the row of floating regions 17 on the Y-axis negative side.

The distance D may be 95% to 99% inclusive of the width WF of the diode portion 80 in the Y-axis direction. More preferably, the distance D may be 96% to 98% inclusive of the width WF. That is, the region provided with the lower-surface side lifetime control regions 74 may be, in the Y-axis direction, 1% to 5% inclusive of the width WF, and more preferably may be 2% to 4% inclusive of the width WF. Since the semiconductor device 200 of the present example has the floating regions 17 provided in the diode portion 80, the carrier distribution in the depth direction of the semiconductor substrate 10 can be adjusted in the diode portion 80.

In addition, since the semiconductor device 200 of the present example has the lower-surface side lifetime control regions 74 provided in the transistor portions 70, it becomes easier for holes generated in the drift region 18 which are minority carriers to be cancelled out by electrons which are majority carriers with short lifetime. Thus, the semiconductor device 200 of the present example can improve the leakage current characteristics of the transistor portions 70. In addition, the semiconductor device 200 of the present example can achieve a favorable trade-off between ON-voltage and turn-off loss of the transistor portions 70.

Figure 22:
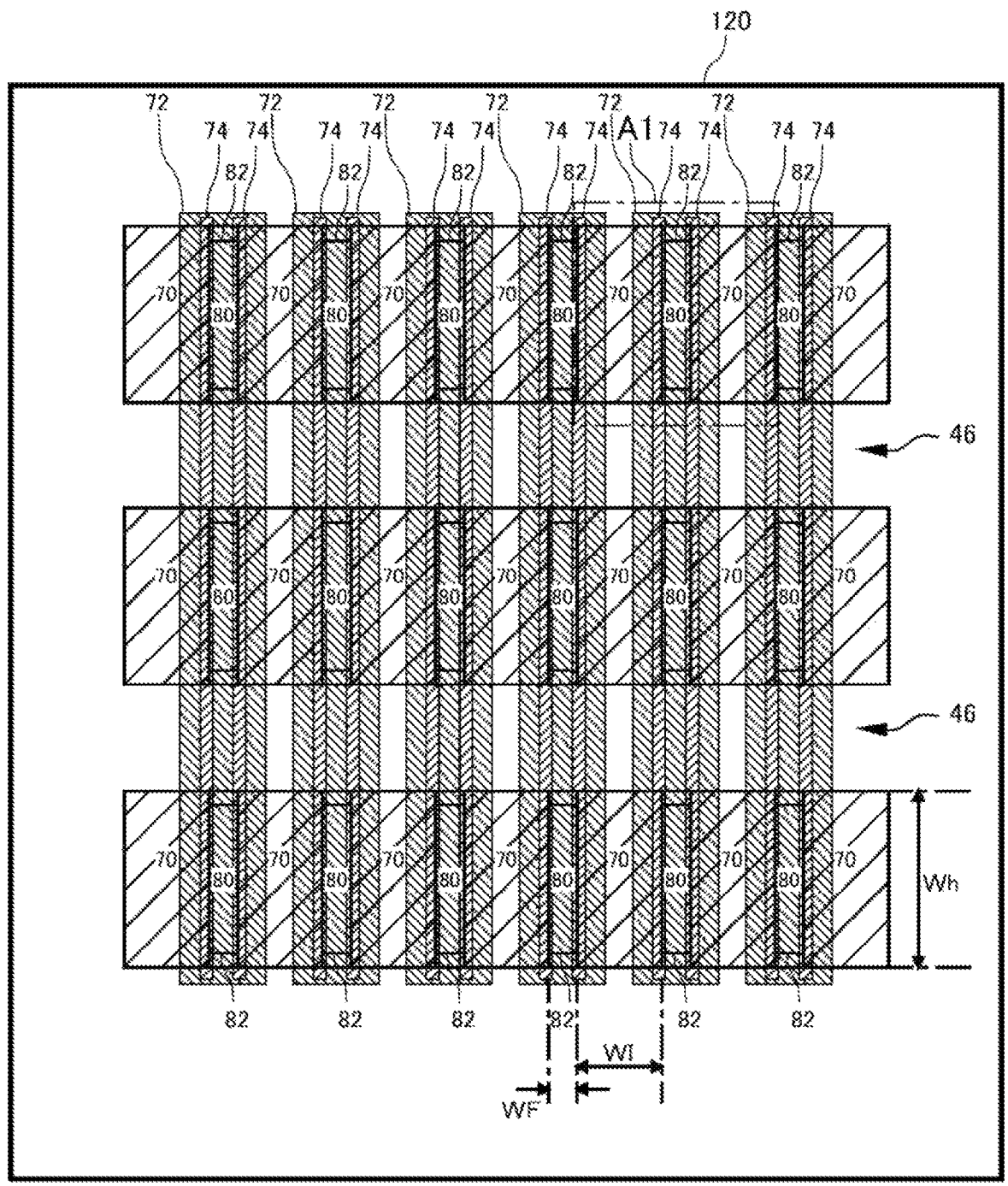
FIG. 22 is a figure illustrating an exemplary upper surface of a semiconductor chip 120 according to the present embodiment.

FIG. 22 is a figure illustrating an exemplary upper surface of a semiconductor chip 120 according to the present embodiment. As illustrated in FIG. 22, the semiconductor chip 120 of the present example may have transistor portions 70 and diode portions 80 that are arrayed alternately at constant intervals in an X-Y plane. FIG. 22 illustrates one example in which three rows and seven rows of transistor portions 70 are provided in the X-axis direction and Y-axis direction, respectively, and three rows and six rows of diode portions 80 are provided in the X-axis direction and Y-axis direction, respectively.

A dividing portion 46 may be provided between (i) transistor portions 70 and diode portions 80 that are at the same position in the X-axis direction, and (ii) other transistor portions 70 and diode portions 80 that are adjacent to the transistor portions 70 and diode portions on the X-axis positive side or negative side. The dividing portion 46 may include a gate runner 48 that supplies a gate voltage to transistor portions 70.

The width WI is the width of a transistor portion 70 in the Y-axis direction. The width WF is the width of a diode portion 80 in the Y-axis direction. As described below, the width Wh is the width from an end portion of a well region 11 on the X-axis positive side to an end portion of the well region 11 on the X-axis negative side. The width is equal to the width of a portion in which a base region 14 is provided on the upper surface 21 side in the semiconductor substrate 10, and a well region 11 is not provided.

A transistor portion 70 includes contact regions 15 and emitter regions 12 that are provided in the region indicated by the width Wh, and are exposed at the upper surface 21. A diode portion 80 includes contact regions 15 and base regions 14 that are provided in the region indicated by the width Wh, and are exposed at the upper surface 21.

There may be an edge termination portion between the peripheral edge of the semiconductor chip 120, and transistor portions 70 and diode portions 80. In addition, between the edge termination portion, and the transistor portions 70 and diode portions 80, there may be gate metal layers 50 and a gate pad portion (not illustrated) where the gate metal layers 50 are gathered, or another predetermined pad portion. In the array direction of transistor portions 70 and diode portions 80 (Y-axis direction), transistor portions 70 may be arranged at both ends on the peripheral side. Those transistor portions 70 may face the edge termination portion.

The semiconductor chip 120 of the present example includes upper-surface side lifetime control regions 72 and lower-surface side lifetime control regions 74. In FIG. 22, ranges where upper-surface side lifetime control regions 72 and lower-surface side lifetime control regions 74 are provided in the top view are indicated as hatched portions. The upper-surface side lifetime control regions 72 and lower-surface side lifetime control regions 74 may be provided crossing dividing portions 46 and continuously in the X-axis direction from the edge termination portion on the X-axis positive side to the edge termination portion on the X-axis negative side.

Each upper-surface side lifetime control region 72 may be provided continuously in the Y-axis direction from a portion, in the Y-axis direction, of a transistor portion 70 adjacent to a diode portion 80 on the Y-axis positive side to a portion, in the Y-axis direction, of a transistor portion 70 adjacent to the diode portion 80 on the Y-axis negative side. That is, each upper-surface side lifetime control region 72 may be provided continuously in the Y-axis direction from a transistor portion 70 adjacent to a diode portion 80 on the Y-axis positive side to a transistor portion 70 adjacent to the diode portion 80 on the Y-axis negative side such that the upper-surface side lifetime control region 72 covers the entire length of the diode portion 80 in the Y-axis direction. A middle portion of each transistor portion 70 in the Y-axis direction may not include an upper-surface side lifetime control region 72.

Each lower-surface side lifetime control region 74 may be provided continuously in the Y-axis direction from a region of a transistor portion 70 adjacent to a diode portion 80 to a region of the diode portion 80 adjacent to the transistor portion 70. That is, each lower-surface side lifetime control region 74 may be provided crossing the boundary between a transistor portion 70 and a diode portion 80 and continuously in the Y-axis direction from the transistor portion 70 to the diode portion 80.

A middle portion of each diode portion 80 in the Y-axis direction may not include a lower-surface side lifetime killer. A lower-surface side lifetime control region 74 provided in a region that overlaps the boundary between a diode portion 80 and a transistor portion 70 adjacent to the diode portion 80 on the Y-axis positive side in the top view, and a lower-surface side lifetime control region 74 provided in a region that overlaps the boundary between the diode portion 80 and a transistor portion 70 adjacent to the diode portion 80 on the Y-axis negative side in the top view may be different lower-surface side lifetime control regions 74.

Figure 23:
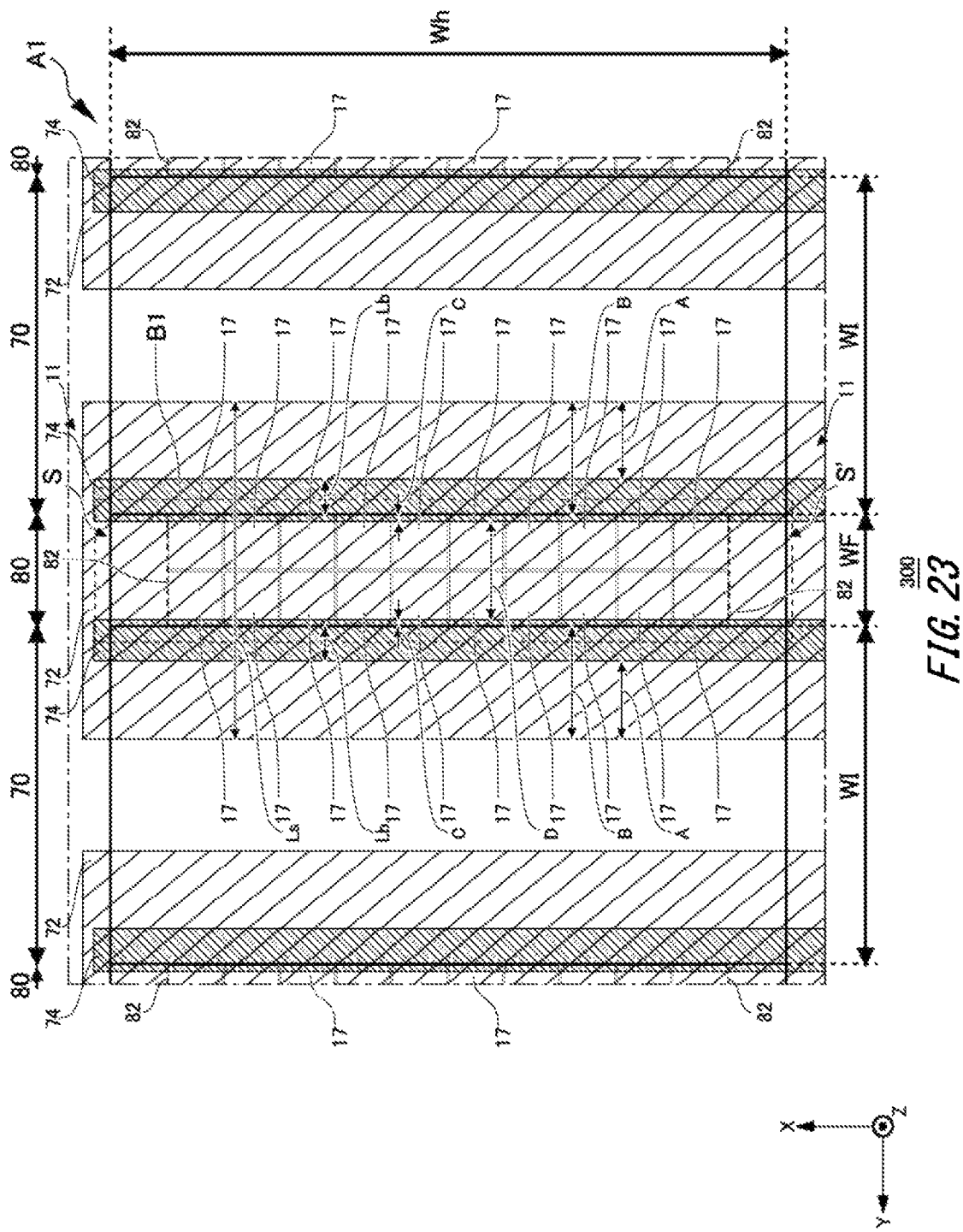
FIG. 23 is an enlarged view of a region A1 in FIG. 22.

FIG. 23 is an enlarged view of a region A1 in FIG. 22. FIG. 23 is a figure illustrating the configuration of a cathode region 82 and floating regions 17 in a diode portion 80. In FIG. 23, illustration of configurations other than the cathode region 82 and floating regions 17, such as gate trench portions 40 and dummy trench portions 30 provided in the diode portion 80, and transistor portions 70, is omitted.

A semiconductor device 300 of the present example includes ten rows and two rows of floating regions 17 in the X-axis direction and Y-axis direction, respectively, in the diode portion 80, and on the inner side in the cathode region 82 in an X-Y plane. In addition, the semiconductor device 300 of the present example has an end portion S of a p+ type well region 11 provided on the X-axis positive side in the diode portion 80 and transistor portions 70. In addition, the semiconductor device 300 of the present example has an end portion S' of a p+ type well region 11 provided on the X-axis negative side in the diode portion 80 and transistor portions 70. In the present example, well regions 11 are provided on the outer side in the region where the transistor portions 70 and diode portion 80 are arranged alternately. In other words, in the present example, well regions 11 are not provided in an inner region of the transistor portions 70 and diode portion 80 relative to the end portion S.

The positional relationship between the cathode region 82 and configurations other than the cathode region 82, such as contact holes 54, dummy trench portions 30, or contact regions 15 provided at end portions of the contact holes 54 in the X-axis direction may be the same as the positional relationship in the top views illustrated in FIG. 1 and FIG. 18.

The semiconductor device 300 of the present example includes transistor portions 70 that are provided on both the Y-axis positive side and Y-axis negative side relative to a diode portion 80, and adjacent to the diode portion 80. The width WI of a transistor portion 70 in the Y-axis direction may be larger than the width WF of the diode portion 80 in the Y-axis direction. The width WI may be 200% to 500% inclusive of the width WF. The width WI may be 1200 μm to 2000 µm inclusive. The width WI is 1500 µm, for example. The width WF may be 400 µm to 600 µm inclusive. The width WF is 500 µm, for example.

In addition, the width Wh from the end portion S of the well region 11 on the X-axis positive side to the end portion S' of the well region 11 on the X-axis negative side may be larger than the width WI. The width Wh may be 150% to 300% inclusive of the width WI. The width Wh may be 3000 µm to 3600 µm inclusive. The width Wh is 3100 µm, for example.

The width Wh may be larger than the sum of the width WI and the width WF. Since the width Wh is larger than the sum of the width WI and the width WF, the semiconductor device 300 of the present example can suppress snapback when the transistor portions 70 are turned on, or the diode portion 80 becomes conductive. Snapback is a phenomenon in which a voltage between the collector electrode 24 and emitter electrode 52 suddenly lowers in response to an increase of current flowing between the collector electrode 24 and the emitter electrode 52.

The semiconductor device 300 of the present example includes upper-surface side lifetime control regions 72 each provided continuously in the Y-axis direction from a portion, in the Y-axis direction, of a transistor portion 70 adjacent to a diode portion 80 on the Y-axis positive side to a portion, in the Y-axis direction, of a transistor portion 70 adjacent to the diode portion 80 on the Y-axis negative side. Each upper-surface side lifetime control region 72 may be provided continuously in the X-axis direction from the well region 11 provided on the X-axis positive side in transistor portions 70 and diode portions 80 to the well region 11 provided on the X-axis negative side in the transistor portions 70 and diode portions 80. In FIG. 23, regions provided with the upper-surface side lifetime control regions are illustrated as hatched portions. The upper-surface side lifetime control regions 72 may not be provided in portions of the transistor portions 70 in the Y-axis direction.

The length Ls is the length of an upper-surface side lifetime control region 72 in the Y-axis direction. The distance B is the distance from the boundary between a diode portion 80 and a transistor portion 70 adjacent to the diode portion 80 on the Y-axis positive side to an end of an upper-surface side lifetime control region 72 on the Y-axis positive side. In addition, the distance B is the distance from the boundary between a diode portion 80 and a transistor portion 70 adjacent to the diode portion 80 on the Y-axis negative side to an end of an upper-surface side lifetime control region 72 on the Y-axis negative side.

The semiconductor device 300 of the present example includes lower-surface side lifetime control regions 74 each provided continuously in the Y-axis direction from a region of a transistor portion 70 adjacent to a diode portion 80 to a region of the diode portion 80 adjacent to the transistor portion 70. That is, in the present example, each lower-surface side lifetime control region 74 is provided crossing the boundary between a transistor portion 70 and a diode portion 80 and continuously in the Y-axis direction from the transistor portion 70 to the diode portion 80. The length Lb is the length of a lower-surface side lifetime control region 74 in the Y-axis direction.

The semiconductor device 300 of the present example does not include a lower-surface side lifetime killer at a middle portion of the diode portion 80 in the Y-axis direction. In addition, in the present example, in the top view of the semiconductor substrate 10, a lower-surface side lifetime control region 74 provided in a region that overlaps the boundary between a diode portion 80 and a transistor portion 70 adjacent to the diode portion 80 on the Y-axis positive side, and a lower-surface side lifetime control region 74 provided in a region that overlaps the boundary between the diode portion 80 and a transistor portion 70 adjacent to the diode portion 80 on the Y-axis negative side are different lower-surface side lifetime control regions 74.

In the top view, each lower-surface side lifetime control region 74 may be provided to overlap a portion, in the Y-axis direction, of a floating region 17, which portion is closer to the boundary between a transistor portion 70 and the diode portion 80. The distance C is the distance from the boundary between a diode portion 80 and a transistor portion 70 adjacent to the diode portion 80 on the Y-axis positive side to an end of a lower-surface side lifetime control region 74 on the Y-axis negative side. In addition, the distance C is the distance from the boundary between a diode portion 80 and a transistor portion 70 adjacent to the diode portion 80 on the Y-axis negative side to an end of a lower-surface side lifetime control region 74 on the Y-axis positive side.

The distance D is the distance in the Y-axis direction from an end, on the Y-axis negative side, of a lower-surface side lifetime control region 74 on the Y-axis positive side to an end, on the Y-axis positive side, of a lower-surface side lifetime control region 74 on the Y-axis negative side. The distance A is the distance in the Y-axis direction from an end, on the Y-axis positive side, of a lower-surface side lifetime control region 74 on the Y-axis positive side to an end, on the Y-axis positive side, of an upper-surface side lifetime control region 72.

The distance A may be smaller than the distance B. That is, in a transistor portion 70, a lower-surface side lifetime control region 74 may be arranged on the diode portion 80 side relative to an upper-surface side lifetime control region 72. Since the distance A is smaller than the distance B, the semiconductor device 300 of the present example can suppress hole injection from emitter regions 12 of the transistor portions 70 to the cathode region 82 of the diode portion 80 at the time of operation of the diode portion 80. Thus, the semiconductor device 300 of the present example can improve the reverse recovery characteristics of the diode portion 80. Note that the distance A may be 25% to 50% inclusive of the distance B. In addition, the distance A may be 50 µm to 100 µm inclusive.

The length Lb may be longer than the distance C. That is, a lower-surface side lifetime control region 74 provided on a transistor portion 70 side relative to the boundary between the transistor portion 70 and the diode portion 80 may be longer in the Y-axis direction than a lower-surface side lifetime control region 74 provided on the diode portion 80 side relative to the boundary. Since the length Lb is longer than the distance C, the semiconductor device 300 of the present example can suppress hole injection from emitter regions 12 of the transistor portions 70 to the cathode region 82 of the diode portion 80 at the time of operation of the diode portion 80. Thus, the semiconductor device 300 of the present example can improve the reverse recovery characteristics of the diode portion 80.

Figure 24:
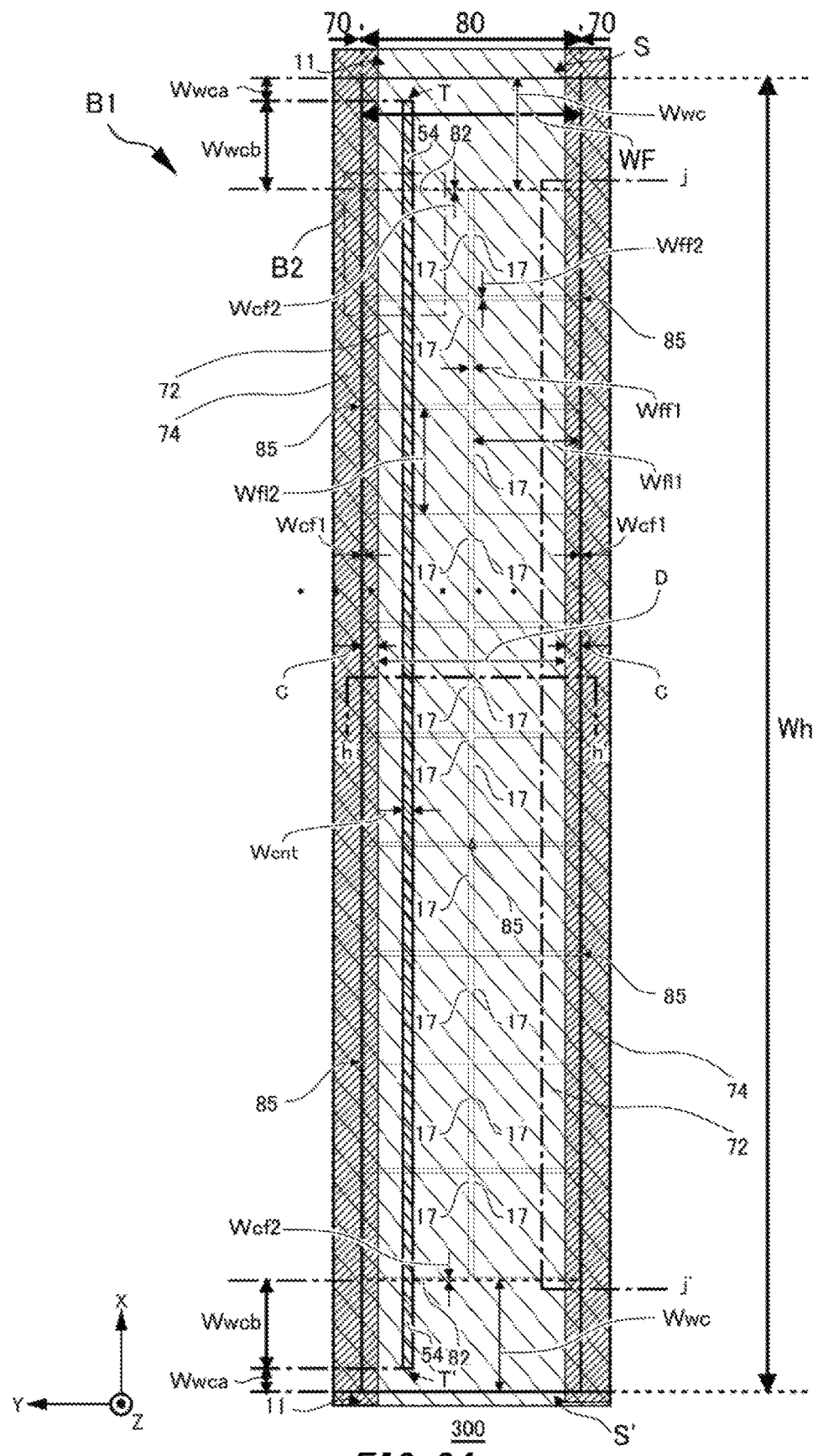
FIG. 24 is an enlarged view of a region B1 in FIG. 23.

FIG. 24 is an enlarged view of a region B1 in FIG. 23. FIG. 24 illustrates an enlarged view of a region from the end S of the well region 11 on the X-axis positive side in the diode portion 80 to the end S' of the well region 11 on the X-axis negative side in the diode portion 80 in FIG. 23. The semiconductor device 300 of the present example includes ten rows and two rows of floating regions 17 in the X-axis direction and Y-axis direction, respectively, in the diode portion 80, and on the inner side in the cathode region 82 in an X-Y plane.

The width Wwc is the width in the X-axis direction from the end portion S of the well region 11 on the X-axis positive side to an end of the cathode region 82 on the X-axis positive side. In addition, the width Wwc is the width in the X-axis direction from the end portion S' of the well region 11 on the X-axis negative side to an end of the cathode region 82 on the X-axis negative side.

The width Wwc may be smaller than the width WF of the diode portion 80. The width Wwc may be 25% to 75% inclusive of the width WF. The width Wwc may be 150 µm to 300 µm inclusive. The width Wwc is 250 µm, for example.

A plurality of contact holes 54 are provided next to each other in the Y-axis direction. Although one contact hole 54 is illustrated in FIG. 24, as is apparent from the top views illustrated in FIG. 1 and FIG. 18, a plurality of contact holes 54 are actually provided in the Y-axis direction, the contact holes 54 having end portions T in the X-axis direction that match an end portion T of the illustrated contact hole 54, and having end portions T' in the X-axis direction that match an end portion T' of the illustrated contact hole 54.

The width Wwca is the width in the X-axis direction between the end portion S of the well region 11 on the X-axis positive side, and the end portion T of the contact hole 54 on the X-axis positive side. In addition, the width Wwca is the width in the X-axis direction between the end portion S' of the well region 11 on the X-axis negative side, and the end portion T' of the contact hole 54 on the X-axis negative side.

In the present example, the end portion T of the contact hole 54 on the X-axis positive side is provided apart from the end portion S of the well region 11 on the X-axis positive side toward the X-axis negative side by the width Wwca. In addition, the end portion T' of the contact hole 54 on the X-axis negative side is provided apart from the end portion S' of the well region 11 on the X-axis negative side toward the X-axis positive side by the width Wwca. The contact hole 54 may be provided continuously in the X-axis direction from the end portion T to the end portion T'.

The width Wwcb is the width in the X-axis direction between the end portion T of the contact hole 54 and an end of the cathode region 82 on the X-axis positive side. In addition, the width Wwcb is the width in the X-axis direction between the end portion T' of the contact hole 54 and an end of the cathode region 82 on the X-axis negative side.

The width Wwca may be smaller than the width Wwcb. The width Wwca may be 10% to 90% inclusive of the width Wwcb. The width Wwca may be 20 µm to 110 µm inclusive. The width Wwcb may be 120 µm to 180 µm inclusive. The width Wwca is 100 µm, for example. The width Wwcb is 150 µm, for example. The sum of the width Wwca and the width Wwcb equals the width Wwc.

In the present example, floating regions 17 are provided on the inner side in the cathode region 82 in an X-Y plane. The floating regions 17 are electrically connected to none of the collector electrode 24 and emitter electrode 52.

In the present example, the floating regions 17 are provided in a grid in an X-Y plane. Being provided in a grid means that the floating regions 17 are arrayed at constant intervals in both the X-axis direction and the Y-axis direction. In the present example, two rows and ten rows of the floating regions 17 are provided in the Y-axis direction and the X-axis direction, respectively.

Each opening region 85 is a region between, in the X-axis direction, two floating regions 17 that are provided adjacent to each other in the X-axis direction. In addition, each opening region 85 is a region between, in the Y-axis direction, two floating regions 17 that are provided adjacent to each other in the Y-axis direction. In the present example, ten rows of floating regions 17 are provided sandwiching opening regions 85 from the X-axis negative side in the cathode region 82 to the X-axis positive side in the cathode region 82.

The width Wff2 is the width of an opening region 85 in the X-axis direction. The width Wff2 is smaller than the width Wfl2 of a floating region 17 in the X-axis direction. The width Wff2 may be smaller than the width WF of the diode portion 80. The width Wff2 may be 1% to 5% inclusive of the width WF. The width Wff2 may be 6 µm to 20 µm inclusive. The width Wff2 is 10 µm, for example.

The width Wfl2 of a floating region 17 in the X-axis direction may be smaller than the width WF of the diode portion 80. The width Wfl2 may be 25% to 75% inclusive of the width WF. The width Wfl2 may be 150 µm to 300 µm inclusive. The width Wfl2 is 240 µm, for example.

The width Wfl1 of a floating region 17 in the Y-axis direction may be smaller than the width WF of the diode portion 80. The width Wfl1 may be 25% to 75% inclusive of the width WF. The width Wfl1 may be 150 µm to 300 µm inclusive. The width Wfl1 may be equal to or different from the width Wfl2. The width Wfl1 is 240 µm, for example.

The width Wcf2 is the width in the X-axis direction between an end of the cathode region 82 on the X-axis positive side and an end, on the X-axis positive side, of a floating region 17 arranged at an end of a row of floating regions 17 on the X-axis positive side. The width Wcf2 may be smaller than the width Wff2. The width Wcf2 may be 10% to 90% inclusive of the width Wff2. The width Wcf2 may have any value as long as it is not zero. The width Wcf2 may be 2 µm to 6 µm inclusive. The width Wcf2 is 5 µm, for example. Note that a width in the X-axis direction between an end of the cathode region 82 on the X-axis negative side and an end, on the X-axis negative side, of a floating region 17 arranged at an end of the row of floating regions 17 on the X-axis negative side may be equal to the width Wcf2.

The semiconductor device 300 of the present example includes two rows of floating regions 17 provided to sandwich an opening region 85 in the Y-axis direction. Here, the width Wff1 is the width of the opening region 85 in the Y-axis direction. The width Wff1 may be smaller than the width Wfl1. The width Wff1 may be smaller than the width WF of the diode portion 80. The width Wff1 may be 1% to 5% inclusive of the width WF of the diode portion 80. The width Wff1 may be 6 µm to 20 µm inclusive. The width Wff1 may be equal to or different from the width Wff2. The width Wff1 is 10 µm, for example.

The total of the areas, in an X-Y plane, of a plurality of floating regions 17 arranged on the inner side in the cathode region 82 may be smaller than the area of the cathode region 82 in the X-Y plane. The total of the areas of the plurality of floating regions 17 in the X-Y plane may be 50% to 99% inclusive of the area of the cathode region 82 in the X-Y plane. For example, if Wh is 3100 µm, Wwc is 250 µm, Wfl2 and Wfl1 are 240 µm, Wcf2 and Wcf1 are 5 µm, and Wff2 and Wff1 are 10 µm, the total of the areas of the plurality of floating regions 17 occupies 88.6% of the area of the cathode region 82 in the X-Y plane. That is, a portion of the cathode region 82 may not be covered by the floating regions 17. Since, in the semiconductor device 300 of the present example, a portion of the cathode region 82 is not covered by the floating regions 17, the diode portion 80 can perform diode operation.

The width Wcf1 is the width from an end of the cathode region 82 on the Y-axis positive side to an end, on the Y-axis positive side, of a floating region 17 on the Y-axis positive side. In addition, the width Wcf1 is the width from an end of the cathode region 82 on the Y-axis negative side to an end, on the Y-axis negative side, of a floating region 17 on the Y-axis negative side.

The width Wcf1 may be smaller than the width WF of the diode portion 80. The width Wcf1 may be 1% to 5% inclusive of the width WF. The width Wcf1 may have any value as long as it is not zero. In addition, the width Wcf1 may be equal to or different from the width Wcf2. The width Wcf1 may be 2 μm to 6 μm inclusive. The width Wcf1 is 5 μm, for example.

The width Wcnt is the width of a contact hole 54 in the array direction (Y-axis direction). The width Wcnt may be smaller than Wff2. In the present example, the width Wcnt may be smaller than Wff1. In the present example, the width Wcnt may be smaller than Wcf2. In the present example, the width Wcnt may be smaller than Wcf1. The width Wcnt may be 0.3 μm to 0.7 μm inclusive. The width Wcnt is 0.5 μm, for example.

In the present example, an upper-surface side lifetime control region 72 extends over the entire region B1 in the top view. In the present example, each lower-surface side lifetime control region 74 is provided continuously from the X-axis positive side in a region B in the X-axis direction to the X-axis negative side in the region B. In the present example, a lower-surface side lifetime control region 74 is provided in each of a region overlapping the boundary between the diode portion 80 and a transistor portion 70 adjacent to the diode portion 80 on the Y-axis positive side in the top view, and a region overlapping the boundary between the diode portion 80 and a transistor portion 70 adjacent to the diode portion 80 on the Y-axis negative side in the top view. In the present example, a middle portion of the diode portion 80 in the Y-axis direction is not provided with a lower-surface side lifetime control region 74.

The distance C is the distance from the boundary between a diode portion 80 and a transistor portion 70 adjacent to the diode portion 80 on the Y-axis positive side to an end of a lower-surface side lifetime control region 74 on the Y-axis negative side. In addition, the distance C is the distance from the boundary between a diode portion 80 and a transistor portion 70 adjacent to the diode portion 80 on the Y-axis negative side to an end of a lower-surface side lifetime control region 74 on the Y-axis positive side. The distance D is the distance in the Y-axis direction from an end, on the Y-axis negative side, of a lower-surface side lifetime control region 74 on the Y-axis positive side to an end, on the Y-axis positive side, of a lower-surface side lifetime control region 74 on the Y-axis negative side. That is, the distance D is the width in the Y-axis direction of a region where the lower-surface side lifetime control regions 74 are not provided.

Figure 25:
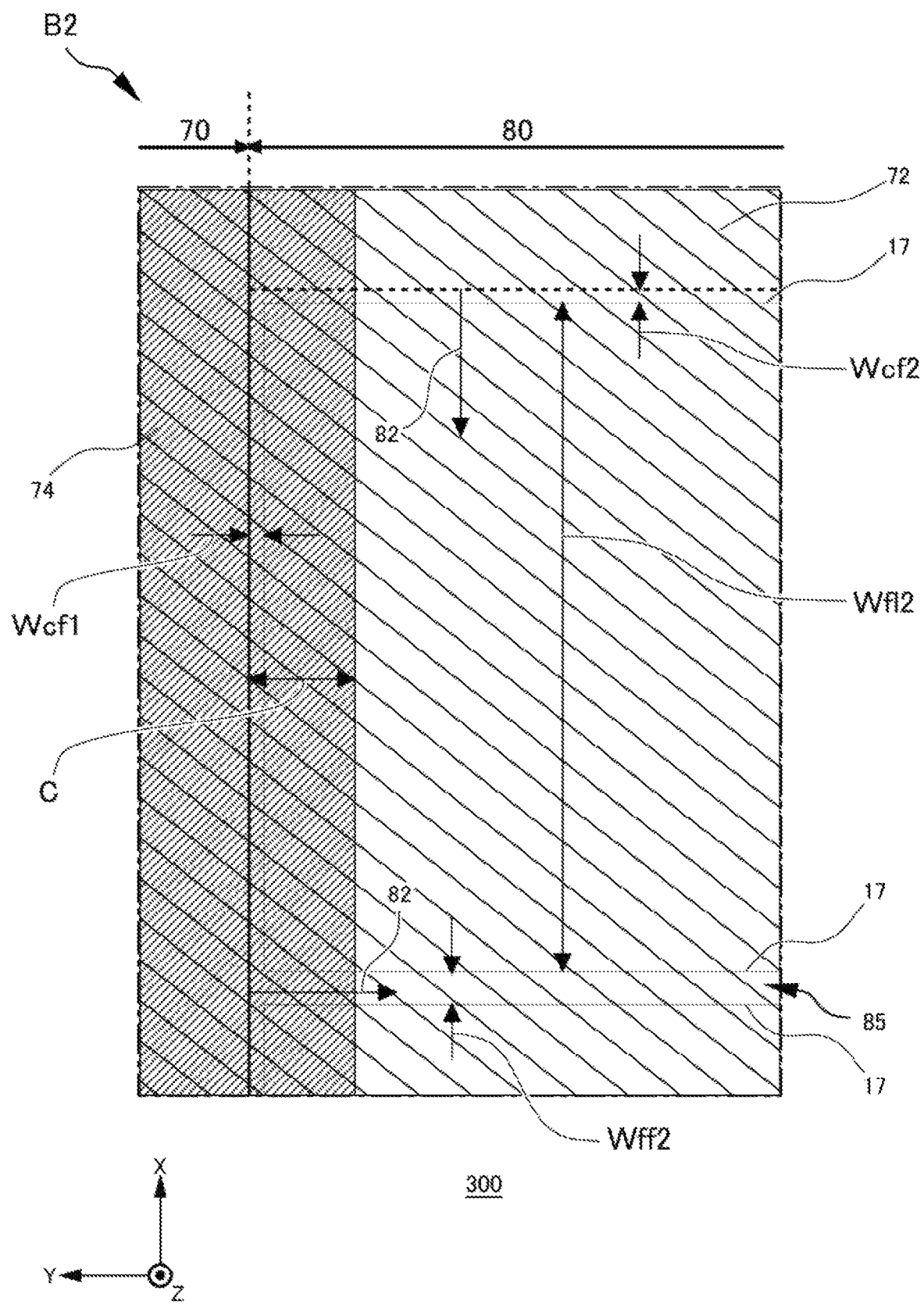
FIG. 25 is an enlarged view of a region B2 in FIG. 24.

FIG. 25 is an enlarged view of a region B2 in FIG. 24. In the present example, the width Wcf2 is the width in the X-axis direction between an end of the cathode region 82 on the X-axis positive side and an end, on the X-axis positive side, of a floating region 17 arranged at an end of a row of floating regions 17 on the X-axis positive side. In addition, the width Wcf1 is the width in the Y-axis direction between an end of the cathode region 82 on the Y-axis positive side and an end, on the Y-axis positive side, of a floating region 17 on the Y-axis positive side. The width Wcf1 is 5 μm, for example.

The width Wff2 is the width of an opening region 85 in the X-axis direction. The width Wfl2 is the width of a floating region 17 in the X-axis direction. The width Wcf2 may be smaller than the width Wfl2. Since the width Wcf2 is smaller than the width Wfl2, the semiconductor device 300 of the present example can suppress electron injection from the cathode region 82 at end portions of the diode portion 80. The distance C is the distance in the Y-axis direction between the boundary between a diode portion 80 and a transistor portion 70 adjacent to the diode portion 80 on the Y-axis positive side and an end of a lower-surface side lifetime control region 74 on the Y-axis negative side.

Figure 26:
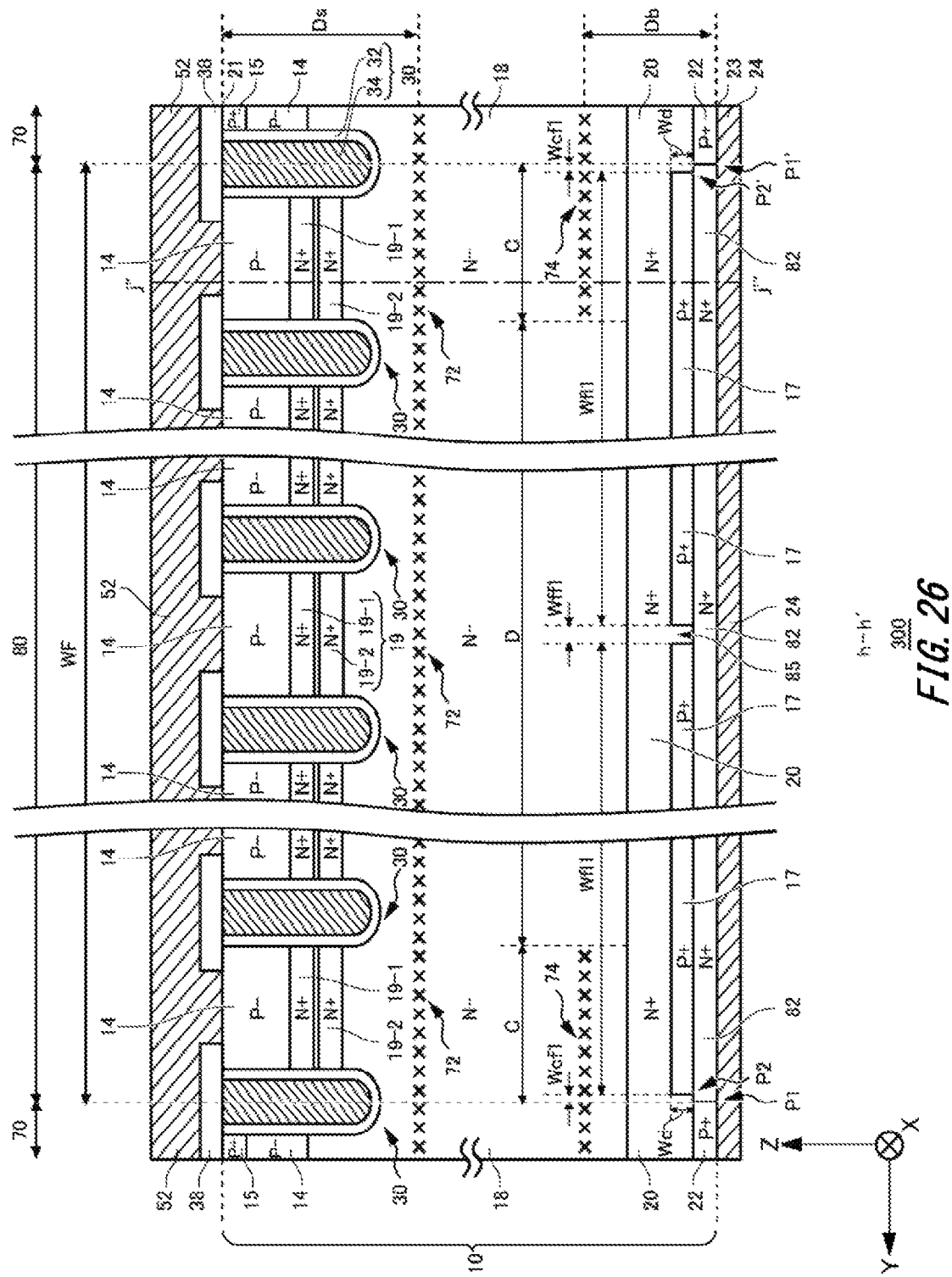
FIG. 26 is a figure illustrating an exemplary cross-section taken along h-h' in FIG. 24.

FIG. 26 is a figure illustrating an exemplary cross-section taken along h-h' in FIG. 24. The diode portion 80 may include a first-conductivity type high-concentration region 19 provided below a base region 14 provided at the upper surface 21. The high-concentration region 19 of the present example is of N+ type, for example. The diode portion 80 may not include the high-concentration region 19.

A plurality of high-concentration regions 19 may be provided in the Z-axis direction. In the present example, two high-concentration regions 19, that is, a high-concentration region 19-1 and a high-concentration region 19-2, are provided. In the Z-axis direction, an N type region is provided between the high-concentration region 19-1 and the high-concentration region 19-2. The doping concentration in the N type region may be lower than those in the high-concentration region 19-1 and the high-concentration region 19-2. The doping concentration in the N type region may be equal to the doping concentration of the drift region 18 or may be higher than the doping concentration of the drift region 18.

The high-concentration regions 19 have reduced hole concentrations as compared to the drift region 18 due to charge neutralized conditions. That is, the high-concentration regions 19 suppress hole injection from the base region 14 to the drift region 18. Thus, the semiconductor device 300 of the present example can significantly lower the efficiency of minority carrier injection from the base region 14 to the drift region 18.

The larger the number of high-concentration regions 19 is, the higher the effect of lowering the minority carrier injection efficiency is. Thus, the larger the number of high-concentration regions 19 is, the higher the effect of lowering the reverse recovery characteristics, in particular, recovery current characteristics, of the diode portion 80 is.

The semiconductor device 300 of the present example has, in the diode portion 80, floating regions 17 provided in the buffer region 20 provided above the cathode region 82. In the present example, two floating regions 17 are provided in the Y-axis direction in the h-h' cross-section.

In the present example, there are two boundary positions between collector regions 22 and the cathode region 82 in a plane parallel to the lower surface 23 of the semiconductor substrate 10. The boundary position P1 is a boundary position on the Y-axis positive side. In addition, the boundary position P1' is a boundary position on the Y-axis negative side. The boundary positions P1 and P1' are boundary positions in a cross-section parallel to the h-h' cross-section. In the present example, the h-h' cross-section is perpendicular to the lower surface 23, and moreover is parallel to the array direction of dummy trench portions 30.

In the present example, there are two end portion positions of the floating regions 17 in a plane parallel to the lower surface 23. The end portion position P2 is a position, in the Y-axis direction, of an end portion of the floating region 17 arranged on the Y-axis positive side, the end portion being closest to the boundary position P1. In addition, the end portion position P2' is a position, in the Y-axis direction, of an end portion of the floating region 17 arranged on the Y-axis negative side, the end portion being closest to the boundary position P1'. A plurality of floating regions 17 may be provided in a range in the Y-axis direction from the end portion position P2 to the end portion position P2'. In the present example, two floating regions 17 are provided in the range in the Y-axis direction from the end portion position P2 to the end portion position P2'.

In addition, in the present example, there is an opening region 85 not provided with floating regions 17 at a depth position in the Z-axis direction substantially identical to the floating regions 17. The opening region 85 may mean a region sandwiched by two floating regions 17 that are adjacent to each other in the Y-axis direction. For example, the opening region 85 is an N+ type region. The doping concentration of the opening region 85 may be substantially identical to the doping concentration of the drift region 18 or buffer region 20. The opening region 85 may be a portion of the drift region 18 or buffer region 20 where floating regions 17 are not formed, which portion is left free of them.

The width Wcf1 is the width from the end portion position P1 to the end portion position P2. In addition, the width Wcf1 is the width from the end portion position P1' to the end portion position P2'. The width Wff1 is the interval in the Y-axis direction between two floating regions 17 that are adjacent to each other sandwiching the opening region 85. The width Wcf1 may be smaller than the width Wff1. The width Wcf1 may be equal to or smaller than half of the width Wff1, and may be equal to or smaller than ¼ of the width Wff1. The width Wcf1 may have any value as long as it is not zero. Since the width Wcf1 is small, the semiconductor device 300 of the present example can suppress electron injection from the cathode region 82 at end portions of the diode portion 80.

The width Wd is the width of a floating region 17 in the Z-axis direction. The width Wd may be smaller than the width Wcf1. The width Wd may be 5% to 50% inclusive of the width Wcf1. The width Wd may be 0.3 μm to 1 μm inclusive. The width Wd is 0.5 μm, for example.

The semiconductor device 300 of the present example includes an upper-surface side lifetime control region 72 provided on the upper surface 21 side. In addition, it includes lower-surface side lifetime control regions 74 provided on the lower surface 23 side. The peak lifetime killer concentration in the upper-surface side lifetime control region 72 is positioned apart from the upper surface 21 by a distance Ds toward the Z-axis negative side. The peak lifetime killer concentration in the lower-surface side lifetime control regions 74 is positioned apart from the lower surface 23 by a distance Db toward the Z-axis positive side. Both the distance Ds and distance Db may be smaller than half of the thickness T of the semiconductor substrate 10. The distance Db may be smaller than the distance Ds. The distance Ds may be 10 μm to 30 μm inclusive. The distance Ds is 17 μm, for example. The distance Db may be 5 μm to 20 μm inclusive. The distance Db is 10 μm, for example.

In the present example, the upper-surface side lifetime control region 72 extends over the entire length of the h-h' cross-section in the Y-axis direction. That is, in the present example, the upper-surface side lifetime control region 72 is provided continuously in the Y-axis direction from a transistor portion 70 adjacent to the diode portion 80 on the Y-axis positive side through the diode portion 80 to a transistor portion 70 adjacent to the diode portion 80 on the Y-axis negative side.

The distance C is the distance in the Y-axis direction from the boundary between a diode portion 80 and a transistor portion 70 adjacent to the diode portion 80 on the Y-axis positive side to an end of a lower-surface side lifetime control region 74 on the Y-axis negative side. In addition, the distance C is the distance in the Y-axis direction from the boundary between a diode portion 80 and a transistor portion 70 adjacent to the diode portion 80 on the Y-axis negative side to an end of a lower-surface side lifetime control region 74 on the Y-axis positive side. The distance D is the distance in the Y-axis direction between an end, on the Y-axis negative side, of a lower-surface side lifetime control region 74 on the Y-axis positive side and an end, on the Y-axis positive side, of a lower-surface side lifetime control region 74 on the Y-axis negative side. That is, the distance D is the width in the Y-axis direction of a region where the lower-surface side lifetime control regions 74 are not provided.

The distance D may be 95% to 99% inclusive of the width WF. More preferably, the distance D may be 98% of the width WF. That is, the region provided with the lower-surface side lifetime control regions 74 may be, in the Y-axis direction, 1% to 5% inclusive of the width WF, and more preferably may be 2% to 4% inclusive of the width WF. Since the semiconductor device 300 of the present example has the floating regions 17 provided in the diode portion 80, the carrier distribution in the depth direction of the semiconductor substrate 10 can be adjusted in the diode portion 80.

In addition, since the semiconductor device 300 of the present example has the lower-surface side lifetime control regions 74 provided in the transistor portions 70, it becomes easier for holes generated in the drift region 18 which are minority carriers to be cancelled out by electrons which are majority carriers with short lifetime. Thus, the semiconductor device 300 of the present example can improve the leakage current characteristics of the transistor portions 70. In addition, the semiconductor device 300 of the present example can achieve a favorable trade-off between ON-voltage and turn-off loss of the transistor portions 70.

Figure 27:
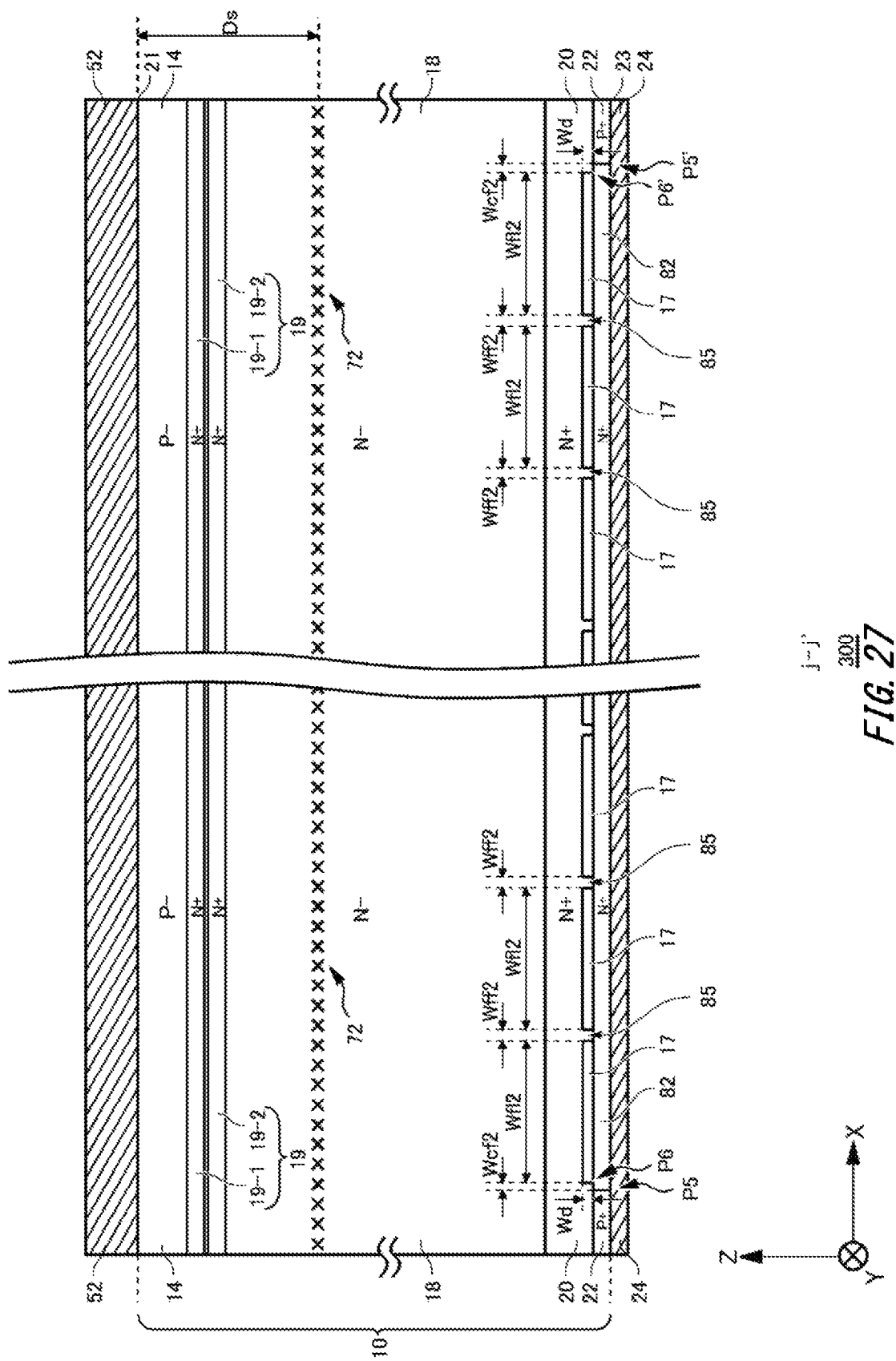
FIG. 27 is a figure illustrating an exemplary cross-section taken along j-j' in FIG. 24.

FIG. 27 is a figure illustrating an exemplary cross-section taken along j-j' in FIG. 24. The j-j' cross-section is an X-Z plane passing through a line J''-J''' in FIG. 26. The semiconductor device 300 of the present example has, in the diode portion 80, floating regions 17 provided in the buffer region 20 provided above the cathode region 82.

In the j-j' cross-section, the semiconductor device 300 of the present example has an upper-surface side lifetime control region 72 provided on the upper surface 21 side. In the j-j' cross-section, a lower-surface side lifetime control region 74 is not provided on the lower surface 23 side.

In the present example, there are two boundary positions between collector regions 22 and the cathode region 82 in a plane parallel to the lower surface 23 of the semiconductor substrate 10. The boundary position P5 is a position, in the X-axis direction, of a boundary on the X-axis negative side. In addition, the boundary position P5' is a position, in the X-axis direction, of a boundary on the X-axis positive side. The boundary positions P5 and P5' are boundary positions in a cross-section parallel to the j-j' cross-section. In the present example, the j-j' cross-section is perpendicular to the lower surface 23, and moreover is parallel to the direction of extension of dummy trench portions 30.

In the present example, there are two end portion positions of the floating regions 17 in a plane parallel to the lower surface 23. The end portion position P6 is a position, in the X-axis direction, of an end portion of the floating region 17 arranged at an end of a row of floating regions 17 on the X-axis negative side, the end portion being closest to the boundary position P5. In addition, the end portion position P6' is a position, in the X-axis direction, of an end portion of the floating region 17 arranged at an end of the row of floating regions 17 on the X-axis positive side, the end portion being closest to the boundary position P5'.

In addition, in the present example, there are opening regions 85 not provided with floating regions 17 at a depth position in the Z-axis direction substantially identical to the floating regions 17. Each opening region 85 may mean regions sandwiched by two floating regions 17 that are adjacent to each other in the X-axis direction. For example, the opening regions 85 are N+ type regions. The doping concentration of the opening regions 85 may be substantially identical to the doping concentration of the drift region 18 or buffer region 20. The opening region 85 may be a portion of the drift region 18 or buffer region 20 where floating regions 17 are not formed, which portion is left free of them.

The width Wfl2 is the width of a floating region 17 in the X-axis direction. The width Wcf2 is the width between the boundary position P5 and the end portion position P6 in the X-axis direction. In addition, the width Wcf2 is the width between the boundary position P5' and the end portion position P6' in the X-axis direction. In addition, the width Wff2 is the interval in the X-axis direction between two floating regions 17 that are adjacent to each other sandwiching an opening region 85. The width Wcf2 may be smaller than the width Wff2. Since the floating regions 17 are provided in a grid in an X-Y plane in the diode portion 80, the semiconductor device 300 of the present example can suppress voltage overshoot (overshoot voltage) at the time of reverse recovery of the diode portion 80.

Figure 28:
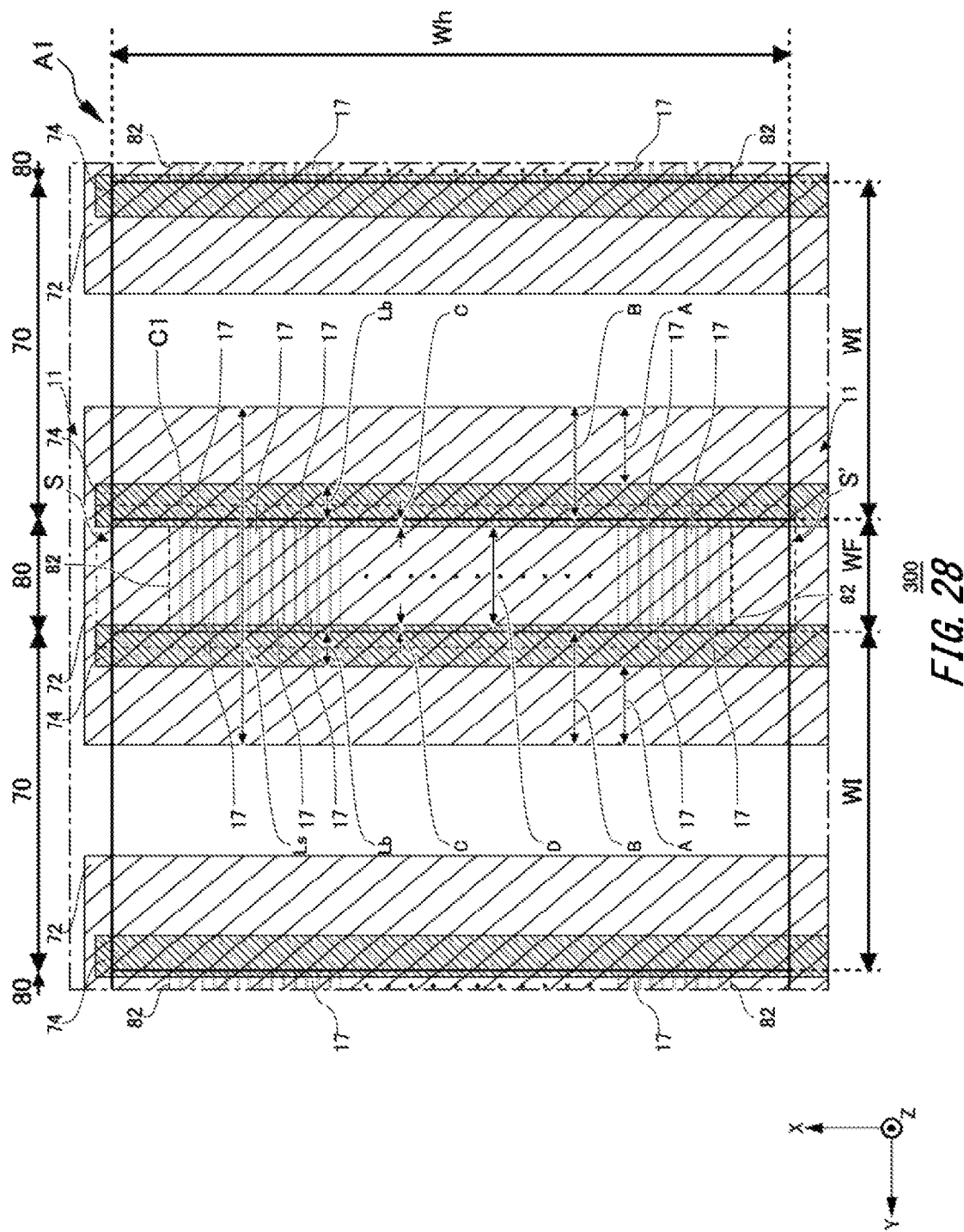
FIG. 28 is another enlarged view of the region A1 in FIG. 22.

FIG. 28 is another enlarged view of the region A1 in FIG. 22. Similar to the semiconductor device 300 illustrated in FIG. 23, the semiconductor device 300 of the present example has transistor portions 70 provided adjacent to a diode portion 80 on the Y-axis positive side and negative side relative to the diode portion 80.

The semiconductor device 300 of the present example is different from the semiconductor device 300 illustrated in FIG. 23 in terms of the arrangement of floating regions 17 in the diode portion 80. The semiconductor device 300 of the present example has, in the diode portion 80 and on the inner side in a cathode region 82 in an X-Y plane, floating regions 17 provided continuously from a boundary of the cathode region 82 on the Y-axis positive side indicated as a portion indicated by broken lines and a boundary of the cathode region 82 on the Y-axis negative side indicated as a portion indicated by broken lines. That the floating regions 17 are provided continuously in the Y-axis direction means that there are no regions, in the X-axis direction, where floating regions 17 are not provided in any locations in the Y-axis direction from the boundary of the cathode region 82 on the Y-axis positive side to the boundary of the cathode region 82 on the Y-axis negative side.

Figure 29:
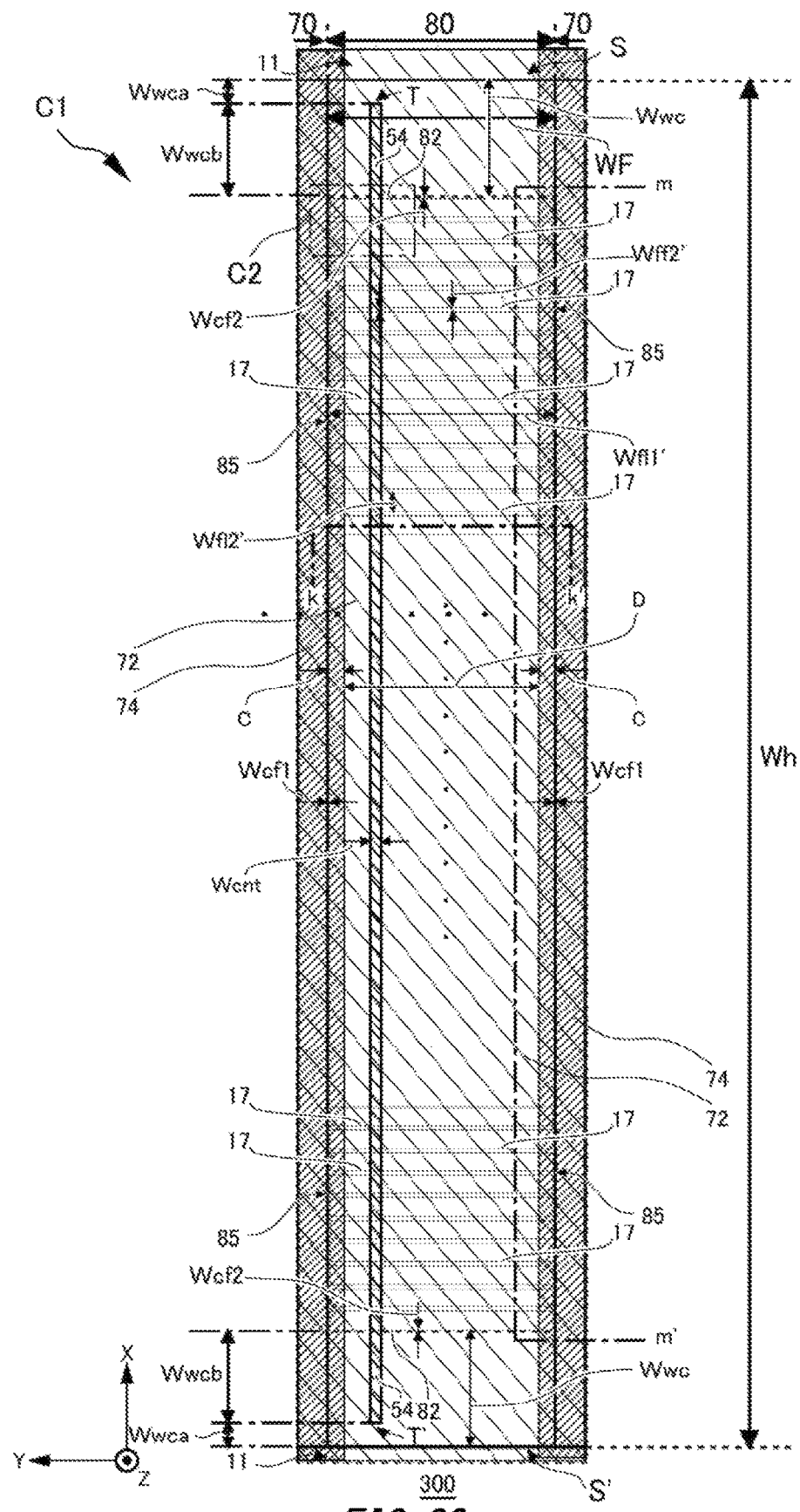
FIG. 29 is an enlarged view of a region C1 in FIG. 28.

FIG. 29 is an enlarged view of a region C1 in FIG. 28. FIG. 29 illustrates an enlarged view of a region from the end S of the well region 11 on the X-axis positive side in the diode portion 80 to the end S' of the well region 11 on the X-axis negative side in the diode portion 80 in FIG. 28.

In the present example, the floating regions 17 are provided in stripes in an X-Y plane. Being provided in stripes means that a plurality of rectangular floating regions 17 are provided in the shorter-side direction of the rectangles at predetermined intervals. Each floating region 17 of the present example has a rectangular shape having longer sides lying in the Y-axis direction, and shorter sides lying in the X-axis direction. In the present example, a plurality of such floating regions 17 may be provided in the X-axis direction in the range from an end of the cathode region 82 on the X-axis negative side to an end of the cathode region 82 on the X-axis positive side. The width Wff2' is the width in the X-axis direction between two floating regions 17 that are provided adjacent to each other in the X-axis direction.

The width Wff2' may be smaller than the width WF of the diode portion 80. The width Wff2' may be 1% to 5% inclusive of the width WF. The width Wff2' may be 6 μm to 20 μm inclusive. The width Wff2' is 10 μm, for example.

The width Wfl2' is the width of a floating region 17 in the X-axis direction. The width Wfl2' may be smaller than the width WF of the diode portion 80. The width Wfl2' may be 4% to 13% inclusive of the width WF. The width Wfl2' may be 25 μm to 50 μm inclusive. The width Wfl2' is 40 μm, for example.

The width Wfl1' is the width of a floating region 17 in the Y-axis direction. The width Wfl1' may be smaller than the width WF of the diode portion 80. The width Wfl1' may be 50% to 99% inclusive of the width WF. The width Wfl1' may be 440 μm to 540 μm inclusive. The width Wfl1' is 490 μm, for example.

The width Wcf2 is the width in the X-axis direction between an end of the cathode region 82 on the X-axis positive side and an end, on the X-axis positive side, of a floating region 17 arranged at an end of a row of floating regions 17 on the X-axis positive side. In addition, the width Wcf2 is the width in the X-axis direction between an end of the cathode region 82 on the X-axis negative side and an end, on the X-axis negative side, of a floating region 17 arranged at an end of the row of floating regions 17 on the X-axis negative side.

The width Wcf2 may be smaller than the width Wff2'. The width Wcf2 may be 10% to 90% inclusive of the width Wff2'. The width Wcf2 may have any value as long as it is not zero. The width Wcf2 may be 2 μm to 6 μm inclusive. The width Wcf2 is 5 μm, for example.

The total of the areas, in an X-Y plane, of a plurality of floating regions 17 arranged on the inner side in the cathode region 82 may be smaller than the area of the cathode region 82 in the X-Y plane. The total of the areas of the plurality of floating regions 17 in the X-Y plane may be 50% to 99% inclusive of the area of the cathode region 82 in the X-Y plane. For example, if Wh is 3100 μm, Wwc is 250 μm, Wfl2' is 40 μm, Wfl1' is 490 μm, Wcf2 and Wcf1 are 5 μm, and Wff2' is 10 μm, 51 rows and one row of floating regions 17 are provided in the X-axis direction and Y-axis direction, respectively, on the inner side in the cathode region 82 in the top view. In this case, the total of the areas of the plurality of floating regions 17 occupies 76.8% of the area of the cathode region 82. Since, in the semiconductor device 300 of the present example, a portion of the cathode region 82 is not covered by the floating regions 17, the diode portion 80 can perform diode operation.

The width Wcf1 in the Y-axis direction between an end of the cathode region 82 on the Y-axis positive side and an end of a floating region 17 on the Y-axis positive side may be smaller than the width WF of the diode portion 80. The width Wcf1 may be 1% to 5% inclusive of the width WF. In addition, the width Wcf1 may be equal to or different from the width Wcf2. The width Wcf1 may have any value as long as it is not zero. The width Wcf1 may be 2 μm to 6 μm inclusive. The width Wcf1 is 5 μm, for example. Note that the width from an end of the cathode region 82 on the Y-axis negative side to an end of a floating region 17 on the Y-axis negative side also may be equal to the width Wcf1.

In the present example, an upper-surface side lifetime control region 72 extends over the entire region B1 in the top view. In the present example, each lower-surface side lifetime control region 74 is provided continuously from the X-axis positive side in the region B in the X-axis direction to the X-axis negative side in the region B in the X-axis direction. In the present example, a lower-surface side lifetime control region 74 is provided in each of a region overlapping the boundary between the diode portion 80 and a transistor portion 70 adjacent to the diode portion 80 on the Y-axis positive side in the top view, and a region overlapping the boundary between the diode portion 80 and a transistor portion 70 adjacent to the diode portion 80 on the Y-axis negative side in the top view. In the present example, a middle portion of the diode portion 80 in the Y-axis direction is not provided with a lower-surface side lifetime control region 74.

The distance C is the distance in the Y-axis direction from the boundary between a diode portion 80 and a transistor portion 70 adjacent to the diode portion 80 on the Y-axis positive side to an end of a lower-surface side lifetime control region 74 on the Y-axis negative side. In addition, the distance C is the distance in the Y-axis direction from the boundary between a diode portion 80 and a transistor portion 70 adjacent to the diode portion 80 on the Y-axis negative side to an end of a lower-surface side lifetime control region 74 on the Y-axis positive side. The distance D is the distance in the Y-axis direction between an end, on the Y-axis negative side, of a lower-surface side lifetime control region 74 on the Y-axis positive side and an end, on the Y-axis positive side, of a lower-surface side lifetime control region 74 on the Y-axis negative side. That is, the distance D is the width in the Y-axis direction of a region where the lower-surface side lifetime control regions 74 are not provided.

Figure 30:
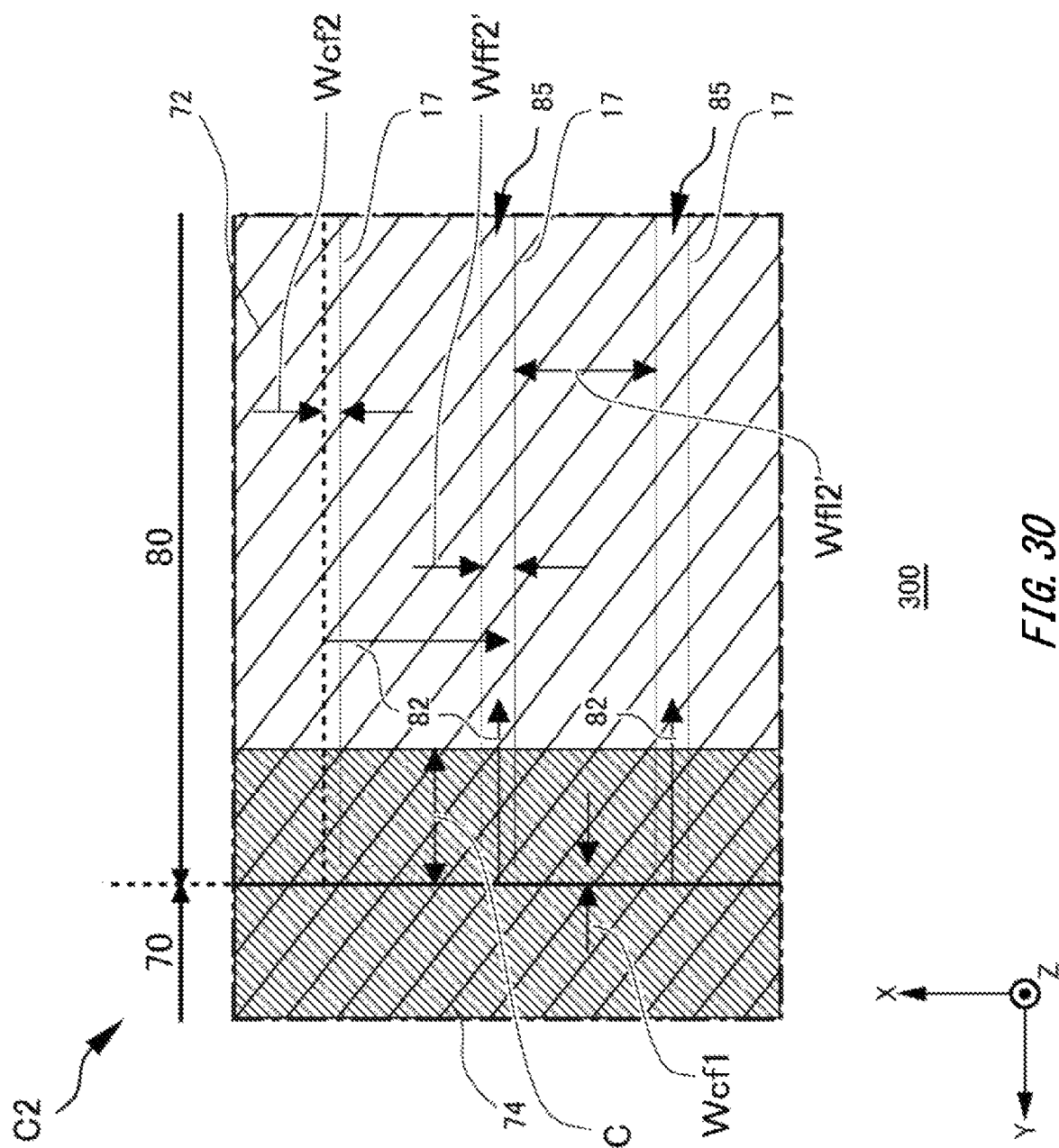
FIG. 30 is an enlarged view of a region C2 in FIG. 29.

FIG. 30 is an enlarged view of a region C2 in FIG. 29. In the present example, the width Wcf2 is the width in the X-axis direction between an end of the cathode region 82 on the X-axis positive side and an end, on the X-axis positive side, of a floating region 17 arranged at the end of the row of floating regions 17 on the X-axis positive side. In addition, the width Wcf1 is the width in the Y-axis direction between an end of the cathode region 82 on the Y-axis positive side to an end of a floating region 17 on the Y-axis positive side. The width Wcf1 is 5 μm, for example. The width Wfl2' is the width of an opening region 85 in the X-axis direction. The width Wfl2' is the width of a floating region 17 in the X-axis direction. The distance C is the distance in the Y-axis direction from the boundary between a diode portion 80 and a transistor portion 70 adjacent to the diode portion 80 on the Y-axis positive side to an end of a lower-surface side lifetime control region 74 on the Y-axis negative side.

Figure 31:
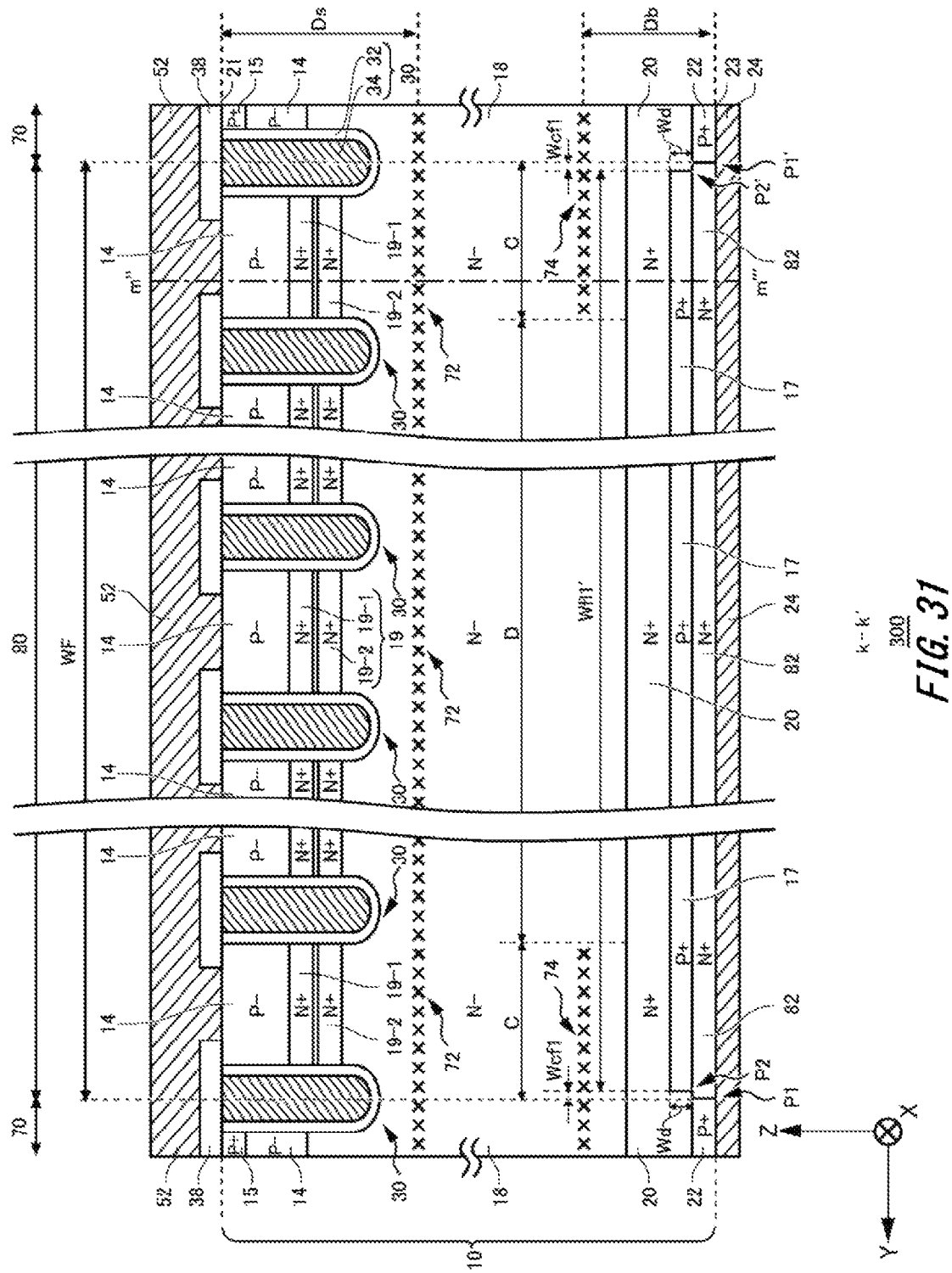
FIG. 31 is a figure illustrating an exemplary cross-section taken along k-k' in FIG. 29.

FIG. 31 is a figure illustrating an exemplary cross-section taken along k-k' in FIG. 29. The semiconductor device 300 of the present example has, in the diode portion 80, floating regions 17 provided in the buffer region 20 provided above the cathode region 82. The floating regions 17 of the present example are provided continuously from the Y-axis positive side to the Y-axis negative side in the k-k' cross-section.

In the present example, similar to the example illustrated in FIG. 26, there are a boundary position P1 and an end portion position P2, and a boundary position P1' and an end portion position P2'. In the present example, the floating regions 17 are provided continuously from the end portion position P2 to the end portion position P2'. Thus, there are no opening regions 85 in the present example.

Similar to the example illustrated in FIG. 26, the width Wcf1 is the distance between the end portion position P1 and the end portion position P2. In addition, the width Wcf1 is the distance between the end portion position P1' and the end portion position P2'. The width Wd of a floating region 17 in the Z-axis direction may be smaller than the width Wcf1.

The width Wcf1 may be 5% to 50% inclusive of the width Wd. The width Wd may be 0.3 μm to 1 μm inclusive. The width Wd is 0.5 μm, for example. In addition, the width Wcf1 may be smaller than the width Wfl1. Since the width Wcf1 is small, the semiconductor device 300 of the present example can suppress electron injection from the cathode region 82 at end portions of the diode portion 80.

The semiconductor device 300 of the present example includes an upper-surface side lifetime control region 72 provided on the upper surface 21 side. In addition, it includes lower-surface side lifetime control regions 74 provided on the lower surface 23 side. In the present example, the peak lifetime killer concentration in the upper-surface side lifetime control region 72 is positioned apart from the upper surface 21 by a distance Ds toward the Z-axis negative side. In the present example, the peak lifetime killer concentration in the lower-surface side lifetime control regions 74 is positioned apart from the lower surface 23 by a distance Db toward the Z-axis positive side.

In the present example, the upper-surface side lifetime control region 72 extends over the entire length of the k-k' cross-section in the Y-axis direction. That is, in the present example, the upper-surface side lifetime control region 72 is provided continuously in the Y-axis direction from a transistor portion 70 adjacent to the diode portion 80 on the Y-axis positive side through the diode portion 80 to a transistor portion 70 adjacent to the diode portion 80 on the Y-axis negative side.

The distance C is the distance in the Y-axis direction from the boundary between a diode portion 80 and a transistor portion 70 adjacent to the diode portion 80 on the Y-axis positive side to an end of a lower-surface side lifetime control region 74 on the Y-axis negative side. In addition, the distance C is the distance in the Y-axis direction from the boundary between a diode portion 80 and a transistor portion 70 adjacent to the diode portion 80 on the Y-axis negative side to an end of a lower-surface side lifetime control region 74 on the Y-axis positive side. The distance D is the distance in the Y-axis direction between an end, on the Y-axis negative side, of a lower-surface side lifetime control region 74 on the Y-axis positive side and an end, on the Y-axis positive side, of a lower-surface side lifetime control region 74 on the Y-axis negative side. That is, the distance D is the width in the Y-axis direction of a region where the lower-surface side lifetime control regions 74 are not provided.

The distance D may be 95% to 99% inclusive of the width WF of the diode portion 80. More preferably, the distance D may be 98% of the width WF. That is, in the present example, the region provided with the lower-surface side lifetime control regions 74 may be, in the Y-axis direction, 1% to 5% inclusive of the width WF, and more preferably may be 2% of the width WF. Since the semiconductor device 300 of the present example has the floating regions 17 provided in the diode portion 80, the carrier distribution in the depth direction of the semiconductor substrate 10 can be adjusted in the diode portion 80.

In addition, since the semiconductor device 300 of the present example has the lower-surface side lifetime control regions 74 provided in the transistor portions 70, it becomes easier for holes generated in the drift region 18 which are minority carriers to be cancelled out by electrons which are majority carriers with short lifetime. Thus, the semiconductor device 300 of the present example can improve the leakage current characteristics of the transistor portions 70. In addition, the semiconductor device 300 of the present example can achieve a favorable trade-off between ON-voltage and turn-off loss of the transistor portions 70.

Figure 32:
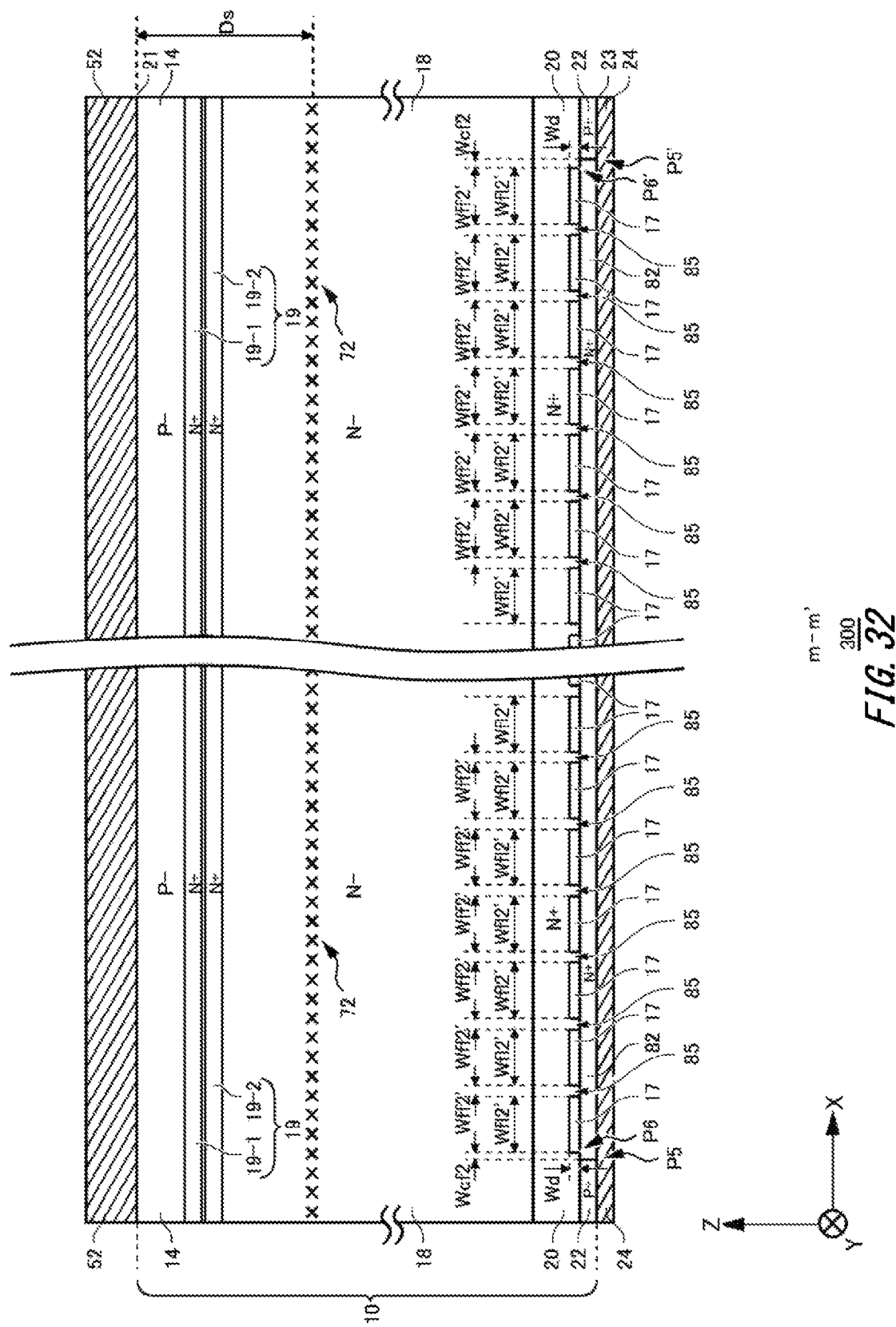
FIG. 32 is a figure illustrating an exemplary cross-section taken along m-m' in FIG. 29.

FIG. 32 is a figure illustrating an exemplary cross-section taken along m-m' in FIG. 29. The m-m' cross-section is an X-Z plane passing through a line m"-m'" in FIG. 31. The semiconductor device 300 of the present example has, in the diode portion 80, floating regions 17 provided in the buffer region 20 provided above the cathode region 82.

In the m-m' cross-section, the semiconductor device 300 of the present example has an upper-surface side lifetime control region 72 provided on the upper surface 21 side. In the m-m' cross-section, the semiconductor device 300 of the present example is not provided with a lower-surface side lifetime control region 74 on the lower surface 23 side.

In the present example, similar to the example illustrated in FIG. 27, there are a boundary position P5 and an end portion position P6, and a boundary position P5' and an end portion position P6'. In the present example, the m-m' cross-section is perpendicular to the lower surface 23 of the semiconductor substrate 10, and moreover is parallel to the direction of extension of dummy trench portions 30. Similar to the example illustrated in FIG. 27, in the present example also, there are opening regions 85 not provided with floating regions 17 at a depth position in the Z-axis direction identical to the floating regions 17.

The width Wfl2' is the width of a floating region 17 in the X-axis direction. Similar to the example illustrated in FIG. 27, the width Wcf2 is the distance between the boundary position P5 and the end portion position P6 in the X-axis direction. In addition, the width Wcf2 is the distance between the boundary position P5' and the end portion position P6' in the X-axis direction. In addition, the width Wff2' is the interval in the X-axis direction between floating regions 17 that are adjacent to each other sandwiching an opening region 85. The width Wcf2 may be smaller than the width Wff2'.

The semiconductor device 300 of the present example includes, in the diode portion 80, a plurality of floating regions 17 provided in the range from the end portion position P6 to the end portion position P6', the floating regions 17 being provided to sandwich opening regions 85. In addition, the semiconductor device 300 of the present example has the floating regions 17 that are provided in stripes in an X-Y plane. Thus, the semiconductor device 300 of the present example can suppress voltage overshoot at the time of reverse recovery of the diode portion 80.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: semiconductor substrate; 11: well region; 12: emitter region; 14: base region; 15: contact region; 16: accumulation region; 18: drift region; 20: buffer region; 21: upper surface; 22: collector region; 23: lower surface; 24: collector electrode; 25: connecting portion; 29: extending portion; 30: dummy trench portion; 31: connecting portion; 32: dummy insulating film; 34: dummy conductive portion; 38: interlayer dielectric film; 39: extending portion; 40: gate trench portion; 41: connecting portion; 42: gate insulating film; 44: gate conductive portion; 46: dividing portion; 48: gate runner; 49: contact hole; 50: gate metal layer; 52: emitter electrode; 54: contact hole; 56: contact hole; 60: transistor mesa portion; 62: boundary mesa portion; 64: diode mesa portion; 70: transistor portion; 72: upper-surface side lifetime control region; 74: lower-surface side lifetime control region; 74-1: lower-surface side lifetime control region; 74-2: lower-surface side lifetime control region; 74-3: lower-surface side lifetime control region; 74-4: lower-surface side lifetime control region; 80: diode portion; 82: cathode region; 90: boundary portion; 98: semiconductor chip; 100: semiconductor device; 120: semiconductor chip; 150: semiconductor device; 200: semiconductor device; 272: upper-surface side lifetime control region; 274: lower-surface side lifetime control region; 300: semiconductor device

What is claimed is:

1. A semiconductor device comprising:
   a semiconductor substrate having a drift region of a first-conductivity type;
   a transistor portion provided in the semiconductor substrate; and
   a diode portion that is provided in the semiconductor substrate, and is provided next to the transistor portion in a predetermined array direction,
   wherein
   each of the transistor portion and the diode portion has:
      a base region of a second-conductivity type provided above the drift region;
      a plurality of trench portions that penetrate the base region, lie from an upper surface of the semiconductor substrate to the drift region, and extend in a direction of extension perpendicular to the array direction;
      an at least one lower-surface side lifetime control region that includes a lifetime killer extending across a boundary between the transistor portion and the diode portion entirely within a lower-surface side relative to a middle in a depth direction between the upper surface and lower surface of the semiconductor substrate; and
      an upper-surface side lifetime control region that includes a lifetime killer extending across a boundary between the transistor portion and the diode portion entirely within an upper-surface side in the semiconductor substrate relative to the lower-surface side lifetime control region, and
   in the array direction, the transistor portion has a portion provided with the lower-surface side lifetime control region, and a portion not provided with the lower-surface side lifetime control region.

2. The semiconductor device according to claim 1, wherein, in the array direction, the diode portion has a portion provided with the lower-surface side lifetime control region, and a portion not provided with the lower-surface side lifetime control region.

3. The semiconductor device according to claim 1, wherein the lower-surface side lifetime control region extends over an entire length of the diode portion in the array direction.

4. The semiconductor device according to claim 1, wherein, in the array direction, a length of the lower-surface side lifetime control region in the transistor portion is longer than a length of the lower-surface side lifetime control region in the diode portion.

5. The semiconductor device according to claim 1, wherein
in the transistor portion, a length of the lower-surface side lifetime control region in the array direction is shorter than a length of the upper-surface side lifetime control region in the array direction.

6. The semiconductor device according to claim 5, wherein
the transistor portion further has a second-conductivity type collector region provided between the lower surface of the semiconductor substrate and the drift region, and
the collector region is provided on an extension line of an imaginary line that connects an end portion of the upper-surface side lifetime control region in the transistor portion with an end portion of the lower-surface side lifetime control region in the transistor portion.

7. The semiconductor device according to claim 5, wherein, in the diode portion, the length of the lower-surface side lifetime control region in the array direction is shorter than the length of the upper-surface side lifetime control region in the array direction.

8. The semiconductor device according to claim 5, wherein a lifetime killer concentration of the lower-surface side lifetime control region is higher than a lifetime killer concentration of the upper-surface side lifetime control region.

9. The semiconductor device according to claim 5, wherein, in the array direction, the length of the upper-surface side lifetime control region in the transistor portion is 1% to 15% inclusive of a length of the transistor portion.

10. The semiconductor device according to claim 5, wherein a distance in a direction parallel to the lower surface of the semiconductor substrate from an end portion of the upper-surface side lifetime control region in the transistor portion to an end portion of the lower-surface side lifetime control region in the transistor portion is 25% to 50% inclusive of the length, in the array direction, of the upper-surface side lifetime control region in the transistor portion.

11. The semiconductor device according to claim 5, wherein, in the direction of extension, the lower-surface side lifetime control region is provided to reach a region which is on an outer side relative to the upper-surface side lifetime control region.

12. The semiconductor device according to claim 5, wherein the length of the upper-surface side lifetime control region in the array direction is larger than a thickness of the semiconductor substrate.

13. The semiconductor device according to claim 5, wherein
the boundary between the transistor portion and the diode portion is closer, in the array direction, to an edge of the lifetime killer of the lower-surface side lifetime control region that is in the transistor portion than an edge of the lifetime killer of the upper-surface side lifetime control region that is in the transistor portion.

14. The semiconductor device according to claim 1, wherein
in the transistor portion, a length of the lower-surface side lifetime control region in the array direction is longer than a length of the upper-surface side lifetime control region in the array direction.

15. The semiconductor device according to claim 1, wherein a lifetime killer concentration of a lower-surface side lifetime control region at a boundary between the transistor portion and the diode portion is higher than lifetime killer concentrations of lower-surface side lifetime control regions not at the boundary.

16. The semiconductor device according to claim 1, wherein, in the array direction, a length of the lower-surface side lifetime control region in the diode portion is 1.5% to 3% inclusive of a length of the diode portion.

17. The semiconductor device according to claim 1, further comprising a first-conductivity type buffer region that lies below the drift region, and from the transistor portion to the diode portion, wherein
the lower-surface side lifetime control region is provided in the buffer region.

18. The semiconductor device according to claim 1, further comprising a first-conductivity type buffer region that lies below the drift region, and from the transistor portion to the diode portion, wherein
a thickness of the buffer region is larger at a portion below the lower-surface side lifetime control region than at portions not below the lower-surface side lifetime control region.

19. The semiconductor device according to claim 1, wherein
the diode portion has a cathode region of a first-conductivity type, and
the lifetime killer of the lower-surface side lifetime control region has an edge directly above the cathode region.

20. A semiconductor device comprising:
a semiconductor substrate having a drift region of a first-conductivity type;
a transistor portion provided in the semiconductor substrate; and
a diode portion that is provided in the semiconductor substrate, and is provided next to the transistor portion in a predetermined array direction, wherein
each of the transistor portion and the diode portion has:
a base region of a second-conductivity type provided above the drift region;
a plurality of trench portions that penetrate the base region, lie from an upper surface of the semiconductor substrate to the drift region, and extend in a direction of extension perpendicular to the array direction; and
an at least one lower-surface side lifetime control region that includes a lifetime killer extending between the transistor portion and the diode portion, and between the upper surface and lower surface of the semiconductor substrate, and
in the array direction, the transistor portion has a portion provided with the lower-surface side lifetime control region, and a portion not provided with the lower-surface side lifetime control region, wherein
the diode portion has a first-conductivity type cathode region exposed at the lower surface of the semiconductor substrate, and at least one electrically-floating second-conductivity type floating region provided on the lower-surface side in the semiconductor substrate, and
the floating region is provided above the cathode region, and covers part of the cathode region.

21. The semiconductor device according to claim 20, wherein the floating region is provided on the lower-surface side in the semiconductor substrate relative to the lower-surface side lifetime control region.

22. The semiconductor device according to claim 20, wherein in a top view of the semiconductor substrate, at least part of the floating region overlaps the lower-surface side lifetime control region.

23. The semiconductor device according to claim 20, wherein
the at least one floating region includes a plurality of floating regions arrayed in the array direction, and
in a top view of the semiconductor substrate, at least one floating region in the plurality of floating regions does not overlap the lower-surface side lifetime control region.

24. A semiconductor device comprising:
a semiconductor substrate having a drift region of a first-conductivity type;
a transistor portion provided in the semiconductor substrate; and
a diode portion that is provided in the semiconductor substrate, and is provided next to the transistor portion in a predetermined array direction, wherein
each of the transistor portion and the diode portion has:
a base region of a second-conductivity type provided above the drift region;
a plurality of trench portions that penetrate the base region, lie from an upper surface of the semiconductor substrate to the drift region, and extend in a direction of extension perpendicular to the array direction; and
an at least one lower-surface side lifetime control region that includes a lifetime killer extending between the transistor portion and the diode portion, and between the upper surface and lower surface of the semiconductor substrate, and
in the array direction, the transistor portion has a portion provided with the lower-surface side lifetime control region, and a portion not provided with the lower-surface side lifetime control region, wherein the at least one lower-surface side lifetime control region includes a plurality of lower-surface side lifetime control regions arranged next to each other in a depth direction of the semiconductor substrate, and
in the transistor portion, lengths, in the array direction, of the lower-surface side lifetime control regions decrease as distances from the upper surface of the semiconductor substrate to the lower-surface side lifetime control regions increase.

25. The semiconductor device according to claim 24, wherein, in the transistor portion, the lower-surface side lifetime control regions are arranged such that a line linking an end portion of an uppermost lower-surface side lifetime control region, end portions of lower-surface side lifetime control regions between the uppermost lower-surface side lifetime control region and a lowermost lower-surface side lifetime control region, and an end portion of the lowermost lower-surface side lifetime control region is convex toward the lower surface of the semiconductor substrate.

26. The semiconductor device according to claim 24, wherein, in the diode portion, the lengths, in the array direction, of the lower-surface side lifetime control regions increase as the distances from the upper surface of the semiconductor substrate to the lower-surface side lifetime control regions increase.

27. The semiconductor device according to claim 24, wherein lifetime killer concentrations of the lower-surface side lifetime control regions increase as distances from the upper surface of the semiconductor substrate to the lower-surface side lifetime control regions increase.

28. The semiconductor device according to claim 24, wherein
the diode portion has an upper-surface side lifetime control region that includes a lifetime killer extending across a boundary between the transistor portion and the diode portion entirely within an upper-surface side in the semiconductor substrate relative to the lower-surface side lifetime control region.

* * * * *